(12) United States Patent
Son et al.

(10) Patent No.: US 8,755,157 B2
(45) Date of Patent: Jun. 17, 2014

(54) INTEGRATED CIRCUIT DEVICE AND ELECTROSTATIC DISCHARGE PROTECTING CIRCUIT THEREOF

(75) Inventors: Kyoungmok Son, Suwon-si (KR); Yong-Hoan Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 342 days.

(21) Appl. No.: 13/112,485

(22) Filed: May 20, 2011

(65) Prior Publication Data
US 2011/0292553 A1 Dec. 1, 2011

(30) Foreign Application Priority Data
May 31, 2010 (KR) .................. 10-2010-0051187

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)
*H02H 9/06* (2006.01)

(52) U.S. Cl.
USPC ............................. 361/56; 361/118

(58) Field of Classification Search
USPC .......................................... 361/56
See application file for complete search history.

(56) References Cited

U.S. PATENT DOCUMENTS 6,323,074 B1    11/2001  Jiang et al.
7,660,087 B2 *  2/2010   Huang et al. .............. 361/56

FOREIGN PATENT DOCUMENTS

JP    2004-186511 A    7/2004
KR    2003-0089062 A   11/2003
KR    10-0650625 B1    11/2005

* cited by examiner

*Primary Examiner* — Dharti Patel
(74) *Attorney, Agent, or Firm* — Harness, Dickey & Pierce, P.L.C.

(57) ABSTRACT

Integrated circuit devices and electrostatic discharge (ESD) protection circuits thereof. An integrated circuit device may include an input/output pad, an internal circuit, and a transistor connected between the input/output pad and the internal circuit configured to perform a switch operation between the input/output pad and the internal circuit in response to a control signal transmitted from the internal circuit, and operate as an ESD protection circuit.

70 Claims, 42 Drawing Sheets

INTEGRATED CIRCUIT DEVICE AND ELECTROSTATIC DISCHARGE PROTECTING CIRCUIT THEREOF

CROSS-REFERENCE TO RELATED APPLICATION

This U.S. non-provisional patent application claims priority under 35 U.S.C. §119 to Korean Patent Application No. 10-2010-0051187, filed on May 31, 2010, in the Korean Intellectual Property Office (KIPO), the entire contents of which is incorporated herein by reference.

BACKGROUND

Example embodiments of the inventive concepts relate to electronic circuits, and more particularly, to integrated circuit devices and electrostatic discharge (ESD) protection circuits thereof.

With the development of semiconductor manufacturing techniques the number of devices integrated into one circuit has increased. A System-on-Chip (SoC) integrated circuit may include a system which has various components such as memory, a processor, a voltage control circuit, and so forth. The SoC consists of one chip and thus occupies less area and consumes less power compared to a typical system.

Electrostatic voltages may be externally applied to an integrated circuit through an input/output pad. Once the integrated circuit is influenced by an electrostatic voltage, an electrostatic current (a current caused by an electrostatic phenomenon) may discharge, and malfunction and/or damage may occur in the integrated circuit. ESD protection circuits may protect the integrated circuits from electrostatic discharge.

SUMMARY

Example embodiments of the inventive concepts may provide integrated circuit devices with reduced areas and electrostatic discharge (ESD) protection circuits thereof.

Example embodiments of the inventive concepts provide integrated circuit devices including an input/output pad, an internal circuit, and a transistor connected between the input/output pad and the internal circuit and configured to perform a switch operation between the input/output pad and the internal circuit in response to a control signal transmitted from the internal circuit and operate as an electrostatic discharge (ESD) protection circuit.

According to some example embodiments, a drain of the transistor may include a first junction region and a first deep junction region, the first junction region being disposed in the first deep junction region. In other example embodiments, a doping concentration of the first deep junction region may be lower than that of the first junction region. In still other example embodiments, the first deep junction region may extend below a gate structure of the transistor. In even other example embodiments, the integrated circuit devices may further include a device isolation layer surrounding the transistor, wherein the first deep junction region extends below the device isolation layer. In yet other example embodiments, the first junction region may include a first high concentration junction region and a first low concentration junction region below the first high concentration junction region. A doping concentration of the first low concentration junction region may be lower than that of the first high concentration junction region.

In further example embodiments, a source of the transistor may have the same structure as the first junction region. In still further example embodiments, a drain and a source of the transistor may have an asymmetric structure. In even further example embodiments, a source of the transistor may include a second junction region and a second deep junction region, the second junction region being disposed in the second deep junction region. In yet further example embodiments, the second deep junction region may extend below a gate structure of the transistor. In yet further example embodiments, the integrated circuit devices may further include a first pickup layer spaced apart from a source of the transistor. The transistor and the first pickup layer constitute an ESD protection circuit.

In yet further example embodiments, the integrated circuit device may further include a device isolation layer between the source of the transistor and the first pickup layer. In yet further example embodiments, the first pickup layer may have the same structure as the first junction region. In yet further example embodiments, the first pickup layer may have the same conductive type as the first junction region. In yet further example embodiments, ground voltage may be applied to the first pickup layer. In yet further example embodiments, the integrated circuit devices may further include a third pickup layer disposed adjacent to the first pickup layer and on an opposite side of the source. The third pickup layer may have a different conductive type than the first pickup layer.

In yet further example embodiments, ground voltage may be applied to the third pickup layer. In yet further example embodiments, the first pickup layer may be connected to the third pickup layer through a butting contact. In yet further example embodiments, the integrated circuit device may further include a second pickup layer spaced apart from the drain of the transistor. The transistor and the second pickup layer may constitute an ESD protection circuit. In yet further example embodiments, the integrated circuit device may further include a device isolation layer between the drain of the transistor and the second pickup layer. In yet further example embodiments, the second pickup layer may have the same structure as the first junction region. In yet further example embodiments, the second pickup layer may have the same conductive type as the first junction region.

In yet further example embodiments, ground voltage may be applied to the second pickup layer. In yet further example embodiments, the integrated circuit devices may further include a fourth pickup layer disposed adjacent to the second pickup layer and on an opposite side of the drain. The fourth pickup layer has a different conductive type than the first junction region. In yet further example embodiments, ground voltage may be applied to the fourth pickup layer. In yet further example embodiments, the second pickup layer may be connected to the fourth pick layer through a butting contact. In yet further example embodiments, the first junction region may have an N-conductive type.

In yet further example embodiments, the transistor may be an NMOS transistor; and the integrated circuit devices may further include a PMOS transistor connected between the input/output pad and the internal circuit and configured to perform the switching operation along with the NMOS transistor. In yet further example embodiments, the PMOS transistor may have the same structure as the NMOS transistor. In yet further example embodiments, the integrated circuit devices may further include a clamp circuit configured to discharge electrostatic between a power node and a ground node. In yet further example embodiments, the clamp circuit may include a first transistor and a second transistor, connected between the power node and the ground node, a gate of the first transistor may be connected to the ground node and a gate of the second transistor may be connected to the power node through a capacitor and is connected to the ground node through a resistor.

In other example embodiments of the inventive concepts, integrated circuit devices include an input/output pad, an internal circuit and an inverter connected between the input/output pad and the internal circuit. The inverter includes an NMOS transistor and a PMOS transistor, connected between a power node and a ground node, the NMOS transistor being configured to operate as an ESD protection circuit.

In some example embodiments, a drain of the NMOS transistor may include a first junction region and a first deep junction region, the first junction region being disposed in the first deep junction region. In other example embodiments, a source of the NMOS transistor may have the same structure as the first junction region. In still other example embodiments, a source of the NMOS transistor may have the same structure as the drain of the NMOS transistor. In even other example embodiments, the integrated circuit devices may further include a first pickup layer spaced apart from the drain of the NMOS transistor, wherein the first pickup layer has the same conductive type as the first junction region.

In yet other example embodiments, the PMOS transistor may have the same structure as the NMOS transistor. In further example embodiments, the inverter may be configured to invert an output of the internal circuit and deliver the inverted output to the input/output pad. In still further example embodiments, the inverter may be configured to invert a signal received from the input/output pad and deliver the inverted signal to the internal circuit. In even further example embodiments, the integrated circuit devices may further include a clamp circuit configured to discharge electrostatic between a power node and a ground node. In yet further example embodiments, the clamp circuit may include a first transistor and a second transistor, connected between the power node and the ground node, a gate of the first transistor may be connected to the ground node, and a gate of the second transistor may be connected to the power node through a capacitor and may be connected to the ground node through a resistor.

In still other example embodiments of the inventive concepts, ESD protection circuits of an integrated circuit device include a first junction region and a second junction region, disposed in a well, a gate structure disposed on the well between the first junction region and the second junction region, and a pickup layer spaced apart from the second junction region and disposed on an opposite side of the first junction region. The pickup layer has the same conductive type as the first junction region.

In some example embodiments, the ESD protection circuits may further include a device isolation layer between the first junction region and the pickup layer. In other example embodiments, the device isolation layer may have a guard ring structure surrounding the first junction region, the second junction region, and the gate structure. In still other example embodiments, the pickup layer may have a guard ring structure surrounding the first junction region, the second junction region, the gate structure, and the device isolation layer. In even other example embodiments, the ESD protection circuits may further include a deep junction region disposed in the well, wherein the first junction region is disposed in the deep junction region.

In yet other example embodiments, ground voltage may be applied to the pickup layer. In further example embodiments, the ESD protection circuit may be configured to selectively provide a channel between the first junction region and the second junction region in response to a control signal applied to the gate structure and is configured to discharge electrostatic received from at least one of the first junction region and the second junction region. In still further example embodiments, the ESD protection circuits may further include a second pickup layer having a different conductive type than the pick layer. In even further example embodiments, the second pickup layer may be connected to the pickup layer through a butting contact.

In yet further example embodiments, the second pickup layer may include a guard ring surrounding the first junction region, the second junction region, the gate structure, and the pickup layer. In yet further example embodiments, the first junction region and the second junction region may have an N-conductive type. In yet further example embodiments, the well may be connected to a ground node; and the ESD protection circuit of the integrated circuit device may be configured to discharge electrostatic between the ground node and the power node. In yet further example embodiments, the clamp circuit may include a first transistor and a second transistor, connected between the power node and the ground node, a gate of the first transistor may be connected to the ground node, and a gate of the second transistor may be connected to the power node through a capacitor and may be connected to the ground node through a resistor.

In even other example embodiments of the inventive concepts, ESD protection circuits of an integrated circuit device include a source and a drain disposed in a well, a gate structure disposed on the well between the source and the drain, a first pickup layer spaced apart from the source and having the same conductive type as the source, a second pickup layer disposed on an opposite side of the source with respect to the first pickup layer and having a different conductive type than the source, and a device isolation layer disposed between the source and the first pickup layer. The drain includes a deep junction region and a junction region in the deep junction region.

In some example embodiments, the deep junction region may extend below the device isolation layer. In other example embodiments, the device isolation layer may have a structure surrounding the source, the drain, and the gate structure. In still other example embodiments, the first pickup layer may have a structure surrounding the device isolation layer. In even other example embodiments, the second pickup layer may have a guard ring surrounding the first pickup layer. In yet other example embodiments, the well may be connected to ground node; and the ESD protection circuit of the integrated circuit device may further include a clamp circuit configured to discharge electrostatic between the ground node and the power node. In further example embodiments, the source and the drain may have an N-conductive type.

According to one or more example embodiments of the inventive concepts, an integrated circuit device includes an input/output pad, an internal circuit configured to output a control signal, and a transistor connected as at least part of a switch between the input/output pad and the internal circuit, the transistor configured to switch in response to the control signal and to discharge electrostatic current as a first electrostatic discharge (ESD) protection circuit.

According to one or more example embodiments of the inventive concepts, an integrated circuit device includes an input/output pad, an internal circuit and an inverter connected between the input/output pad and the internal circuit, the inverter including an NMOS transistor and a PMOS transistor, the NMOS transistor and the PMOS transistor connected between a power node and a ground node, the NMOS transistor configured as an ESD protection circuit.

According to one or more example embodiments of the inventive concepts, an ESD protection circuit includes a first junction region and a second junction region, the first and second junction regions in a well, a gate structure on the well between the first junction region and the second junction region, and a first pickup layer on a same side of the gate structure as the first junction region, a conductive type of the first pickup layer the same as a conductive type of the first junction region.

According to one or more example embodiments of the inventive concepts, an ESD protection circuit includes a source and a drain in a well, the drain including a junction region in a deep junction region, a gate structure between the source and the drain, a first pickup layer spaced apart from the source, a conductive type of the first pickup layer the same as a conductive type of the source, a second pickup layer on an opposite side of the source from the first pickup layer, a conductive type of the second pickup layer different than a conductive type of the source and a device isolation layer between the source and the first pickup layer.

According to one or more example embodiments of the inventive concepts, a semiconductor device includes a transistor, the transistor including a gate on a semiconductor layer, and a source and a drain in the semiconductor layer, one of the source and the drain including a first graded junction.

BRIEF DESCRIPTION OF THE DRAWINGS

Example embodiments will be more clearly understood from the following brief description taken in conjunction with the accompanying drawings. FIGS. 1-41 represent non-limiting, example embodiments as described herein.

FIG. 1 is a block diagram illustrating integrated circuit devices according to example embodiments of the inventive concepts;

FIG. 2 is a plan view of a transmission gate according to example embodiments of the inventive concepts;

FIGS. 3 and 4 are cross-sectional views taken along line A-A' and line B-B' of FIG. 2, respectively;

FIG. 5 is a graph of an ESD experimental result;

FIGS. 6A-9B are diagrams illustrating methods of manufacturing transmission gates described with reference to FIGS. 2-4 according to example embodiments of the inventive concepts;

FIGS. 11-15 are cross-sectional views illustrating transmission gates according example embodiments of the inventive concepts;

FIG. 16 is a plan view of a transmission gate of FIG. 1 according to example embodiments of the inventive concepts;

FIGS. 17 and 18 are cross-sectional views taken along line A-A' and line B-B' of FIG. 16, respectively;

FIG. 19 is a graph illustrating an ESD experimental result of an NMOS transistor described with reference to FIGS. 16 and 17;

FIG. 20 is a plan view of a transmission gate of FIG. 1 according to example embodiments of the inventive concepts;

FIGS. 21 and 22 are cross-sectional views taken along line A-A' and line B-B' of FIG. 20, respectively;

FIG. 23 is a plan view of a transmission gate of FIG. 1 according to example embodiments of the inventive concepts;

FIGS. 24 and 25 are cross-sectional views taken along line A-A' and line B-B' of FIG. 23, respectively;

FIG. 26 is a plan view of a transmission gate of FIG. 1 according to example embodiments of the inventive concepts;

FIGS. 27 and 28 are cross-sectional views taken along line A-A' and line B-B' of FIG. 16, respectively;

FIGS. 29 and 30 are plan views of a transmission gate of FIG. 1 according to example embodiments of the inventive concepts;

FIG. 31 is a block diagram illustrating example applications of an integrated circuit device of FIG. 1;

FIG. 32 is a block diagram illustrating examples of an integrated circuit device of FIG. 1;

FIG. 33 is a block diagram illustrating example applications of an integrated circuit device of FIG. 32;

FIG. 34 is a block diagram illustrating examples of an integrated circuit device of FIG. 1;

FIG. 35 is a plan view of a buffer of FIG. 34;

FIG. 36 is a block diagram illustrating example applications of an integrated circuit device of FIG. 34;

FIG. 37-39 are block diagrams illustrating examples of an integrated circuit device of FIG. 1;

FIG. 40 is a block diagram illustrating storage systems including integrated circuit devices described with reference to FIGS. 1-39; and FIG. 41 is a block diagram illustrating computing systems including integrated circuit devices described with reference to FIGS. 1-39.

Figure 1:
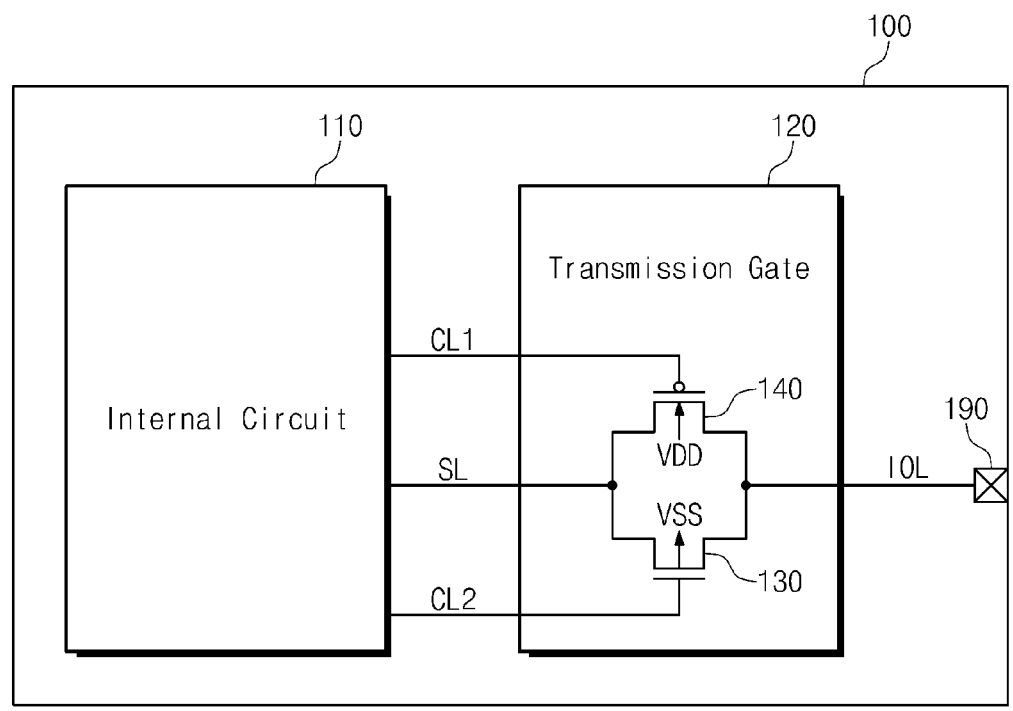

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of an integrated circuit device 100 according to example embodiments of the inventive concepts. Referring to FIG. 1, the integrated circuit 100 may include an internal circuit 110, a transmission gate 120, and/or an input/output pad 190. The internal circuit 110 may be connected to the input/output pad 190 through the transmission gate 120. The internal circuit 110 may control the transmission gate 120 through first and second control lines CL1 and CL2. Signals transmitted through the first and second control lines CL1 and CL2 may be complementary signals.

The transmission gate 120 may include an NMOS transistor 130 and a PMOS transistor 140. The NMOS transistor 130 may operate in response to a signal of the second control line CL2. The PMOS transistor 140 may operate in response to a signal of the first control line CL1. In response to the signals of the first and second control lines CL1 and CL2, the transmission gate 120 may electrically connect and disconnect a signal line SL connected to the internal circuit 110 with an input/output line IOL connected to the input/output pad 190.

In the integrated circuit device 100, electrostatic discharge (ESD) may occur. For example, an external electrostatic voltage may be applied to the integrated circuit device 100 through the input/output pad 190. Once ESD occurs, malfunction and/or damage may occur in the integrated circuit device 100. A typical method of protecting the integrated circuit device 100 from ESD may include adding an ESD protection circuit to the integrated circuit device 100. For example, the ESD protection circuit may be added to the input/output pad 190 of the integrated circuit device 100. Once the ESD protection circuit is added, an area of the integrated circuit device 100 is increased.

In an integrated circuit device 100 according to example embodiments of the inventive concepts, the transmission gate 120 may operate as a transmission gate between the internal circuit 110 and the input/output pad 190, and may operate as an ESD protection circuit. Because an additional ESD protection circuit is not required, an area of the integrated circuit device 100 may be reduced. When the transmission gate 120 operates as the ESD protection circuit, strong snapback may be prevented. Reliability of the integrated circuit device 100 may be improved.

Figure 2:
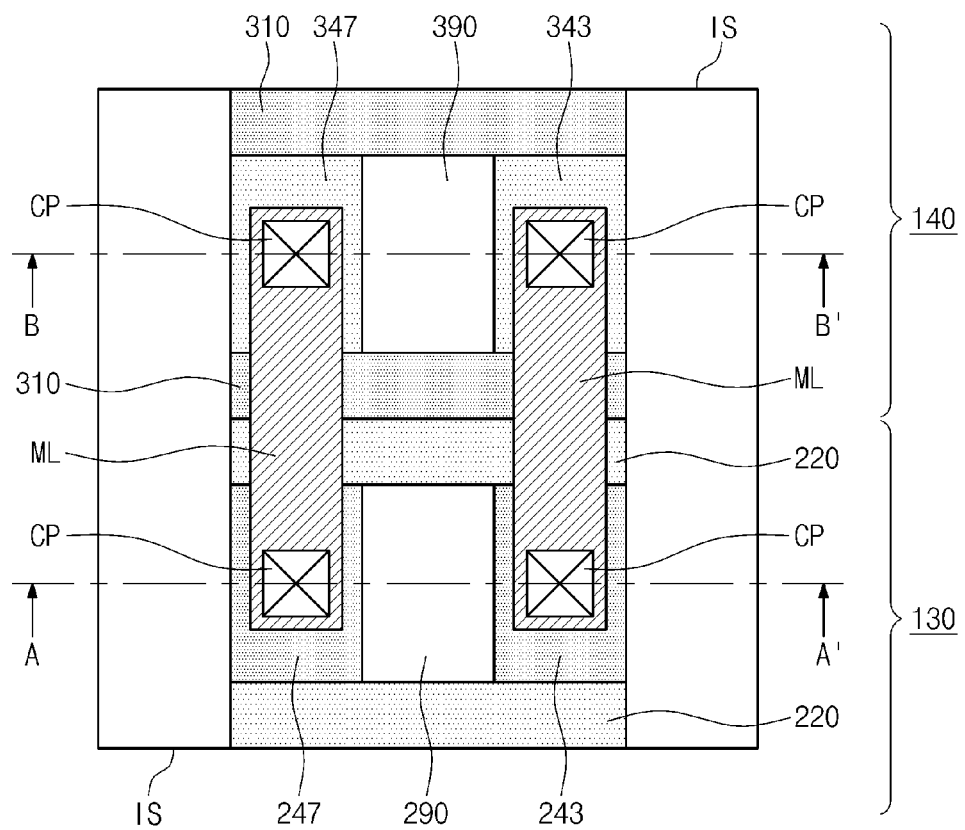
Figure 3:
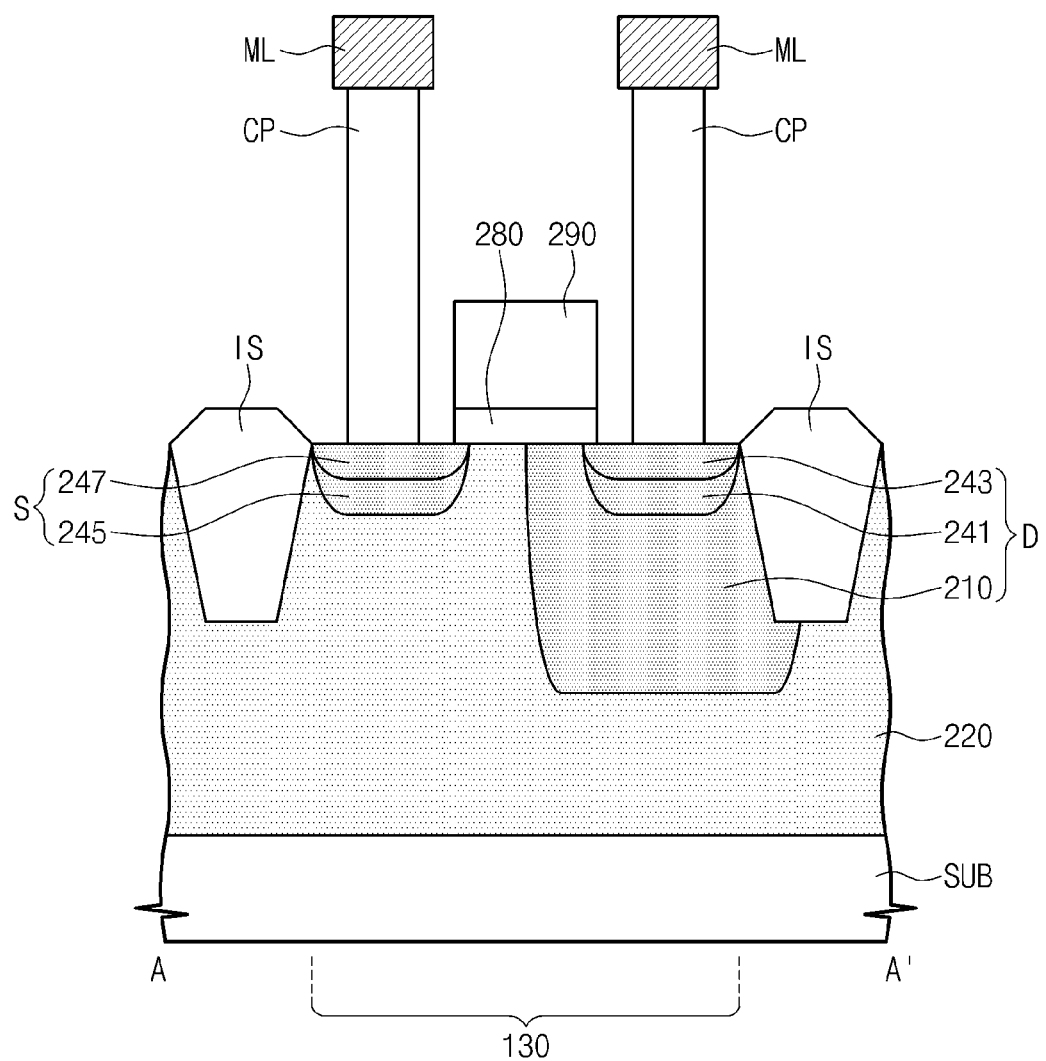
Figure 4:
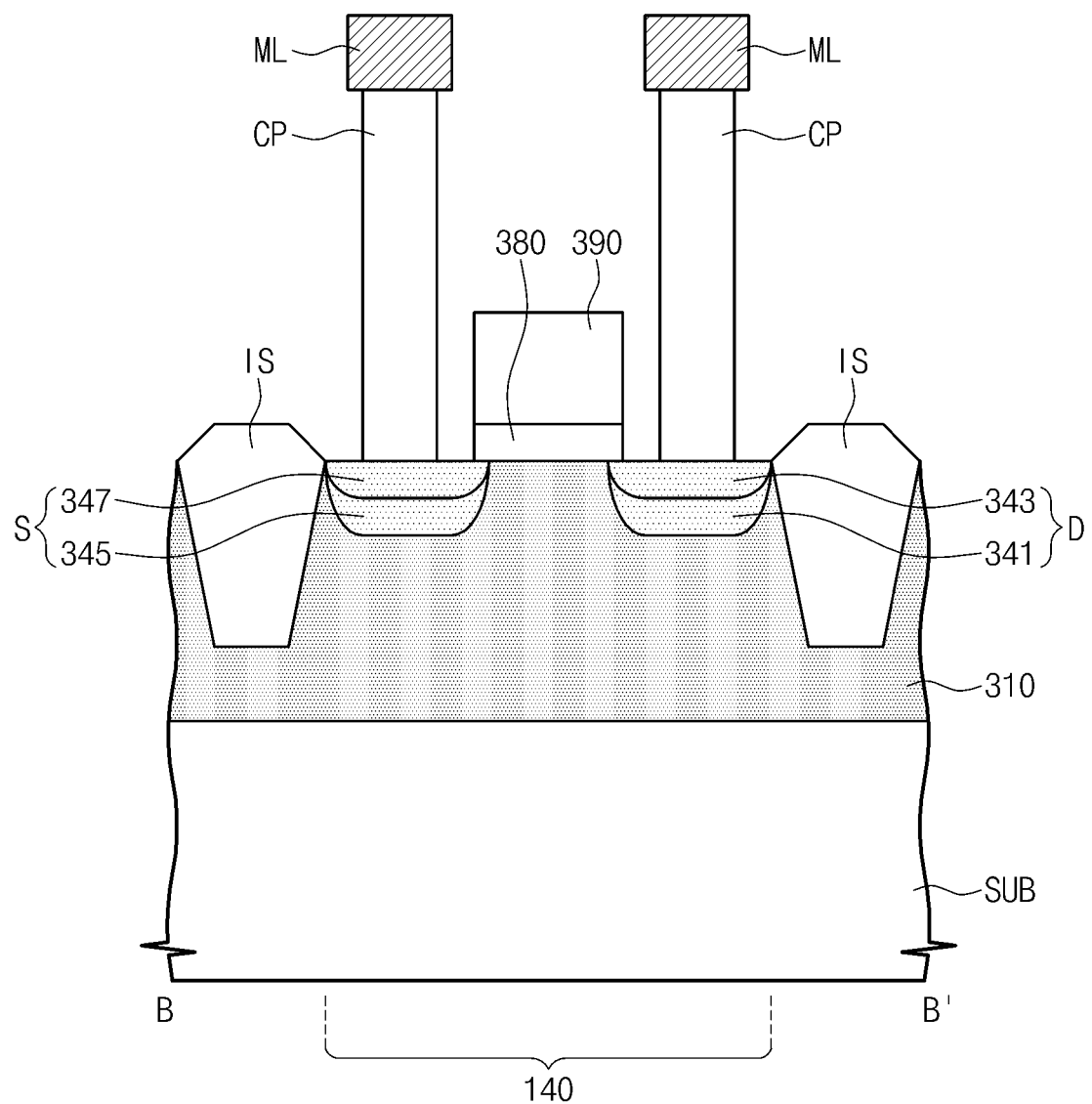

FIG. 2 is a plan view of a transmission gate 120 according to example embodiments of the inventive concepts. FIGS. 3 and 4 are cross-sectional views taken along line A-A' and line B-B' of FIG. 2, respectively. Referring to FIGS. 2-4, a substrate SUB may be provided. The substrate SUB may be, for example, a P-type (P-conductive type) substrate. In a region of the NMOS transistor 130, a P-well 220 may be on the substrate SUB. Device isolation layers IS may be on the P-well 220. The device isolation layers IS may be an insulation material, for example, a silicon oxide and/or a silicon nitride. An NMOS transistor 130 may be between the device isolation layers IS. The NMOS transistor 130 may include a drain D, a source S, and gate structures 280 and 290.

The drain D and the source S may include N-type (N-conductive type) first and second junction regions. The drain D of the NMOS transistor 130 may include first junction regions 241 and 243 and a first deep junction region 210. The first junction regions 241 and 243 may be a first low concentration junction region 241 and a first high concentration junction region 243. The first low concentration junction region 241 may be below the first high concentration junction region 243. A doping concentration of the first low concentration junction region 241 may be less than that of the first high concentration junction region 243. The first junction regions 241 and 243 may be in the first deep junction region 210. A doping concentration of the first deep junction region 210 may be less than the first low concentration junction region 241 of the first junction regions 241 and 243.

The source S of the NMOS transistor 130 may include second junction regions 245 and 247. The second junction regions 245 and 247 may be a second low concentration junction region 245 and a second high concentration junction region 247. The second low concentration junction region 245 may be below the second high concentration junction region 247. A doping concentration of the second low concentration junction region 245 may be less than that of the second high concentration junction region 247. The second junction regions 245 and 247 of the source S may have a similar structure to the first junction regions 241 and 243 of the drain D. Gate structures 280 and 290 of the NMOS transistor 130 may be a gate insulation layer 280 and a gate 290. The gate insulation layer 280 may include, for example, a silicon oxide and/or a silicon nitride. The gate 290 may include, for example, polysilicon and/or metal material. Each of the source S and the drain D of the NMOS transistor 130 may be connected to metal lines ML through contact plugs CP.

In a region of the PMOS transistor 140, an N-well 310 may be on the substrate SUB. Device isolation layers IS may be on the N-well 310. The device isolation layers IS may be an insulation material, for example, a silicon oxide and/or a silicon nitride. A PMOS transistor 140 may be provided between the device isolation layers IS. The PMOS transistor 140 may include a drain D, a source S, and a gate structure.

The drain D of the PMOS transistor 140 may include third junction regions 341 and 343. The third junction regions 341 and 343 may be a third low concentration junction region 341 and a third high concentration junction region 343. The third low concentration junction region 341 may be below the third high concentration junction region 343. A doping concentration of the third low concentration junction region 341 may be less than that of the third high concentration junction region 343. The source S of the PMOS transistor 140 may include fourth junction regions 345 and 347. The fourth junction regions 345 and 347 may include a fourth low concentration junction region 345 and a fourth high concentration junction region 347. The fourth low concentration junction region 345 may be below the fourth high concentration junction region 347. A doping concentration of the fourth low concentration junction region 345 may be less than that of the fourth high concentration junction region 347. The source S of the PMOS transistor 140 may have a similar structure to the drain D of the PMOS transistor 140.

Gate structures 380 and 390 of the PMOS transistor 140 may be a gate insulation layer 380 and a gate 390. The gate insulation layer 380 may be, for example, a silicon oxide and/or a silicon nitride. The gate 390 may be polysilicon and/or metal material. Each of the source S and the drain D of the PMOS transistor 140 may be connected to metal lines ML through contact plugs CP. The NMOS transistor 130 and the PMOS transistor 140 may share the metal lines ML. The drain D of the NMOS transistor 130 may be connected to the drain D of the PMOS transistor 140 through the contact plugs CP and the metal line ML. The source S of the NMOS transistor may be connected to the source S of the PMOS transistor 140 through the contact plugs CP and the metal line ML.

As illustrated in FIG. 1, the drain D of the NMOS transistor 130 and the drain D of the PMOS transistor 140 may be connected to the input/output pad 190. If ESD occurs in the input/output pad 190, it may be delivered to the drain D of the NMOS transistor 130 and the drain D of the PMOS transistor 140 through the input/output line IOL. For purposes of example, it may be assumed that a ground voltage Vss is applied to the P-well 220 of the NMOS transistor 130 and a power voltage Vdd is applied to the N-well 310 of the PMOS transistor 140. For purposes of example, it may be assumed that ESD of a positive level is applied through the input/output pad 190. In the PMOS transistor 140, the drain D may be P-type and the N-well 310 may be N-type. If ESD voltage applied to the drain D of the PMOS transistor 140 increases, the drain D and the N-well 310 may become forward biased. The ESD applied to the drain D of the PMOS transistor 310 may be discharged to a power node thorough the N-well 310.

In the NMOS transistor 130, the drain D may be N-type, and the P-well 220 may be P-type. When ESD of a positive level is applied to the drain D of the NMOS transistor 130, the drain D and the N-well 220 may be reverse biased. When a voltage of the drain D reaches breakdown voltage due to an ESD event, current may flow from the drain D of the NMOS transistor 130 to the P-well 220. At this point, a voltage of the P-well 220 may rise due to the current flowing from the drain D. The drain D and the source S of the NMOS transistor 130 may be N-type. The drain D, the source S, and the P-well 220 of the NMOS transistor 130 may be an NPN junction. When a voltage of the drain D rises due to an ESD event and a voltage of the P-well 220 rises due to the current inflowing from the drain D, a bias condition may be satisfied and the drain D, the source S, and the P-well 220 of the NMOS transistor 130 may operate as an NPN bipolar junction transistor (BJT).

For example, the source S of the NMOS transistor 130 may operate as an emitter of the NPN BJT, the P-well 220 may operate as a base, and the drain D may operate as a collector. Based on a voltage difference between the source S and the P-well 220 of the NMOS transistor 130, current may flow from the drain D to the source S of the NMOS transistor 130. An ESD current flowing into the drain D may be delivered to the source S through the NMOS transistor 130 under the BJT operation condition. When the operation condition is satisfied in a typical NMOS transistor a strong snapback phenomenon may occur. Strong snapback may indicate a drastic reduction of a drain voltage because a large amount of current flows from the drain into the source of an NMOS transistor. When strong snapback occurs, a drain voltage may drop to a hold voltage. Until a drain voltage is lower than a hold voltage and/or a drain current is lower than a hold current the NMOS transistor may operate as a BJT.

When a power voltage level of an input/output pad is higher than a hold voltage, a drain voltage of the NMOS transistor may be higher than a hold voltage during data transmission through the NMOS transistor. When the input/output pad is a power supply pad, a drain voltage of the NMOS transistor may always be higher than a hold voltage. The NMOS transistor may continuously operate as a BJT and a large amount of current may be discharged. Due to a large amount of continuously discharged current, the NMOS transistor or a peripheral device may be damaged. As illustrated in FIG. 3, the drain D of the NMOS transistor according to example embodiments of the inventive concepts may include the first junction regions 241 and 243 and the first deep junction region 210. The first deep junction region 210 may have a lower doping concentration than the first junction regions 241 and 243. The first junction regions 241 and 243 may be in the first deep junction region 210 and the first deep junction region 210 may extend below the gate structures 280 and 290 and below the device isolation layer IS.

Because the first deep junction region 210 is provided an area of the drain D may be increased. In relation to the doping concentration of the drain D, the first high concentration junction region 243, the first low concentration junction region 241, and the first deep junction region 210 may be sequentially reduced in terms of a doping concentration. For example, the drain D of the NMOS transistor 130 may have a doping concentration with a gradation structure in a broader area than the first junction regions 241 and 243. An electric field between the drain D and the P-well 220 may be dispersed in the first junction regions 241 and 243 and the first deep junction region 210, and voltage (or current) tolerance of the drain D may be improved. Strong snapback may be prevented and/or reduced.

When the NMOS transistor 130 operates as an ESD protection circuit, the P-well 220 may operate as a base, the drain D may operate as a collector, and the source S may operate as an emitter. In the BJT, as the width of the base is narrower, operating characteristics of the BJT may be improved. In the NMOS transistor 130, as an interval between the drain D and the source D is reduced, ESD protection characteristics of the NMOS transistor 130 may be enhanced. As an area extending below the gate structures 280 and 290 in a region of the first deep junction area 210 may be increased, ESD protection characteristics of the NMOS transistor 130 may be enhanced. The ESD protection characteristics of the NMOS transistor 130 may be adjusted by adjusting a region where the first deep junction region 210 extends.

For purposes of explanation, it may be assumed that ESD of a negative level is applied through the input/output pad 190. In the NMOS transistor 130, the drain D may be N-type and the P-well 220 may be P-type. When an ESD voltage of a negative level is applied to the drain D of the NMOS transistor 130, the drain D and the P-well 220 may become forward biased. The ESD applied to the NMOS transistor 130 may discharged into a ground node through the P-well 220. In the PMOS transistor 140, the drain D may be P-type and the N-well 310 may be N-type. When an ESD voltage of a negative level is applied to the drain D of the PMOS transistor 140, the drain D and the P-well 310 may become reverse biased. For example, similarly to the case described with reference to the NMOS transistor 130, the PMOS transistor 140 may be biased to operate as a BJT (PNP).

The drain D may be formed by injecting Group III elements, for example, boron (B). Group III elements (e.g., boron) may have high diffusivity. When the drain D of the PMOS transistor 140 is formed, and subsequently if thermal processing occurs, due to characteristics of Group III elements in terms of a doping concentration, the drain may have a gradation structure. As described with reference to the first junction regions 241 and 243 and the first deep junction region 210 of the NMOS transistor 130, strong snapback may be prevented or reduced in the drain of the PMOS transistor 140.

ESD applied to the input/output pad 190 may be discharged into a power node and/or a ground node through the NMOS transistor 130 and the PMOS transistor 140. Due to the first deep junction region 210, strong snapback of the NMOS transistor 130 may be prevented and/or reduced. The NMOS transistor 130, or the NMOS transistor 130 and the PMOS transistor 140 may perform a switching operation between the internal circuit 110 and the input/output pad 190 and also operate as an ESD protection circuit. An additional ESD protection circuit consisting of a diode and/or a transistor may not be required, and an area of the integrated circuit device 100 may be reduced. Because the NMOS transistor 130, or the NMOS transistor 130 and the PMOS transistor 140 may operate as an ESD protection circuit, reliability of the integrated circuit may be improved.

Figure 5:
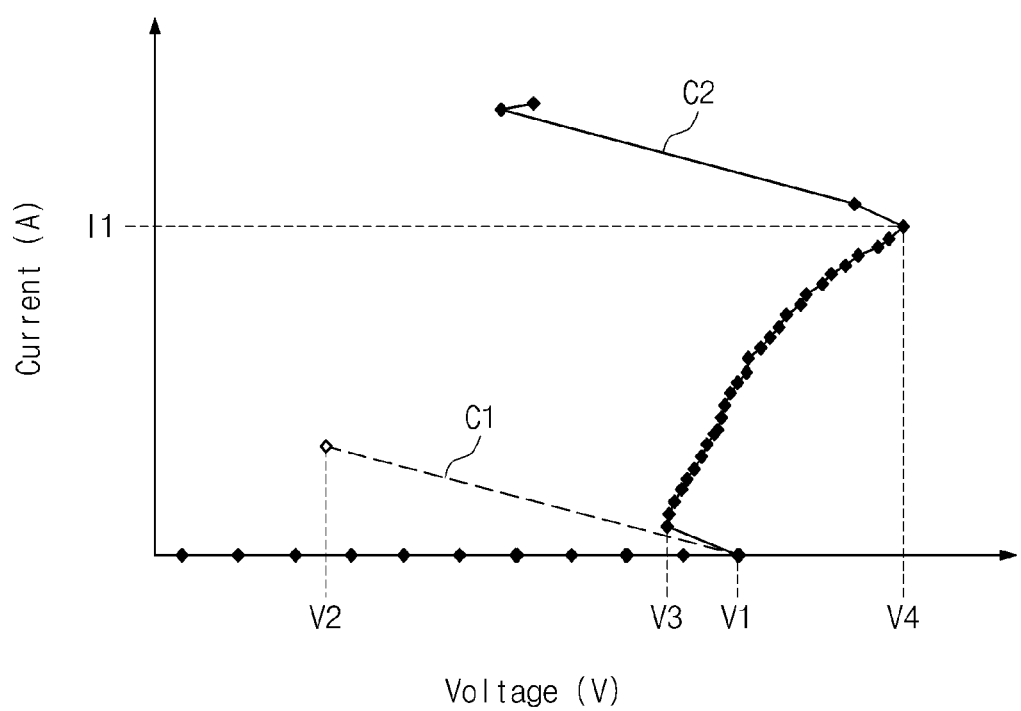

FIG. 5 is a graph of an ESD experimental result. In FIG. 5, the x-axis represents voltage and the y-axis represents current. The results may be based on a ground voltage applied to a gate 290, the source S, and P-well 220 of the NMOS transistor 130, and a voltage of the drain D is measured with a variable amount of current applied to the drain D. The curve C1 may represent an experimental result of a typical NMOS transistor including a source and a drain with only first and second junction regions. In case that ESD occurs, a typical NMOS transistor may experience strong snapback at the voltage V1. A hold voltage of a typical NMOS transistor may be the voltage V2. The curve C2 may represent an experimental result of the NMOS transistor 130 described with reference to FIGS. 2 and 3. When an ESD event occurs, the NMOS transistor 130 may experience snapback at the voltage V1. A hold voltage of the NMOS transistor may be the voltage V3, which is higher than the voltage V2 (e.g., V2 may be a hold voltage of a typical NMOS transistor). Strong snapback may be prevented in the NMOS transistor 130.

In relation to the NMOS transistor 130, until a current discharged from the drain D reaches the current I1 and/or a voltage of the drain D reaches the voltage V4, the NMOS transistor 130 may normally discharge a current from the drain D. Until a current of the drain D reaches the current I1 and/or the drain voltage D reaches the voltage V4, the NMOS transistor 130 may provide an ESD protection function. Compared to a typical NMOS transistor, the ESD protection function of the NMOS transistor 130 may be improved.

Figure 6A:
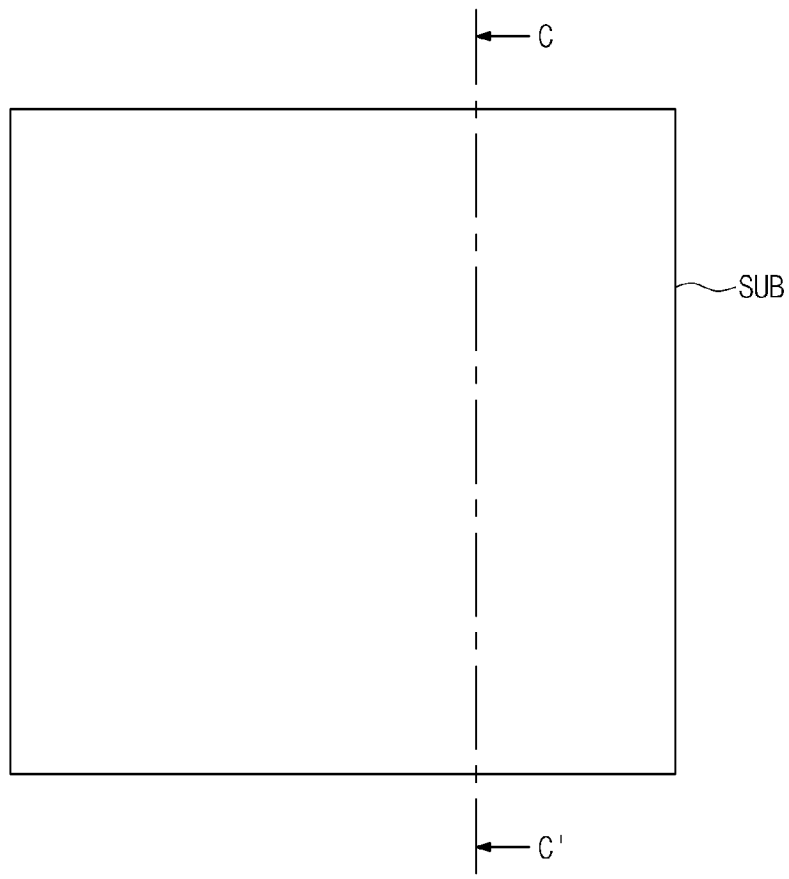
Figure 6B:
Figure 7A:
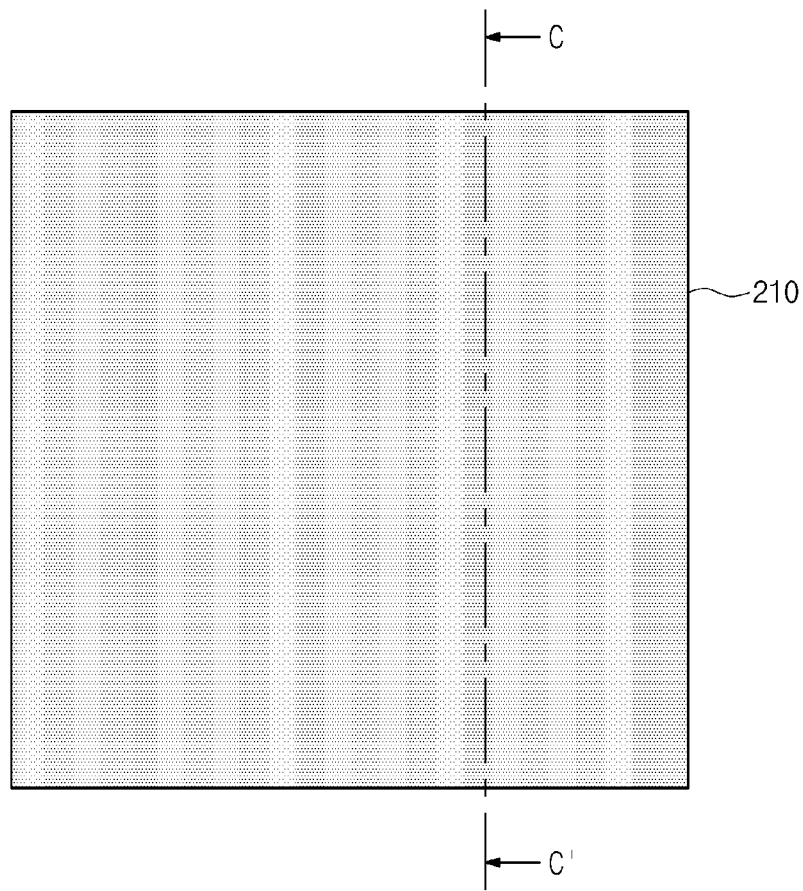
Figure 7B:
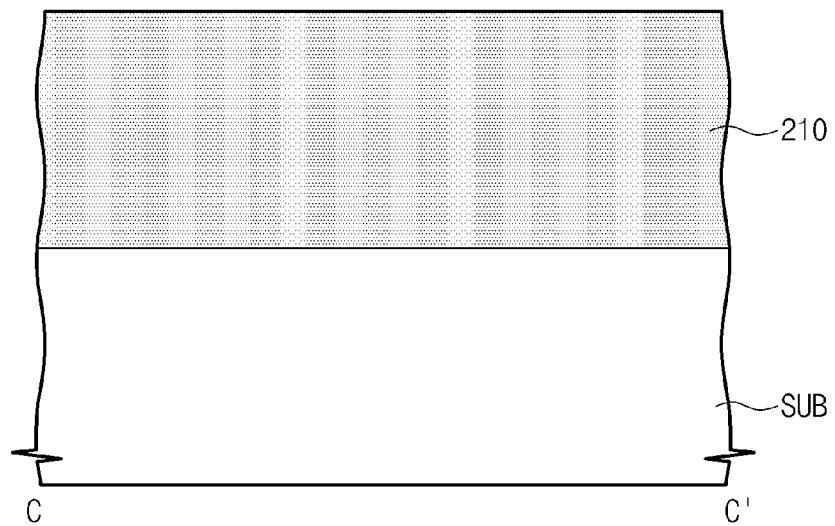

FIGS. 6A-9B are diagrams illustrating methods of manufacturing the transmission gate 120 described with reference to FIGS. 2-4 according to example embodiments of the inventive concepts. FIGS. 6A, 7A, 8A and 9A are plan views illustrating formation processes of a transmission gate 120. FIGS. 6B, 7B, 8B and 9B are cross-sectional views taken along the respective lines C-C' of FIGS. 6A, 7A, 8A and 9A. Referring to FIGS. 6A and 6B, the substrate SUB may be provided (e.g., a semiconductor layer). For example, the substrate SUB may be P-type. Referring to FIGS. 7A and 7B, an N-well 210 may be formed by injecting an impurity into the substrate SUB. For example, a Group V element (e.g., phosphorus (P)) may be injected as an impurity. An impurity may be injected on an entire substrate SUB corresponding to the transmission gate 120. The N-well 210 may be formed in a region where an impurity is injected.

Figure 8A:
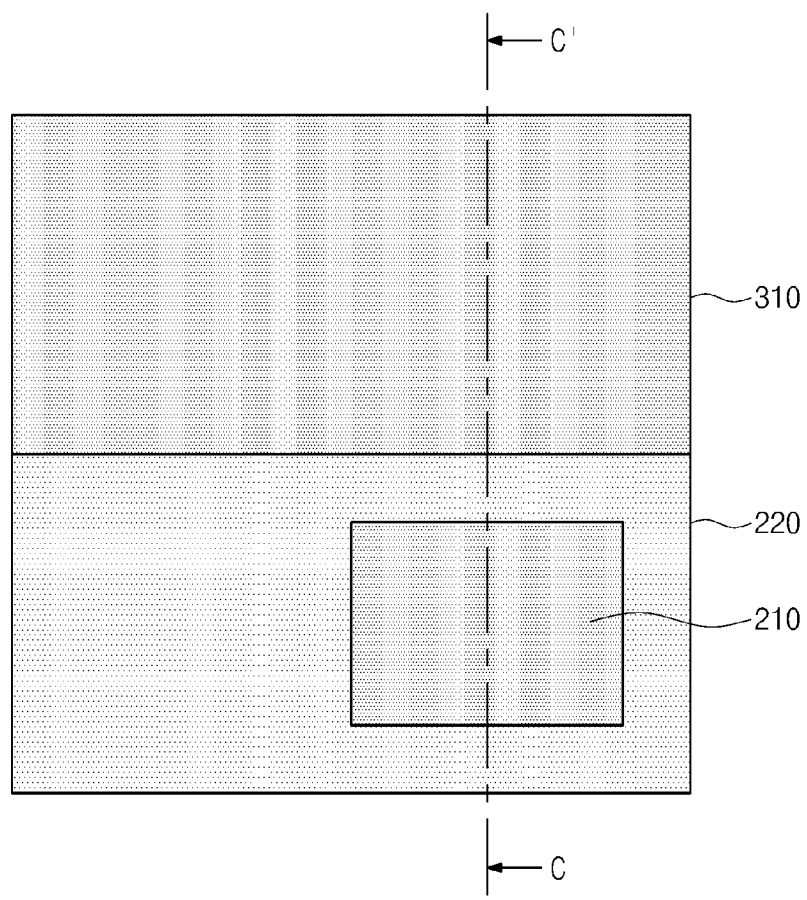
Figure 8B:
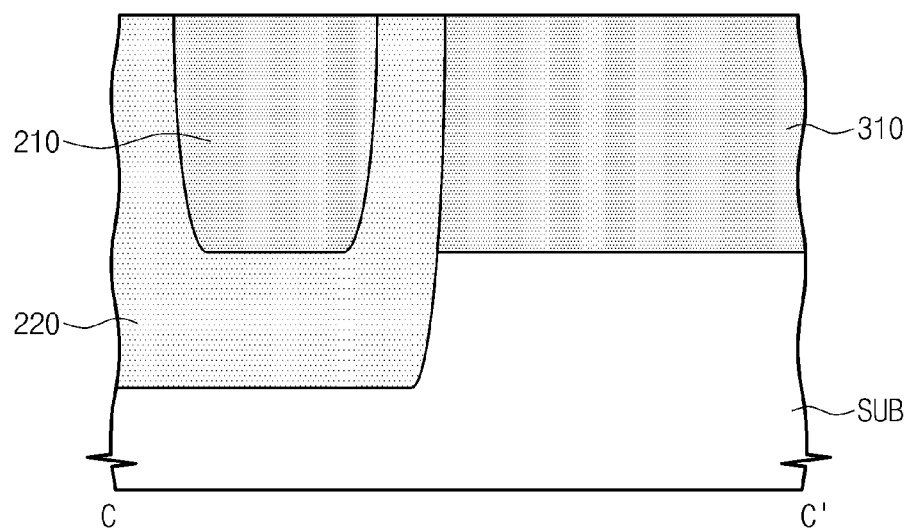

Referring to FIGS. 8A and 8B, the P-well 220 may be formed by injecting an impurity. A photo resist (not shown) may be stacked on the N-well 210. The stacked photo resist may be patterned along a region where an impurity is to be injected. For example, the stacked photo resist may be patterned by exposing a region corresponding to the NMOS transistor 130 and not exposing a region corresponding to the first deep junction region 210 in the top surface of the N-well 310. An impurity may be injected. For example, a Group III element (e.g., boron) may be injected as an impurity. The P-well 220 may be formed in a region excluding a region corresponding to the first deep junction region 210 in a region corresponding to the NMOS transistor 130. In FIG. 8B, it is illustrated that a bottom of the P-well 220 is under the bottom of the first deep junction region 210. For example, the impurity may diffuse and form the bottom under the first deep junction region 210. In other example, the substrate SUB may have conductive type identical to the P-well. The bottom of the P-well 220 may be formed by the impurity and the substrate SUB. The first deep junction region 210 may be formed with the N-well 310 and an additional process for forming the first deep junction region 210 may not be required. Hereinafter, the N-well of a region corresponding to the PMOS transistor 140 may be referred to as reference number 310. The P-well 220 may be formed with a lower bottom surface than the N-well 310. An impurity may be injected and the photo resist may be removed.

Figure 9A:
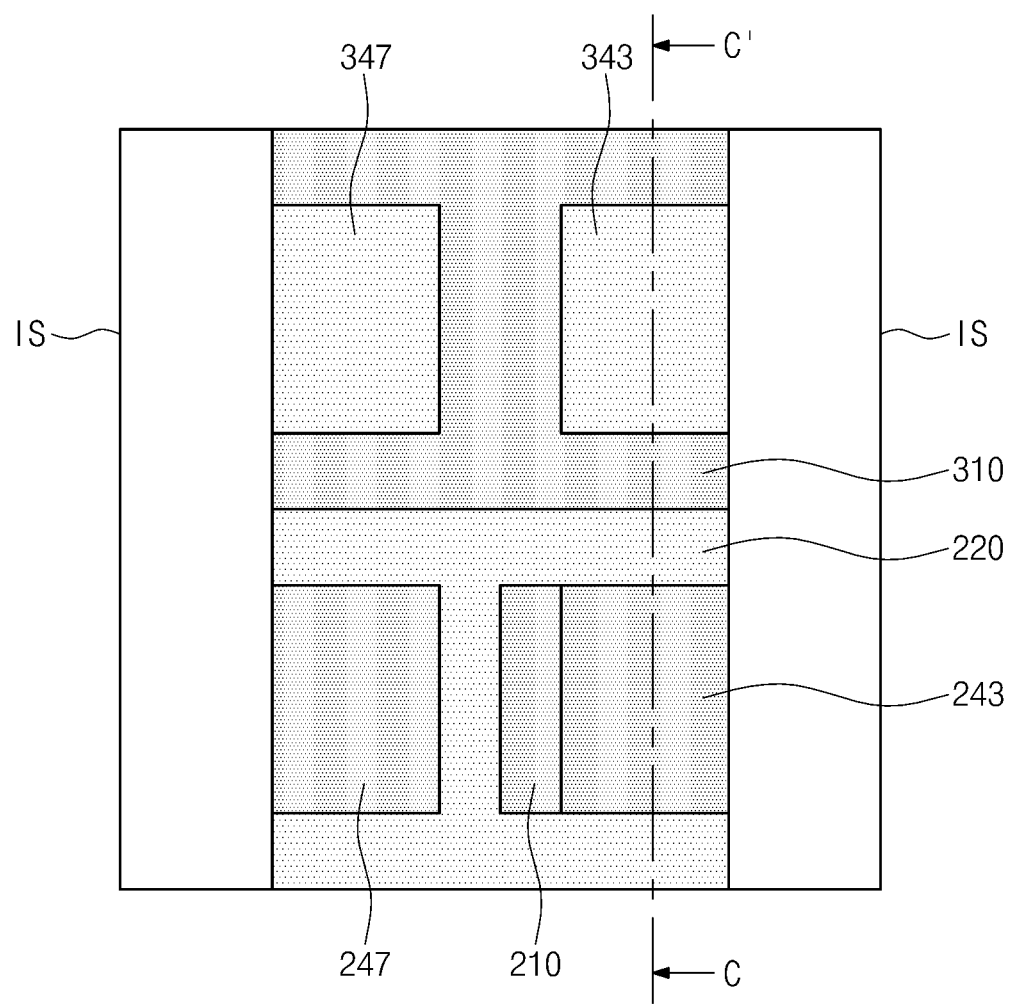
Figure 9B:
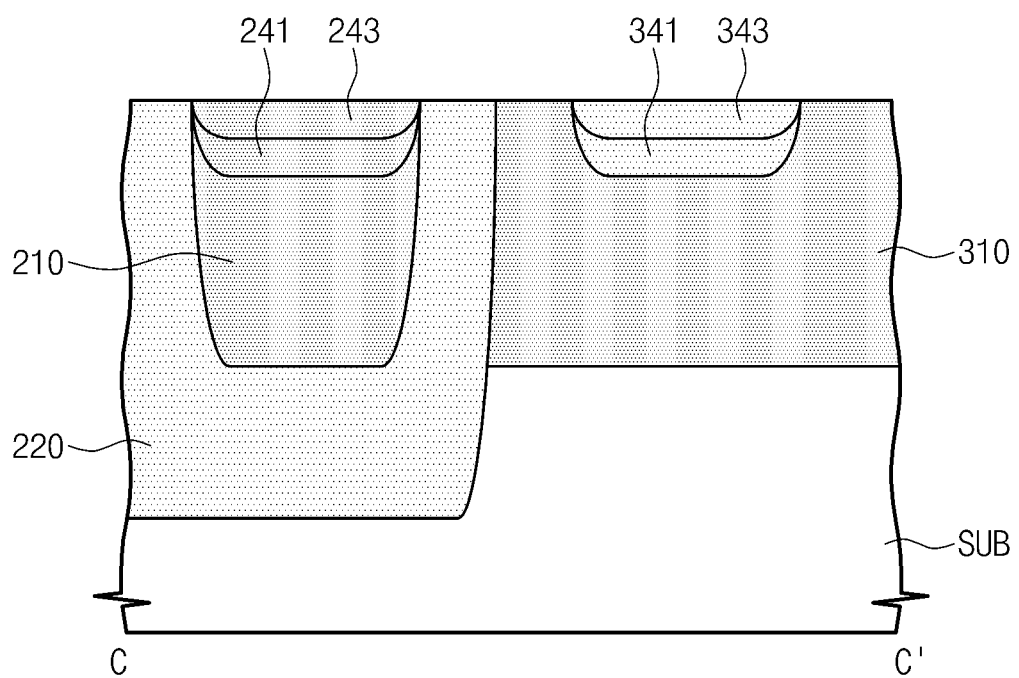

Referring to FIGS. 9A and 9B, the device isolation layers IS, the first to fourth junction regions 241, 243, 245, 247, 341, 343, 345, and 347 of the NMOS transistor 130, and the PMOS transistor 140 may be formed. After the forming of the device isolation layers IS, the first to fourth junction regions 241, 243, 245, 247, 341, 343, 345, and 347 may be formed. After the forming of the first to fourth junction regions 241, 243, 245, 247, 341, 343, 345, and 347, the device isolation layers IS may be formed. The device isolation layers may be formed before or after the forming of the first to fourth junction regions 241, 243, 245, 247, 341, 343, 345, and 347. Referring to FIGS. 2-4, a transmission gate 120 may be formed.

Figure 10A:
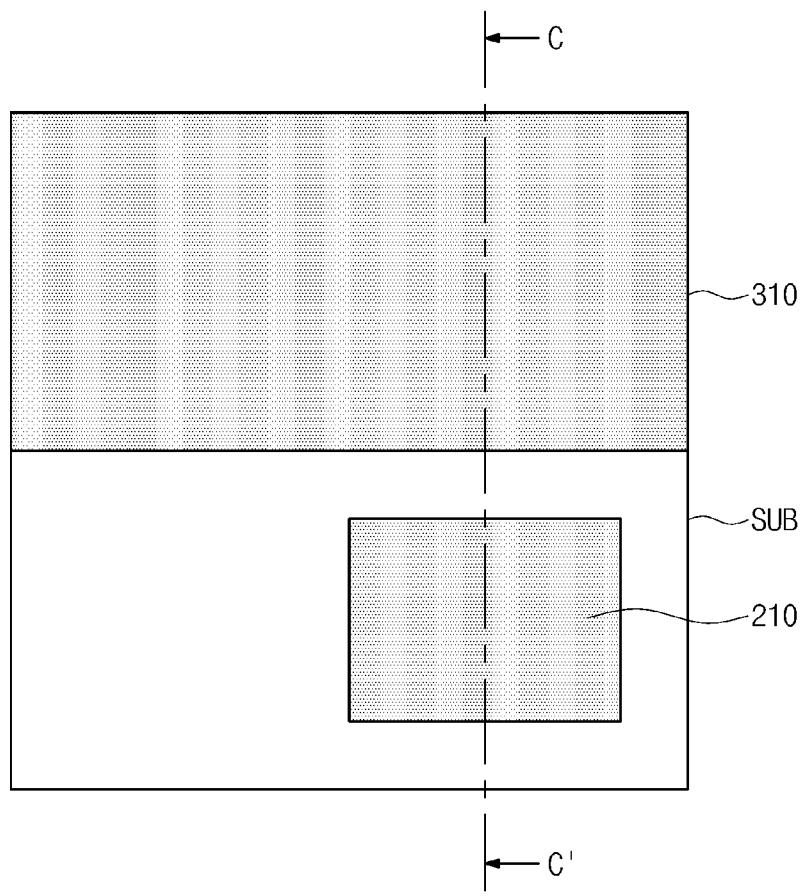
FIGS. 10A and 10B are diagrams illustrating methods of manufacturing transmission gates described with reference to FIGS. 2-4 according to example embodiments of the inventive concepts.
Figure 10B:
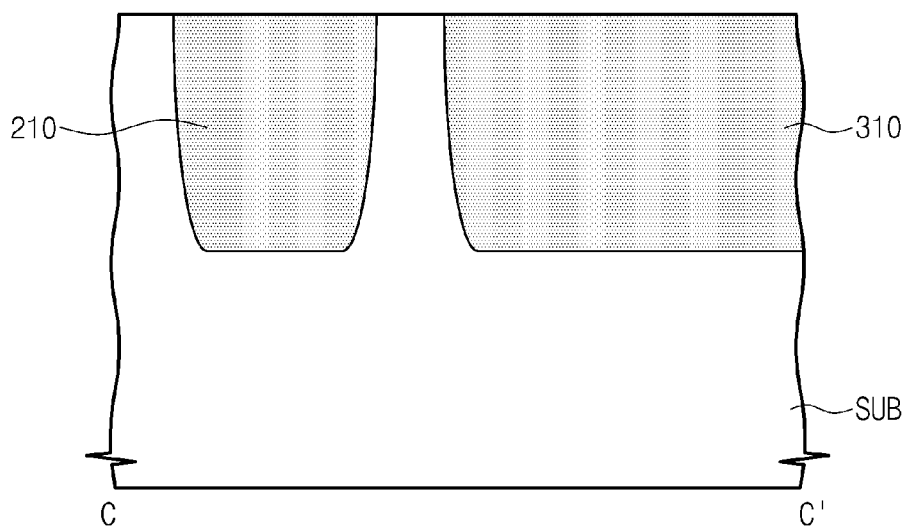

FIGS. 10A and 10B are diagrams illustrating methods of manufacturing a transmission gate 120 described with reference to FIGS. 2-4 according to example embodiments of the inventive concepts. Referring to FIGS. 10A and 10B, the N-well 310 and the first deep junction region 210 may be formed on the substrate SUB. For example, a photo resist may be deposited on the substrate SUB. The photo resist may be patterned. For example, the photo resist may be patterned to expose a region corresponding to the PMOS transistor 140 and a region corresponding to the first deep junction region 210. A Group III impurity (e.g., P) may be injected. As illustrated in FIGS. 10A and 10B, the N-well 310 and the first deep junction region 210 may be formed. The photo resist may be removed.

The P-well 220 of FIGS. 2-4 may be formed. For example, a photo resist may be deposited. The photo resist may be patterned. For example, the photo resist may be patterned by exposing a region corresponding to the NMOS transistor 130 and not exposing a region corresponding to the first deep junction region 210. A Group V impurity (e.g., B) may be injected, as illustrated in FIGS. 8A and 8B, the P-well 220 may be formed. The photo resist may be removed. Similarly to the method described with reference to FIGS. 9A and 9B, the NMOS transistor 130 and the PMOS transistor 140 may be formed. According to example embodiments described with reference to FIGS. 10A and 10B, and as described with reference to FIGS. 6A-9B, the first deep junction region 210 may be formed with the N-well 310. An additional process for forming the first deep junction region 210 may not be required. The first deep junction region 210 may be formed with the N-well 310 of the PMOS transistor 140.

According to example embodiments the first deep junction region 210 may be formed using an additional process different from the process of forming the N-well 310 of the PMOS transistor 140.

As described above, after the forming of the N-well 310 of the PMOS transistor 140, the P-well 220 of the NMOS transistor 130 may be formed. According to example embodiments, after the forming of the P-well 220 of the NMOS transistor 130, the N-well 310 of the PMOS transistor 140 may be formed.

Figure 11:
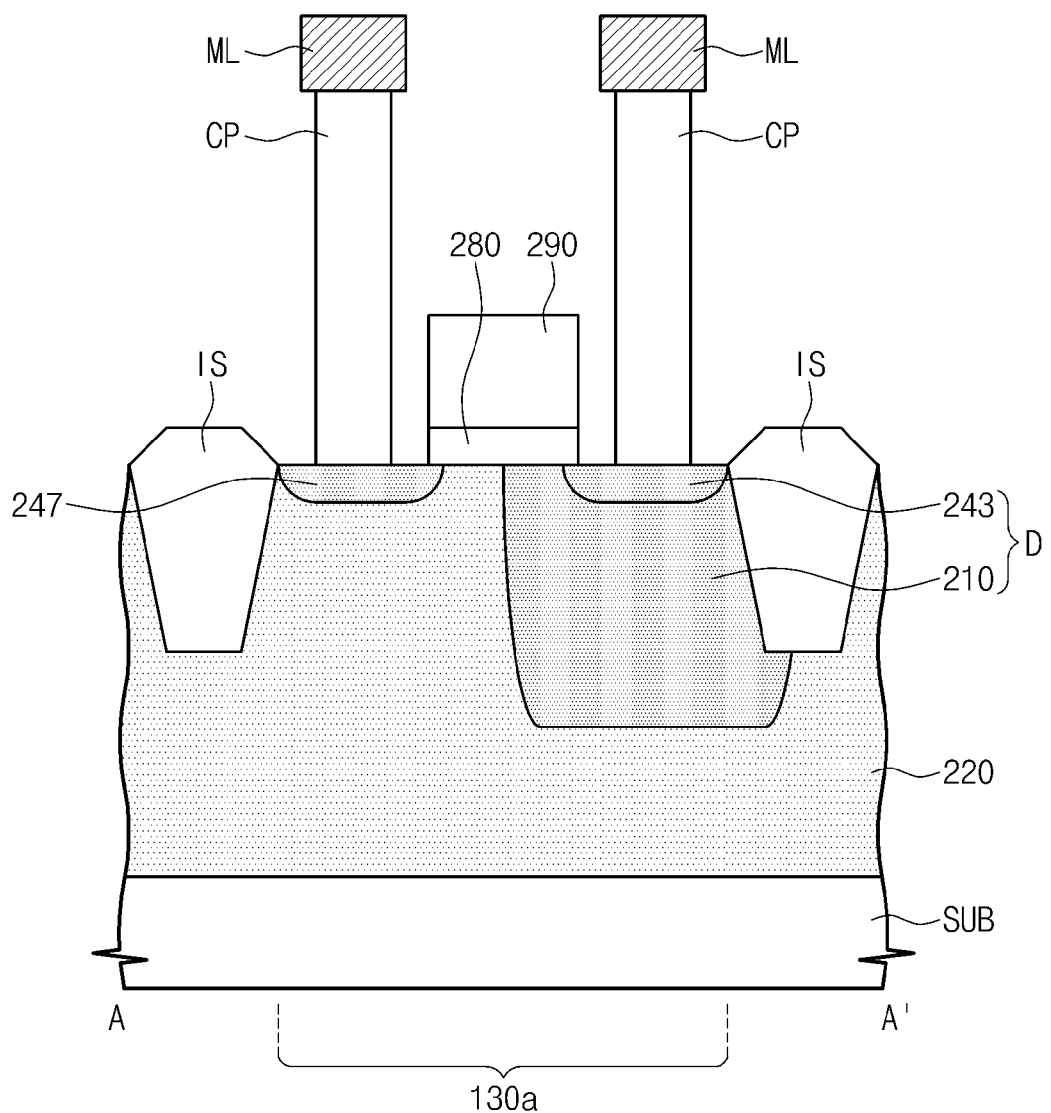

FIG. 11 is a cross-sectional view taken along line A-A' of the transmission gate 120 of FIG. 2. Referring to FIG. 11, the NMOS transistor 130a may have the same or similar configuration to that of the NMOS 130 of FIGS. 2 and 3. The drain D and the source S of the NMOS 130a may be different than the source S and the drain D of the NMOS 130. Overlapping description may be omitted.

The first junction region 243 of the drain D of the NMOS transistor 130a may include a single layer. The first junction region 243 of the drain D may have a uniform doping concentration. A doping concentration of the first junction region 243 may be greater than that of the first deep junction region 210. The first junction region 243 and the first deep junction region 210 may have a gradation structure in terms of a doping concentration. The second junction region 247 of the source S of the NMOS transistor 130a may include a single layer. The second junction region 247 of the source S may have a uniform doping concentration. A doping concentration of the second junction region 247 of the source S may be identical to that of the first junction region 243.

Figure 12:
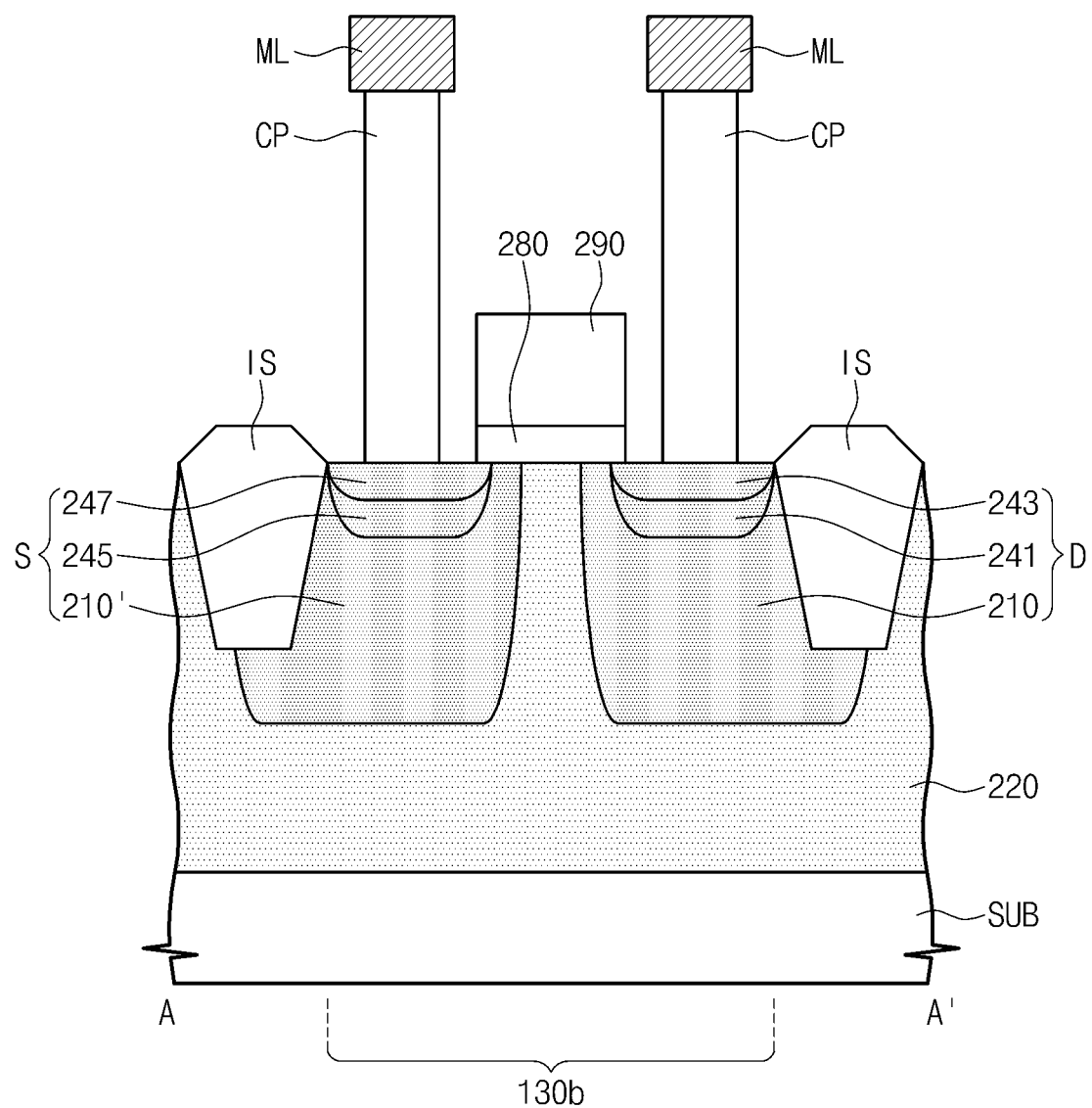

FIG. 12 is a cross-sectional view of the transmission gate 120 according to example embodiments of the inventive concepts. FIG. 12 illustrates a cross-sectional view taken along line A-A' of FIG. 2. The NMOS transistor 130b of FIG. 12 may have a similar structure to that of a transistor 130 of FIGS. 2 and 3. The source S may be different than the source S of the NMOS 130 illustrated in FIG. 3. Overlapping description may be omitted. Referring to FIG. 12, the source S of the NMOS transistor 130b may include second junction regions 245 and 247 and a second deep junction region 210'.

The second junction regions 245 and 247 may be identically configured as described with reference to FIGS. 2 and 3. The second junction regions 245 and 247 may be in the second deep junction region 210'. The second deep junction region 210' may have a lower doping concentration than the second junction regions 245 and 247. The second junction regions 245 and 247 and the second deep junction region 210' may have a gradation structure in terms of a doping concentration. The second deep junction region 210' may have a similar structure to the first deep junction region 210. For example, the second deep junction region 210' of the source S may be formed simultaneously when the first deep junction region 210 of the drain D is formed. As described with reference to FIG. 11, the first junction regions 241 and 243 of the drain D may be a single layer and the second junction regions 245 and 247 of the source S may be a single layer.

Figure 13:
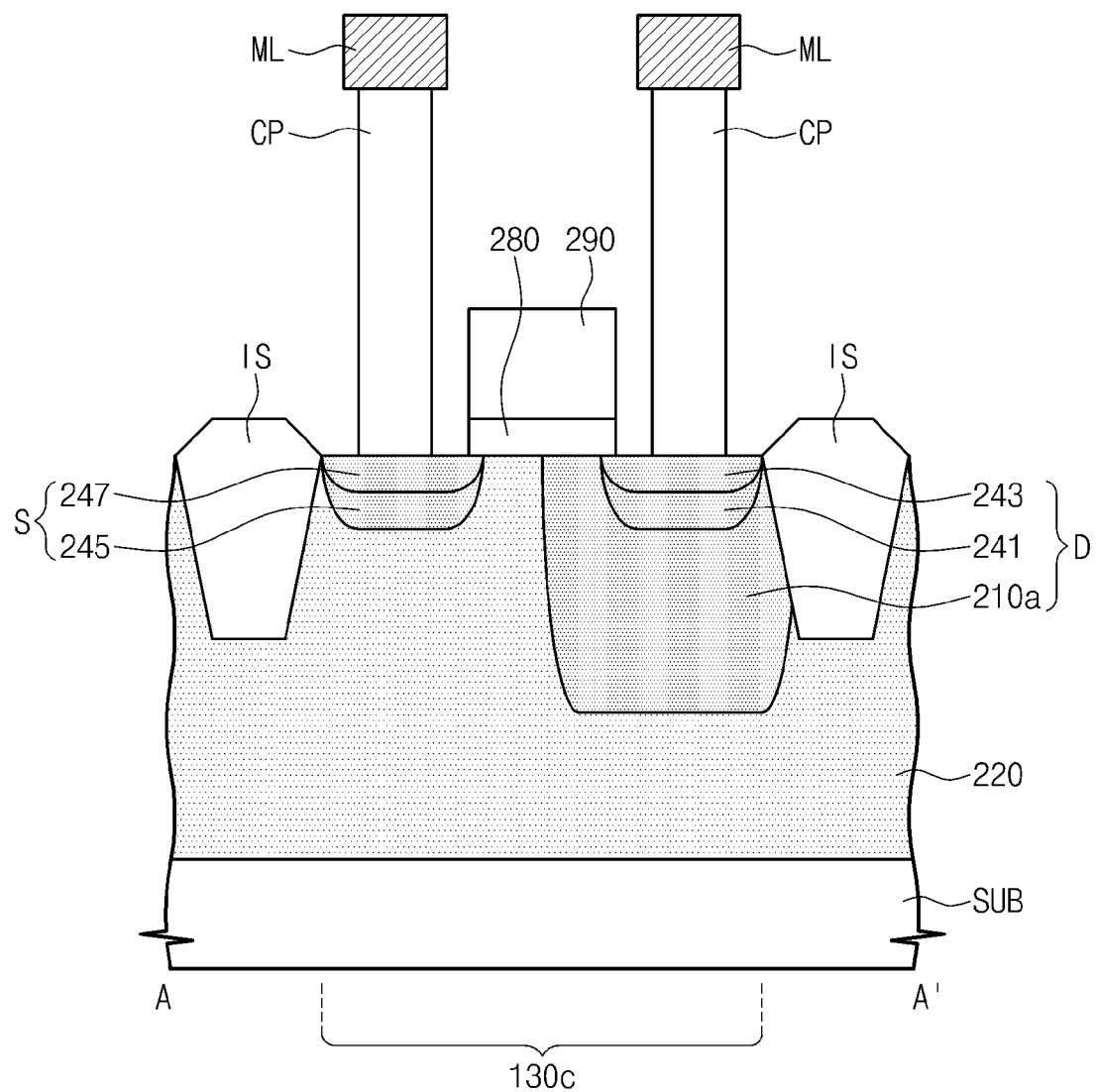

FIG. 13 is a cross-sectional view of the transmission gate 120 according to example embodiments of the inventive concepts. FIG. 13 illustrates a cross-sectional view taken along line A-A' of the transmission gate 120 of FIG. 2. The NMOS transistor 130c of FIG. 13 may be identically configured as described with reference to FIGS. 2 and 3. The drain D may be different than the drain D of the NMOS 130 illustrated in FIG. 3. Referring to FIG. 13, the drain D may include the first junction regions 241 and 243 and the first deep junction region 210a. The first junctions 241 and 243 may be identically configured as described with reference to FIGS. 2 and 3. The first deep junction region 210a may have a lower doping concentration than the first junction regions 241 and 243. The first junction regions 241 and 243 and the first deep junction region 210a may have a gradation structure in terms of a doping concentration.

The first junction regions 241 and 243 may be in the first deep junction region 210a. The first deep junction region 210a may extend below the gate structures 280 and 290. The first deep junction region 210a of the NMOS transistor 130c may not extend below the device isolation layer IS. As described with reference to FIG. 11, the first junction regions 241 and 243 of the drain D and the second junction regions 245 and 247 of the source S may each include a single layer. As described with reference to FIG. 12, the second deep junction region 210' may be included in the source S of the NMOS transistor 130c. For example, the second deep junction region 210' of the source S may not extend below the device isolation layer IS.

Figure 14:
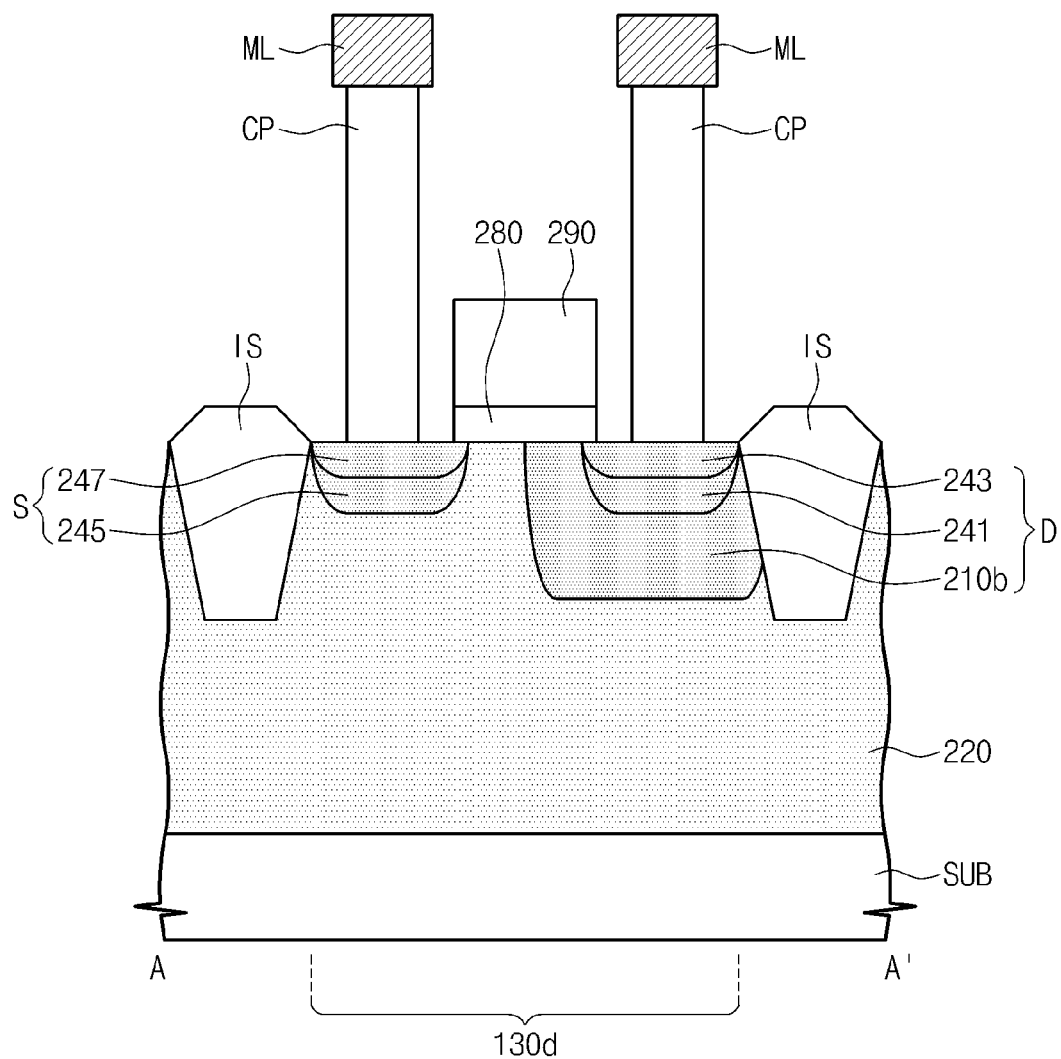

FIG. 14 is a cross-sectional view of a transmission gate 120 according to example embodiments of the inventive concepts.

FIG. 14 may illustrate a cross-sectional view taken along line A-A' of the transmission gate 120 of FIG. 2. The NMOS transistor 130d of FIG. 14 may have a similar configuration as that 130 of FIGS. 2 and 3. The drain D may be different than the drain D of the NMOS 130 illustrated in FIG. 3. Overlapping description may be omitted. Referring to FIG. 14, the drain D may include first junction regions 241 and 243 and a first deep junction region 210b. The first junction regions 241 and 243 may be identically configured as described with reference to FIGS. 2 and 3.

The first deep junction region 210b may have a lower doping concentration than the first junction regions 241 and 243. In terms of a doping concentration, the first junction regions 241 and 243 and the first deep junction region 210b may have a gradation structure. The first deep junction region 210b may have a higher bottom surface than the device isolation layer 210b. A bottom surface of the first deep junction layer 210b may not extend below the device isolation layer 210b. The first deep junction region 210b may be formed by an additional process different from a process for forming the N-well 310 of the PMOS transistor 140.

As described with reference to FIG. 11, the first junction regions 241 and 243 of the drain D may be a single layer and the second junction regions 245 and 247 of the source S may be a single layer. As described with reference to FIG. 12, a second deep junction region 210' of the source S may be included. For example, the second deep junction region 210' of the source S may have a higher bottom surface than the device isolation layer IS. Referring to FIGS. 11-14, various modifications of the source S and the drain D of the NMOS transistor 130 may be illustrated. Modifications of the NMOS transistor 130 are not limited to FIGS. 11-14.

Figure 15:
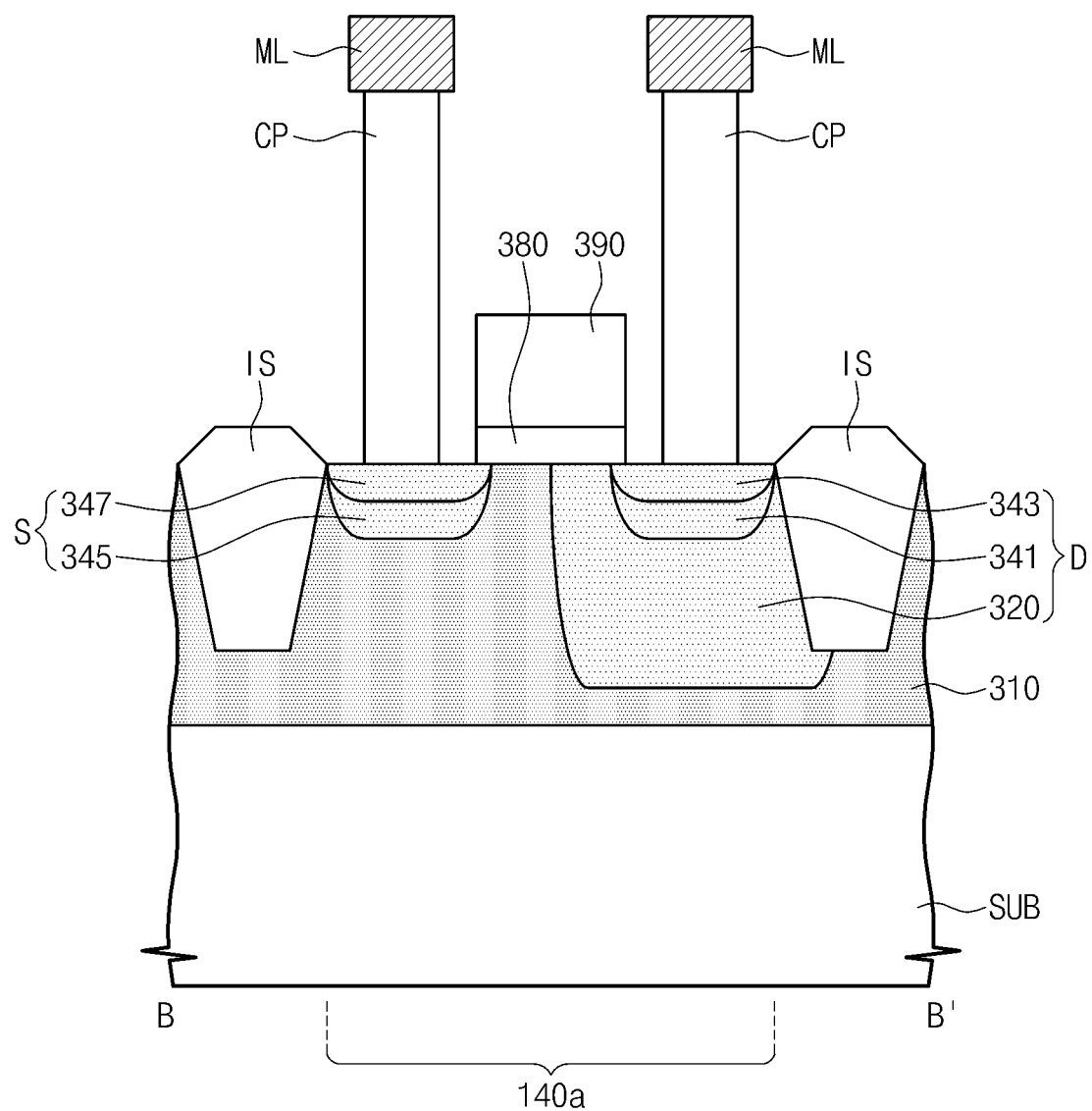

FIG. 15 is a cross-sectional view of a transmission gate 120 according to example embodiments of the inventive concepts. FIG. 15 illustrates a cross-sectional view taken along line B-B' of the transmission gate 120 of FIG. 2. The PMOS transistor 140a of FIG. 15 may be identically configured as the PMOS transistor 140 described with reference to FIGS. 2 and 4. The drain D may be different than the drain D of the PMOS 140 illustrated in FIG. 4. Overlapping description may be omitted. Referring to FIG. 15, the drain D may include third junction regions 341 and 343 and a third deep junction region 320. The third junction regions 341 and 343 may be identically configured as described with reference to FIGS. 2 and 4. The third junction regions 341 and 343 may be in the third deep junction region 320.

The third deep junction region 320 may extend below the gate structures 380 and 390. Additionally, the third deep junction region 320 may extend below the device isolation layer IS. A doping concentration of the third deep junction region 320 may be lower than that of the third junction regions 341 and 343. The third junction regions 341 and 343 and the third deep junction region 320 of the drain D may have a gradation structure in terms of a doping concentration. The PMOS transistor 140a may have the same structure as but be of a different conductive type than the NMOS transistor 130 described with reference to FIGS. 2 and 3.

As described with reference to FIG. 11, the third junction regions 341 and 343 of the drain D of the PMOS transistor 140a may be a single layer and the fourth junction regions 345 and 347 of the source S may be a single layer. Similarly to example embodiments described with reference to FIG. 12, a fourth deep junction region of a P-conductive type may be in the source S of the PMOS transistor 140a. The fourth junction regions 345 and 347 and the fourth deep junction region of the source S may have a gradation structure in terms of a doping concentration. As described with reference to FIG. 13, the third deep junction region 320 of the PMOS transistor 140a may not extend below the device isolation layer IS. As described with reference to FIG. 14, the third deep junction region 210 may have a higher bottom surface than the device isolation layer IS.

Figure 16:
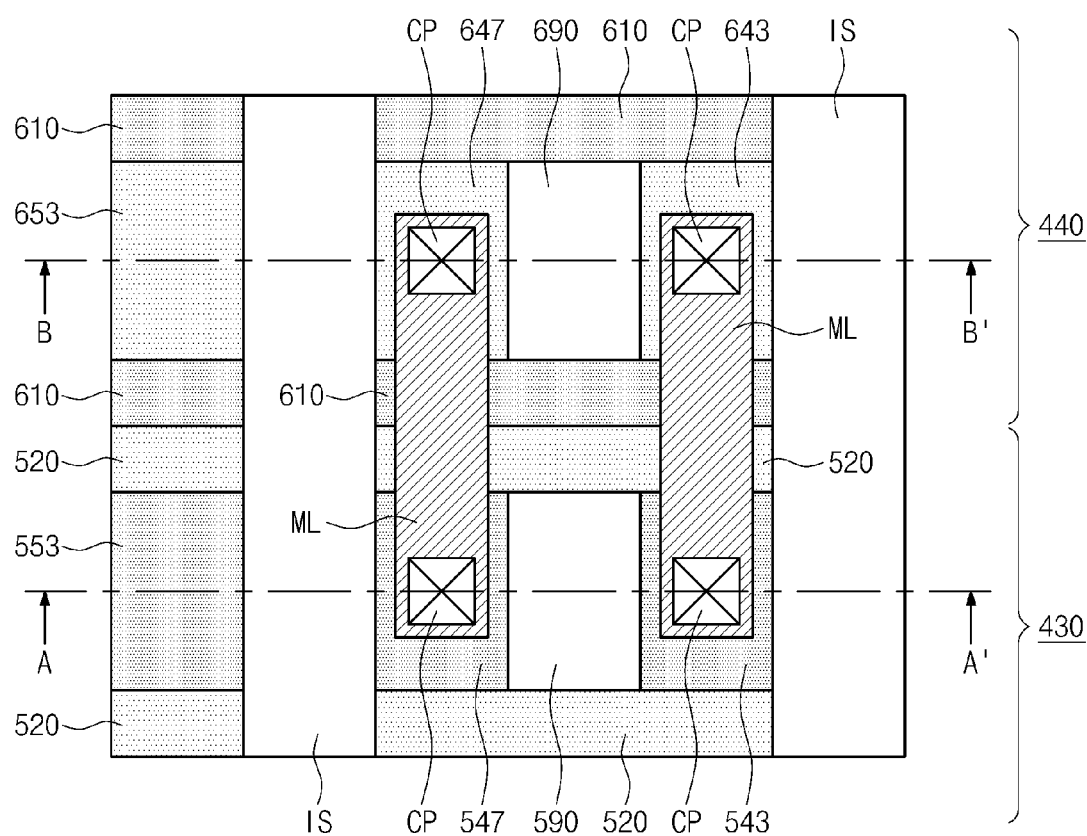
Figure 17:
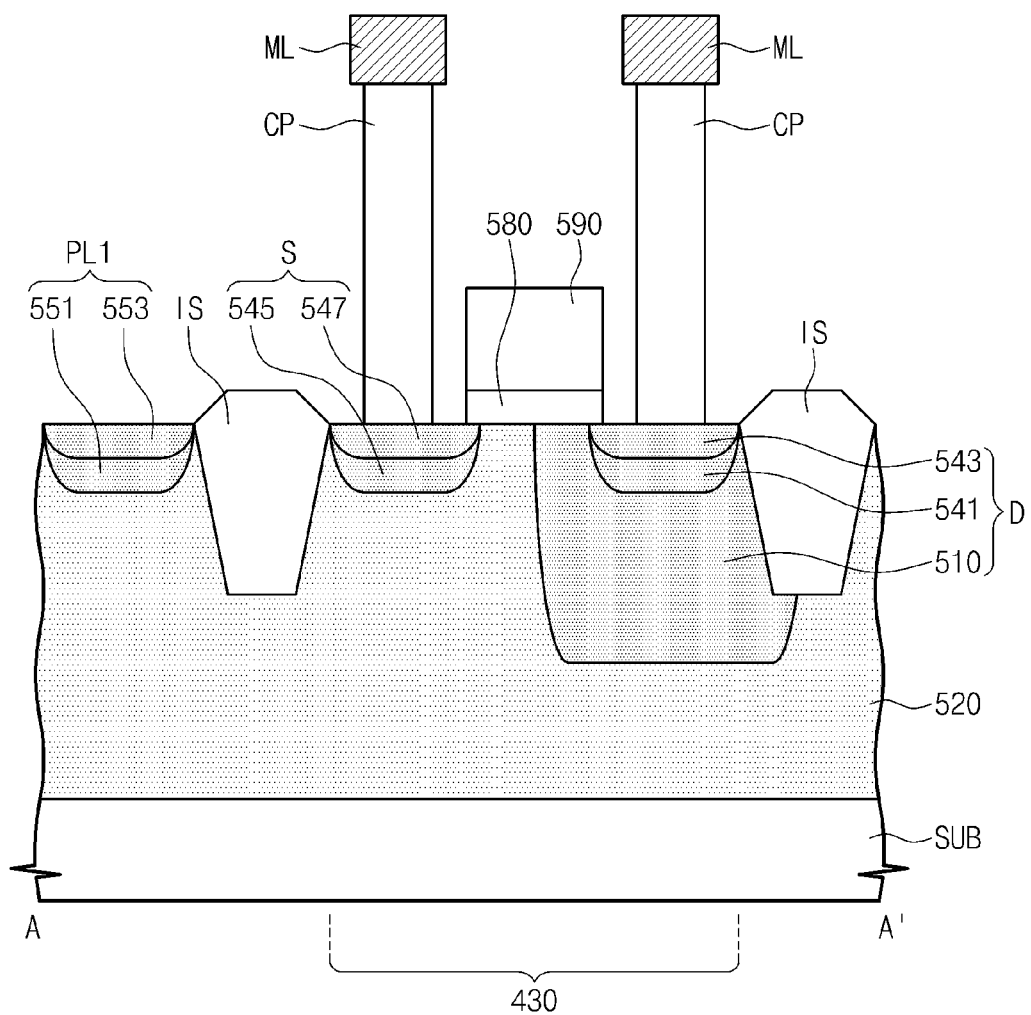
Figure 18:
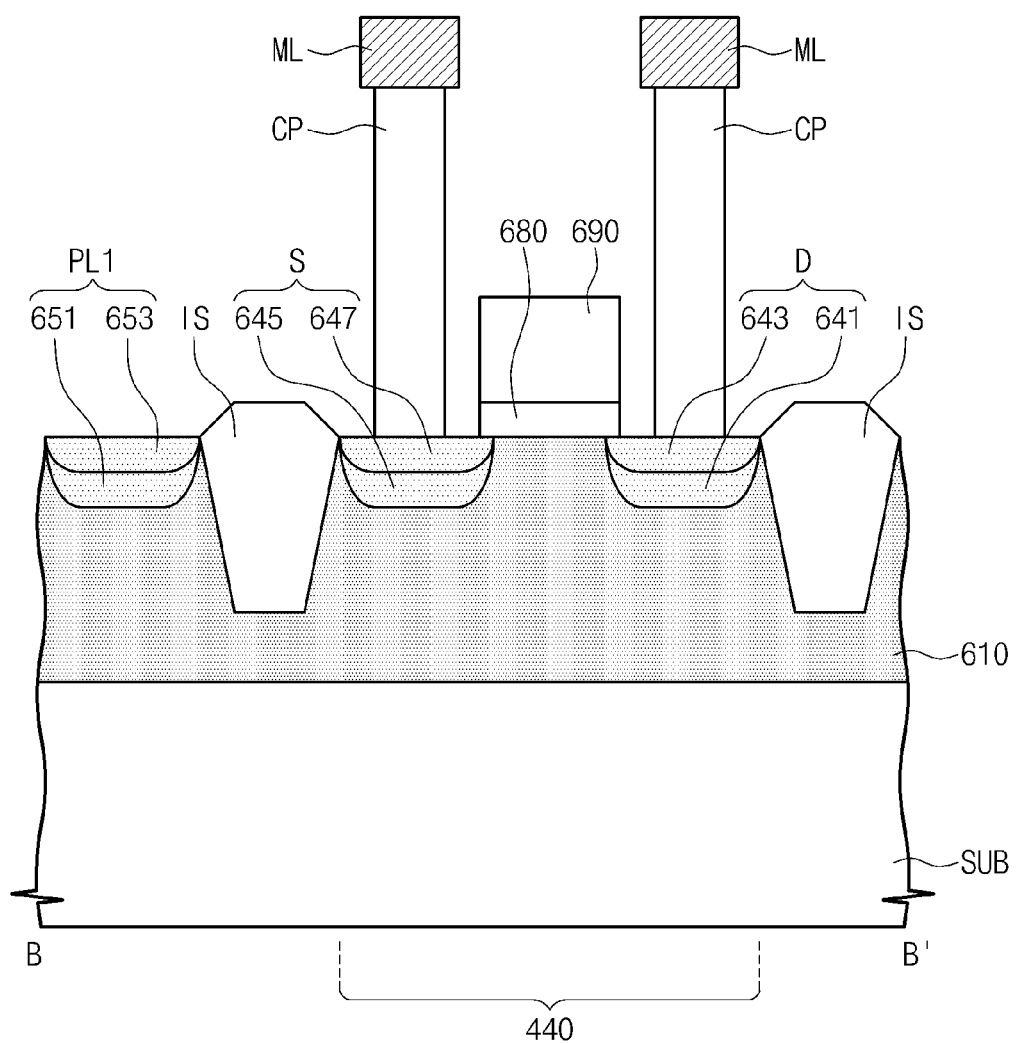

FIG. 16 is a plan view of a transmission gate 120 of FIG. 1 according to example embodiments of the inventive concepts. FIGS. 17 and 18 are sectional views taken along line A-A' and line B-B' of FIG. 16. Referring to FIGS. 16-18, compared to the transmission gate 120 according to example embodiments of the inventive concepts, the transmission gate 420 according to example embodiments of the inventive concepts includes first pickup layers PL1. The first pickup layers PL1 may be in a region corresponding to the NMOS transistor 430 and a region corresponding to the PMOS transistor 440. The first pickup layer PL1 may be on an opposite side of the device isolation layer IS from the source S of the NMOS transistor 430. Both the pickup layer PL1 and the source S may be adjacent to a same portion of the device isolation layer IS. From the drain D of the NMOS transistor 430, the gate structures 580 and 590, the source S, the device isolation layer IS, and the first pickup layer PL1 of the NMOS transistor 430 may be sequentially disposed.

The first pickup layer PL1 of the NMOS transistor 430 may have the same structure as the first junction regions 541 and 543 of the drain D of the NMOS transistor 430 and/or the second junction regions 545 and 547 of the source S. The first pickup layer PL1 of the NMOS transistor 430 may be of the same conductive type as the first junction regions 541 and 543 of the drain D of the NMOS transistor 430 and/or the second junction regions 545 and 547 of the source S. The first pickup layer PL1 of the NMOS transistor 430 may include a high concentration junction region 553 and a low concentration junction region 551 below the high concentration junction region 553. The first pickup layer PL1 of the NMOS transistor 430 may be formed simultaneously when the second junction regions 545 and 547 of the source S and/or the first junction regions 541 and 543 of the drain D of the NMOS transistor 430 are formed.

The source S of the NMOS transistor 430 may be connected, for example, to a node in an internal circuit 110 of an integrated circuit device 100 of FIG. 1. According to a state of the integrated circuit device 100, the source S of the NMOS transistor 430 may float. If a circuit with a high output impedance or input impedance is connected to the source S of the NMOS transistor 430, the source S of the NMOS transistor 430 may float. When power of the integrated circuit device 100 is cut off, the source S of the NMOS transistor 430 may float. When the integrated circuit device 100 includes a plurality of independently power-controllable power domains and power is cut off to a power domain corresponding to the NMOS transistor 430, the source S of the NMOS transistor 430 may float.

The source S, the P-well 520, and the drain D of the NMOS transistor 430 may be a PNP junction. The first pickup layer PL1, the P-well 520, and the drain D of the NMOS transistor 430 may be a PNP junction. Ground voltage may be applied to the first pickup layer PL1 of the NMOS transistor 430. Even when the source S of the NMOS transistor 430 is in a floating state, ESD current discharged into the drain D may be discharged through an NPN BJT of the first pickup layer PL1, the P-well 520 and the drain D.

Similarly to the first pickup layer PL1 provided in a region of the NMOS transistor 430, the first pickup layer PL1 may be provided in a region of the PMOS transistor 440. The first pickup layer PL1 of the PMOS transistor 440 may have the same structure and conductive type as the third junction regions 641 and 643 of the drain D and/or the fourth junction regions 645 and 647 of the source S of the PMOS transistor 440. The first pickup layer PL1 of the PMOS transistor 440 may be formed simultaneously when the drain D or the source S of the PMOS transistor 440 are formed. The PMOS transistor 440 may have the same structure as but be of the opposite conductive type to the NMOS transistor 430. The PMOS transistor may include a gate dielectric layer 680 and a gate 690.

The first pickup layer PL1 of the PMOS transistor 440 may be formed simultaneously when the third junction regions 641 and 643 of the drain D and the fourth junction regions 645 and 647 of the source S of the PMOS transistor 440 are formed. Power voltage VDD may be applied to the first pickup layer PL1 of the PMOS transistor 440. In relation to the transmission gate 420, the PMOS transistor 440 may be the PMOS transistor 140 described with reference to FIGS. 1-15. The PMOS transistor 140 without the first pickup layer PL1 and the NMOS transistor 430 may form the transmission gate 420.

Figure 19:
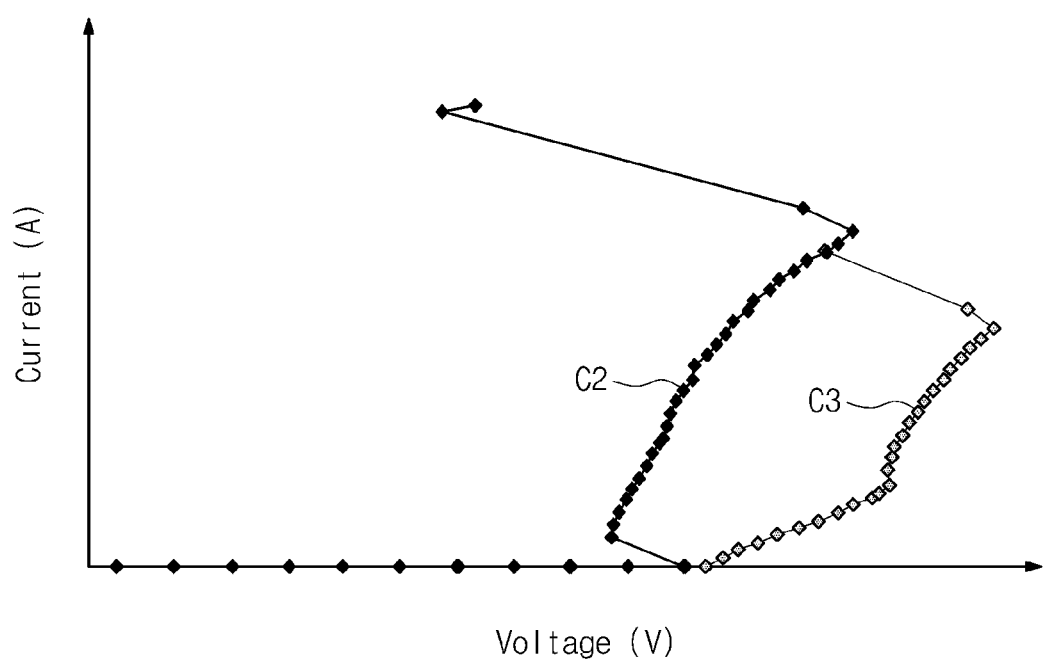

FIG. 19 is a graph illustrating an ESD experimental result of the NMOS transistor 430 described with reference to FIGS. 16 and 17. In FIG. 19, the x-axis represents voltage and the y-axis represents current. The results may be based on a ground voltage applied to the gate 590, the source S, and the P-well 520 of the NMOS transistor 430, and a voltage of the drain D may be measured with a variable amount of current applied to the drain D. The curve C2 may represent an experimental result of the NMOS transistor 130 described with reference to FIGS. 2-5. The curve C3 may represent an experimental result of the NMOS transistor 430 described with reference to FIGS. 16 and 17.

An experimental result of the NMOS transistor 430 when the source S of the NMOS transistor 430 of FIGS. 16 and 17 floats may be illustrated. As illustrated in FIG. 19, once the first pickup layer PL1 is provided to the NMOS transistor 430, even when the source S of the NMOS transistor 430 floats, an ESD protection function may be provided. Strong snapback may not occur. The integrated circuit device 100 including the NMOS transistor 430 may have improved reliability and occupy a reduced area.

Figure 20:
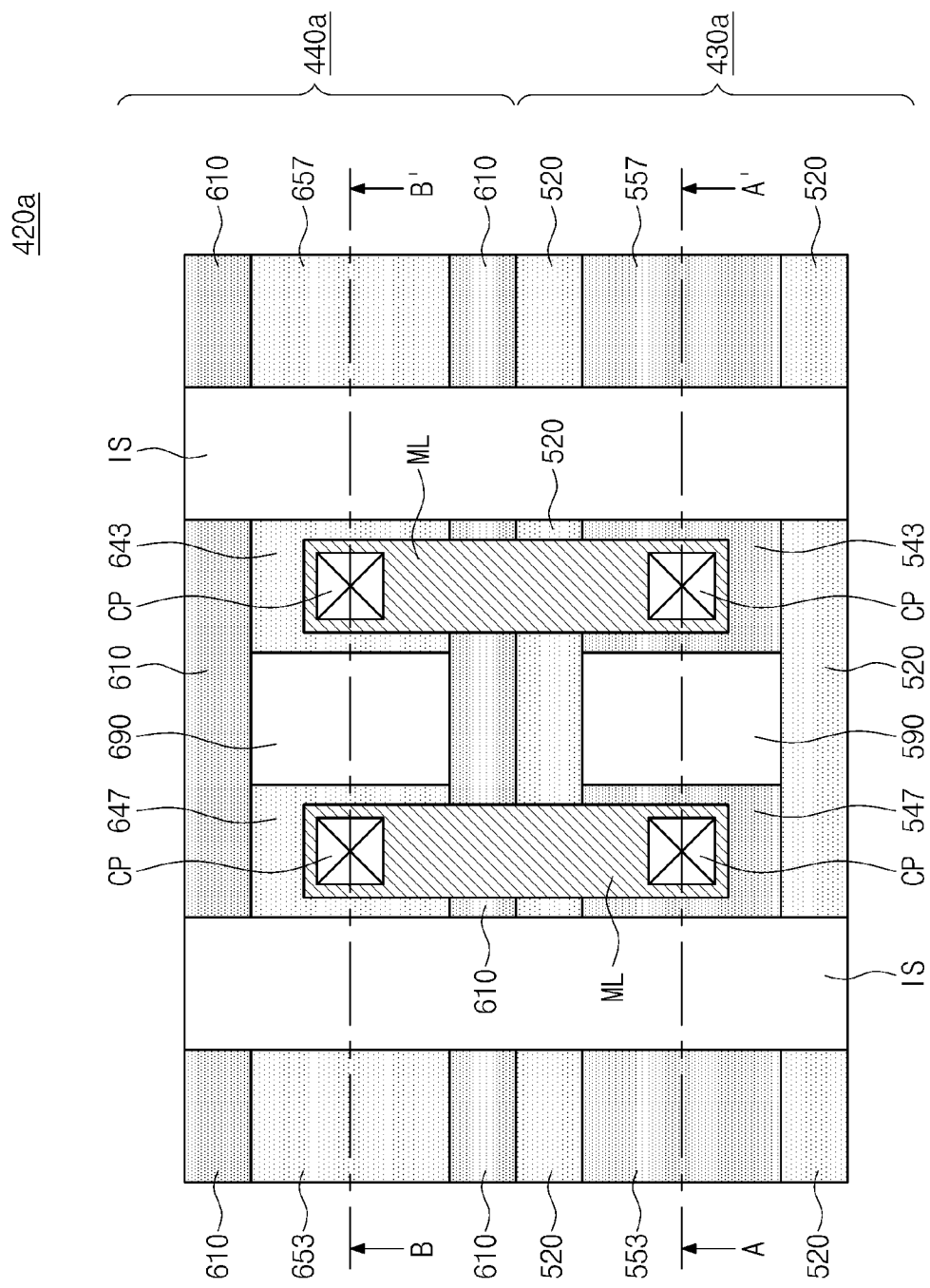
Figure 21:
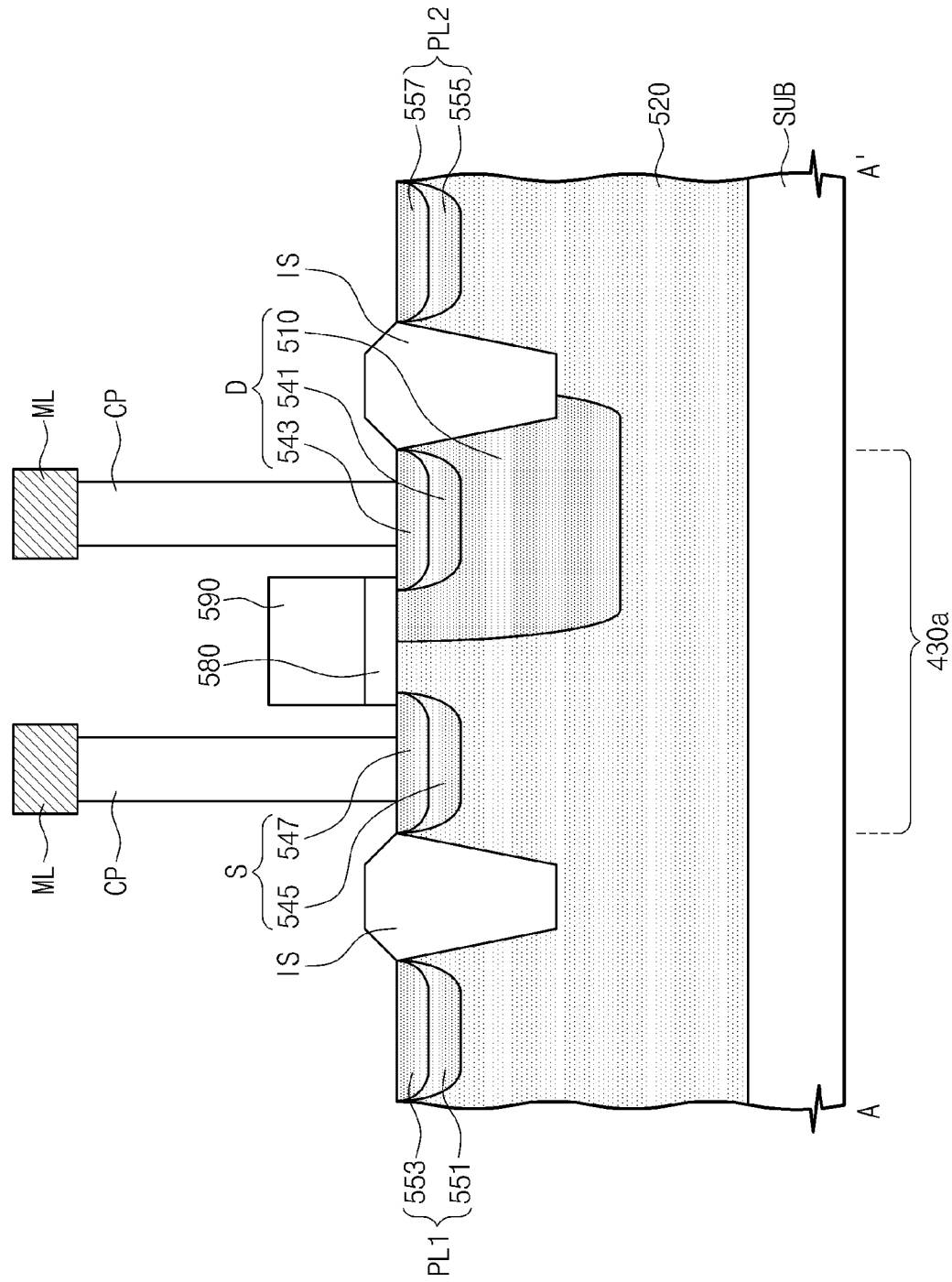
Figure 22:
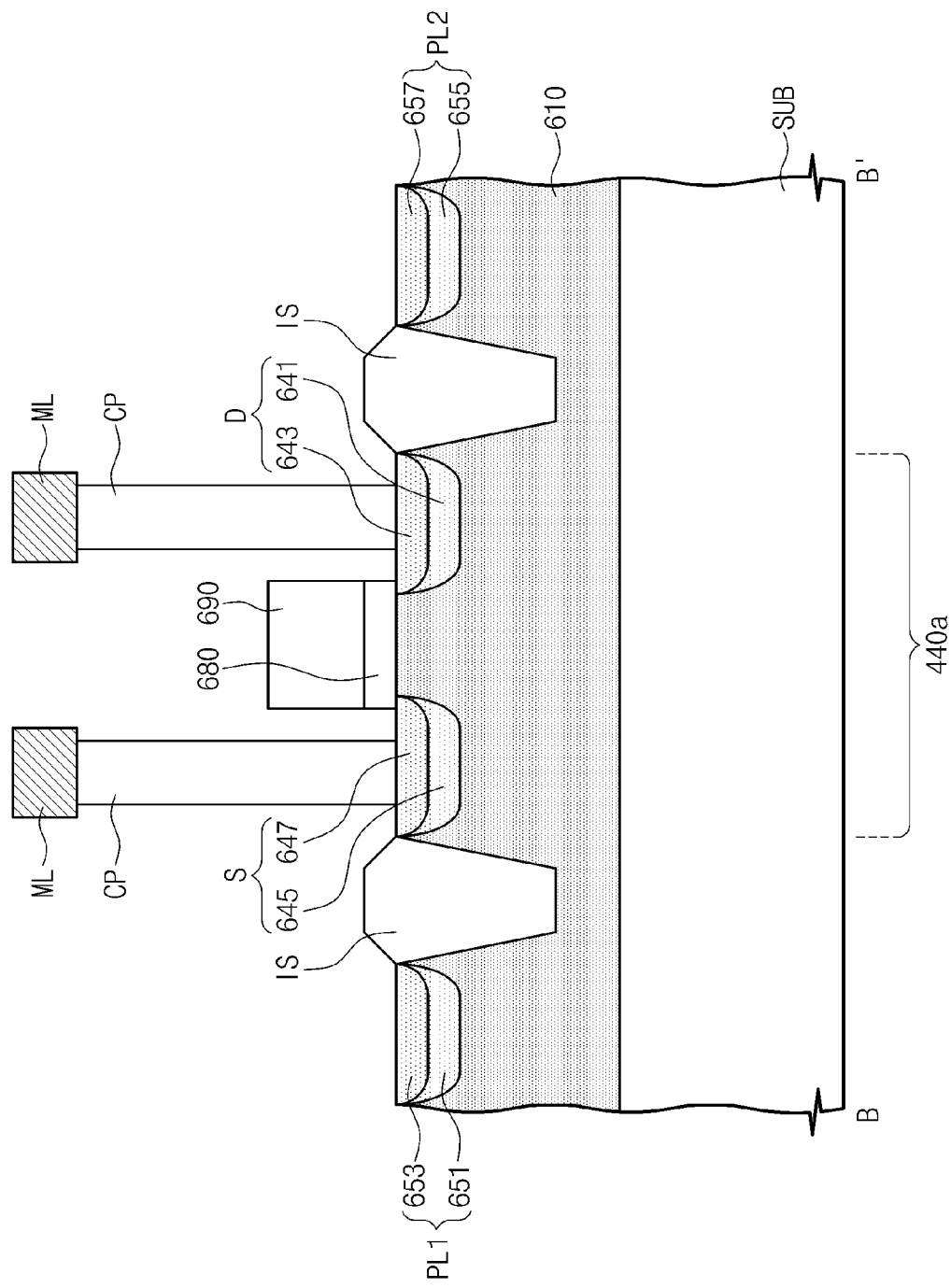

FIG. 20 is a plan view of a transmission gate 120 of FIG. 1 according to example embodiments of the inventive concepts. FIGS. 21 and 22 are sectional views taken along line A-A' and line B-B' of FIG. 20, respectively. Referring to FIGS. 20-22, compared to the transmission gate 420, the transmission gate 420a according example embodiments of the inventive concepts may include a second pickup layer PL2. The second pickup layer PL2 may be provided to each of a region corresponding to the NMOS transistor 430a and a region corresponding to the PMOS transistor 440a of the transmission gate 420a.

In the NMOS transistor 430a, from the source S, the gate structures 580 and 590, the drain D, the device isolation layer IS and the second pickup layer PL2 may be sequentially disposed. The second pickup layer PL2 may have the same structure as the first pickup layer PL1, the first junction regions 541 and 543 of the drain D, and/or the second junction regions 545 and 547 of the source S. The second pickup layer PL2 may be of the same conductive type as the first pickup layer PL1, the first junction regions 541 and 543 of the drain D, and/or the second junction regions 545 and 547 of the source S.

For example, the second pickup layer PL2 may include a high concentration junction region 557 and a low concentration junction region 555 below the high concentration junction region 557. The second pickup layer PL2 may include a junction region 557 of a single layer. The second pick up layer PL2 may be formed simultaneously when the first junction regions 541 and 543 of the drain D, the second junction regions 545 and 547 of the source S, and/or the first pickup layer PL1 of the NMOS transistor 430a are formed. A ground voltage Vss may be applied to the second pickup layer PL2.

The drain D, the P-well 520, and the second pickup layers 555 and 557 of the NMOS transistor 430a may form an NPN junction. Even when the source S of the NMOS transistor 430a floats, ESD applied to the drain D may be discharged through a BJT including the drain D, the P-well 520, and the first pickup layer PL1, and through a BJT including the drain D, the P-well 520, and the second pickup layer PL2.

Similarly to the second pickup layer PL2 in a region of the NMOS transistor 430a, the second pickup layer PL2 may be in a region of the PMOS transistor 440a. The second pickup layer PL2 of the PMOS transistor 440a may have the same structure and conductive type as the first pickup layer PL1, the third junction regions 641 and 643 of the drain D, and/or fourth junction regions 645 and 647 of the source S of the PMOS transistor 440a. A power voltage VDD may be applied to the second pickup layer PL2 of the PMOS transistor. The second pickup layer PL2 of the PMOS transistor 440a may be formed simultaneously when the first pickup layer PL1, the third junction regions 641 and 643 of the drain D, and the fourth junction regions 645 and 647 of the source S of the PMOS transistor 440a are formed. The PMOS transistor 440a may have the same structure as but be of a different type than the NMOS transistor 430a.

In relation to the transmission gate 420a, the PMOS transistor 440a may be the PMOS transistor 140 described with reference to FIGS. 1-15. The PMOS transistor 140 and the NMOS transistor 430a without the first pickup layer PL1 and the second pickup layer PL2 may form a transmission gate 420. In relation to the transmission gate 420a, the PMOS transistor 440a may be the PMOS transistor 440 described with reference to FIGS. 16-18. The PMOS transistor 440a and the NMOS transistor 430a with the first pickup layer PL1 and without the second pickup layer PL2 may form a transmission gate 420. A PMOS transistor (not shown) and the NMOS transistor 430a without the first pickup layer PL1 and with the second pickup layer PL2 may form a transmission gate 420.

Figure 23:
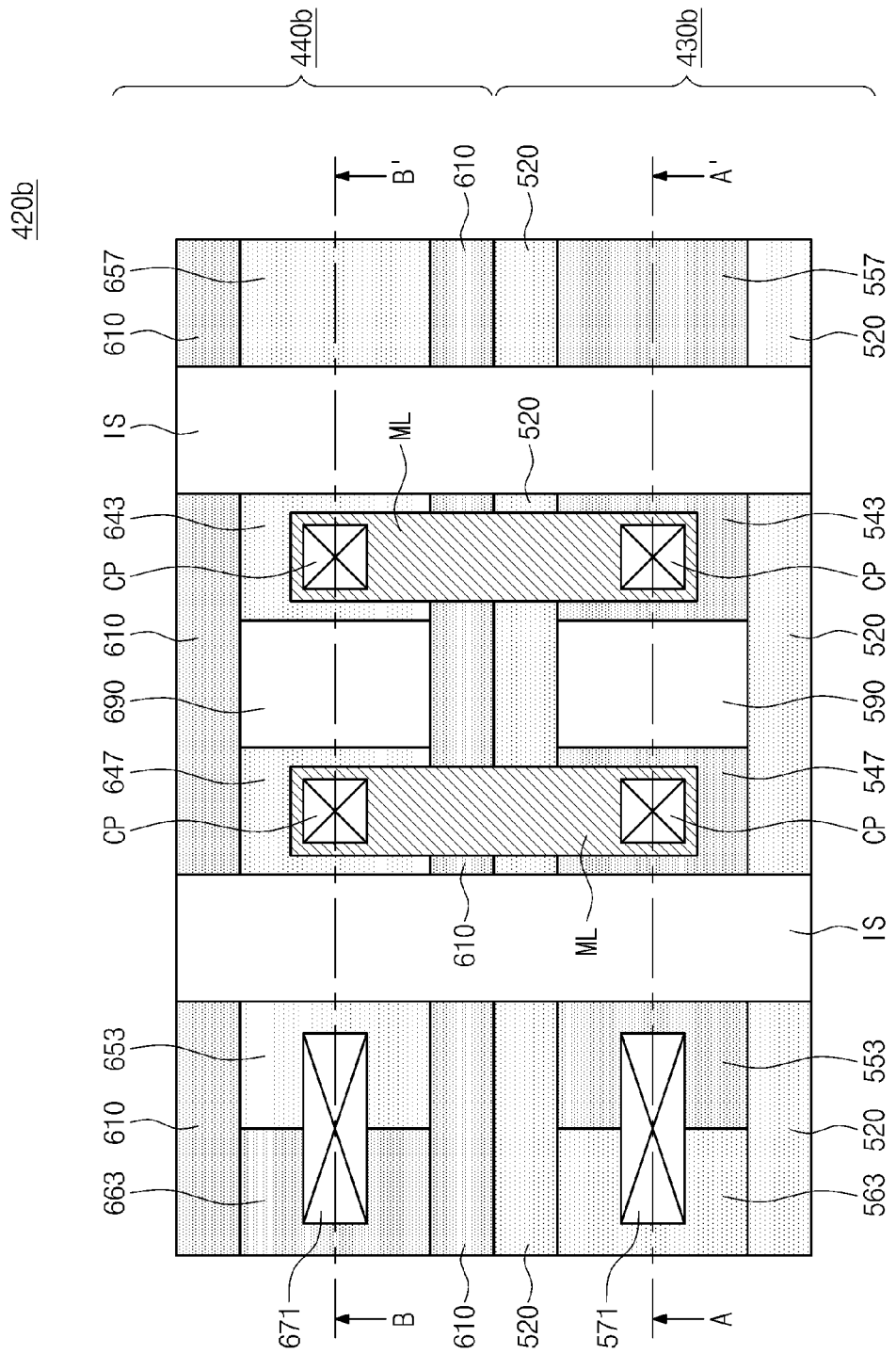
Figure 24:
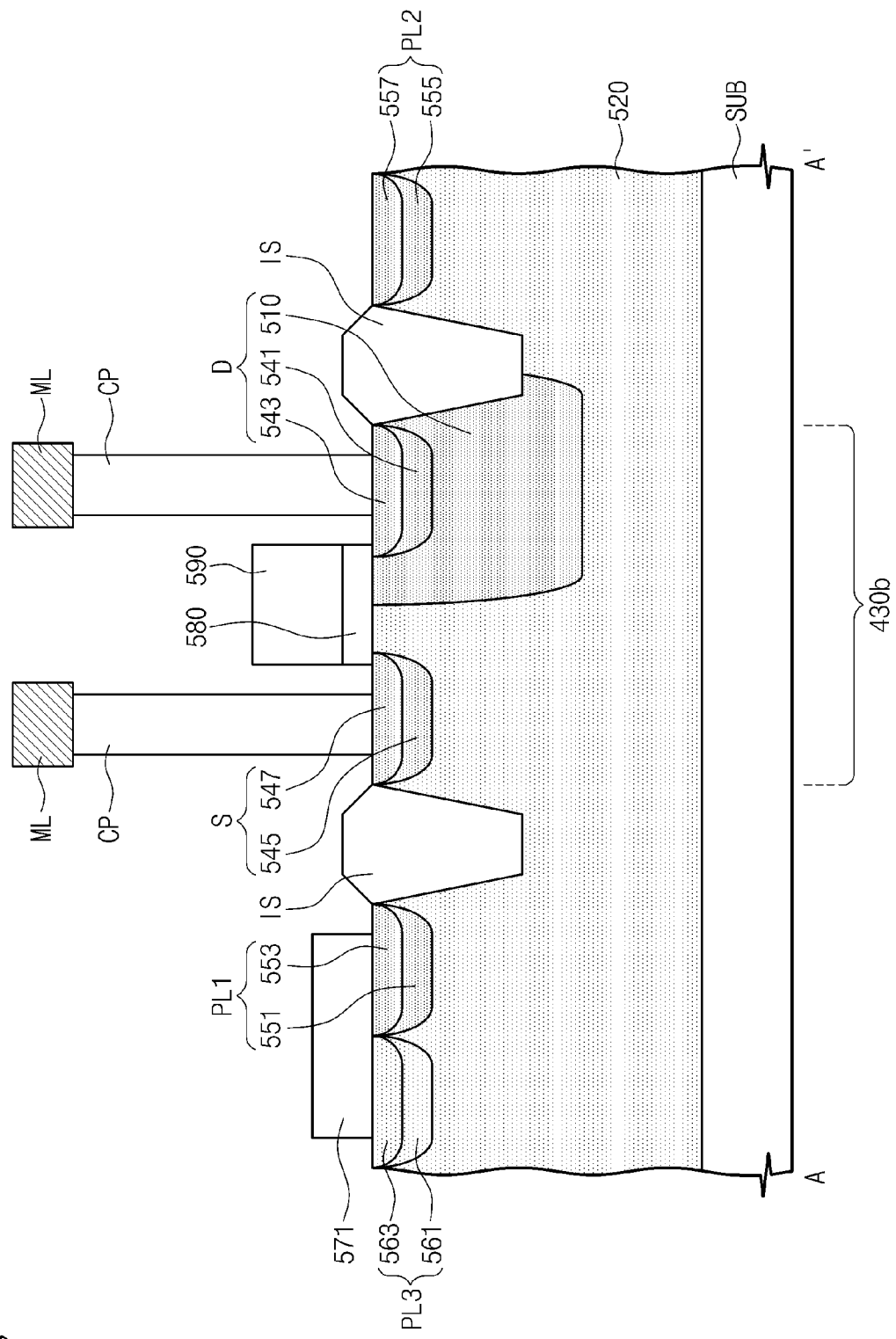
Figure 25:
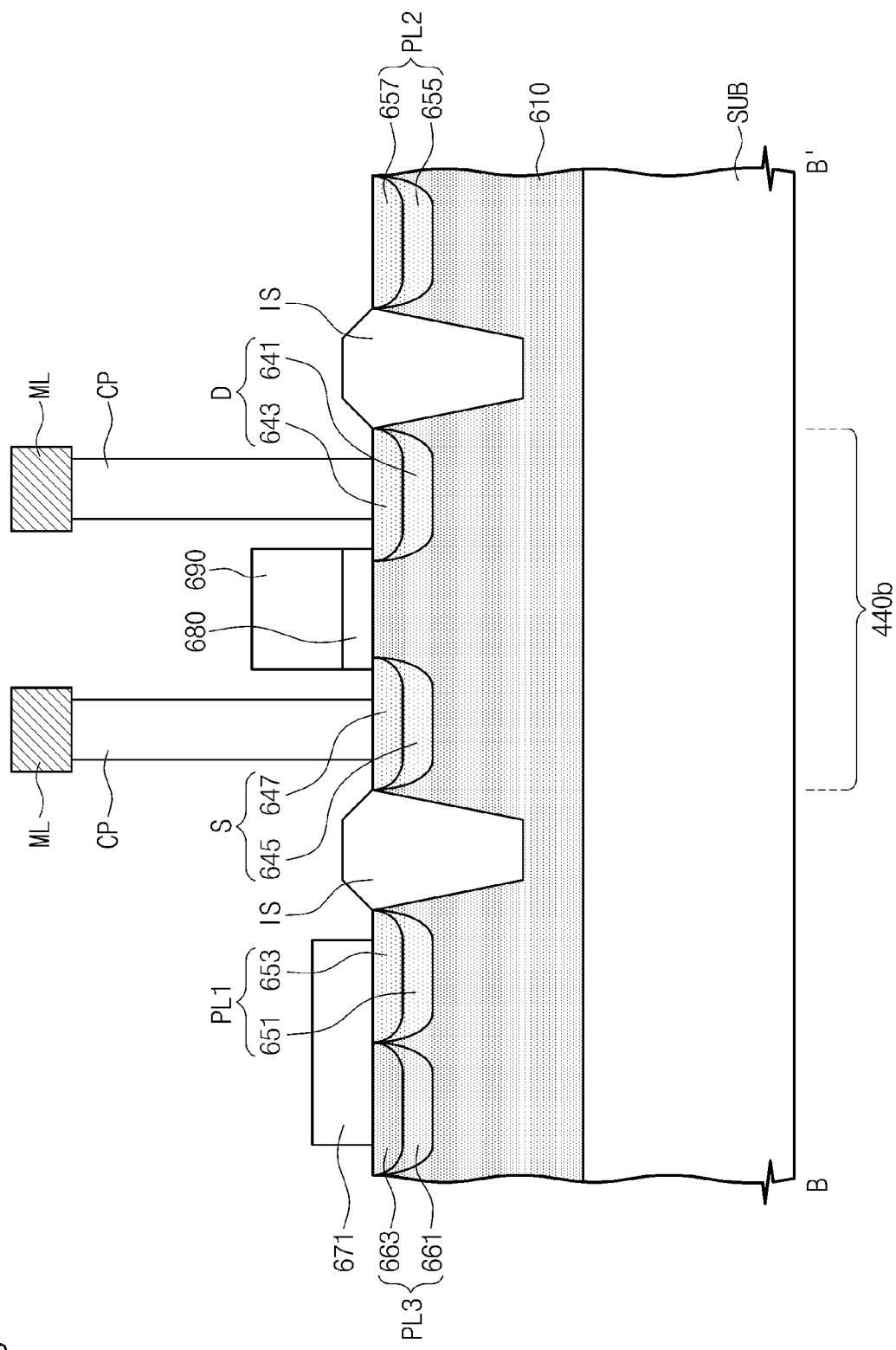

FIG. 23 is a plan view of the transmission gate 120 of FIG. 1 according to example embodiments of the inventive concepts. FIGS. 24 and 25 are cross-sectional views taken along line A-A' and line B-B' of FIG. 23, respectively. Referring to FIGS. 23-25, a transmission gate 420b may include third pickup layers PL3. The third pickup layers PL3 may be in each of a region of an NMOS transistor 430b and a region of a PMOS transistor 440b. From the drain D of the NMOS transistor 430b, the gate structures 580 and 590, the source S, the device isolation layer IS, the first pickup layer PL1, and the third pickup layer PL3 of the NMOS transistor 430b may be sequentially disposed.

The third pickup layer PL3 may include a high concentration junction region 563 and a low concentration junction region 561 below the high concentration junction region 563. The third pickup layer PL3 may have the same structure as but be of a different conductive type than the first pickup layer PL1, the second pickup layer PL2, the first junction regions 541 and 543 of the drain D, and/or the second junction regions 545 and 547 of the source S of the NMOS transistor 430b.

The third pickup layer PL3 may be formed simultaneously with the first pickup layer PL1, the second pickup layer PL2, the third junction regions 641 and 643 of the drain D, and the fourth junction regions 645 and 647 of the source S of the PMOS transistor 440b. The third pickup layer PL3 may be a component for supplying power to the P-well 520 of the NMOS transistor 430b. A ground voltage VSS may be applied to the third pickup layer PL3. The first pickup layer PL1 and the third pickup layer PL3 may be connected through a butting contact 571, and ground voltage VSS may be applied to the butting contact 571.

Similarly to the third pickup layer PL3 in a region of an NMOS transistor 430b, a third pickup layer PL3 may be provided in a region of the PMOS transistor 440b. The third pickup layer PL3 of the PMOS transistor 440b may have the same structure as but be of a different conductive type than the first pickup layer PL1, the second pickup layer PL2, the third contact regions 641 and 643 of the drain D, and/or the fourth contact regions 645 and 647 of the source S of the PMOS transistor 440b. The third pickup layer PL3 of the PMOS transistor 440b may be formed simultaneously when the first pickup layer PL1, the second pickup layer PL2, the first junction regions 541 and 543 of the drain D, and the second junction regions 545 and 547 of the source S of the NMOS transistor 430b.

The third pickup layer PL3 may be a component for supplying power to the N-well 610 of the PMOS transistor 440b. A power voltage VDD may be applied to the third pickup layer PL3. The first pickup layer PL1 and the third pickup layer PL3 may be connected through a butting contact 671, and power voltage VDD may be applied to the butting contact 671. The PMOS transistor 440b may have the same structure but be of the opposite conductive type to the NMOS transistor 430b. In relation to the transmission gate 420b, the PMOS transistor 440b may be diversely modified and applied. For example, the PMOS transistor 440b and the NMOS transistor 430a with at least one of the first to third pickup layers PL1 to PL3 may be a transmission gate 420b.

Figure 26:
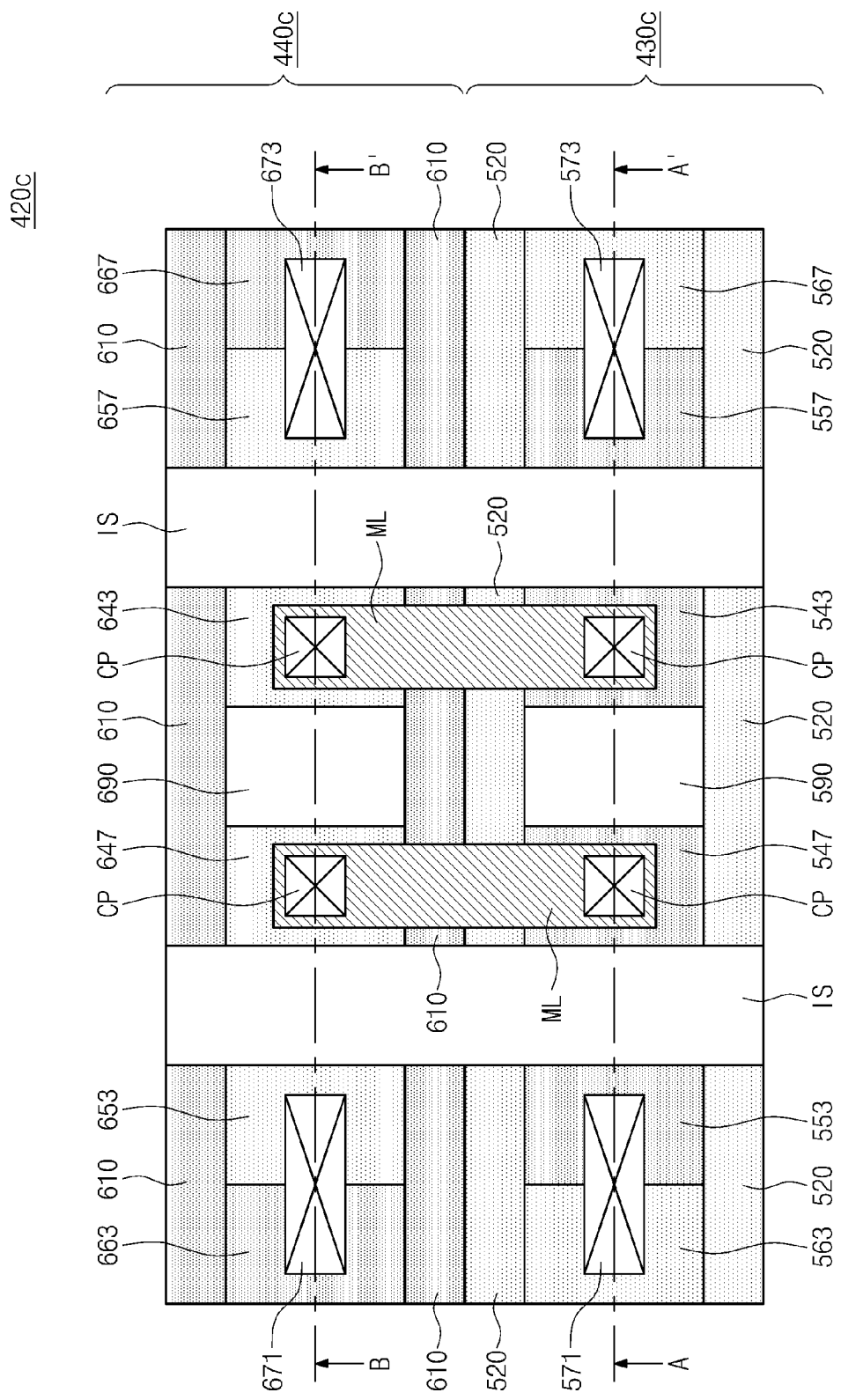
Figure 27:
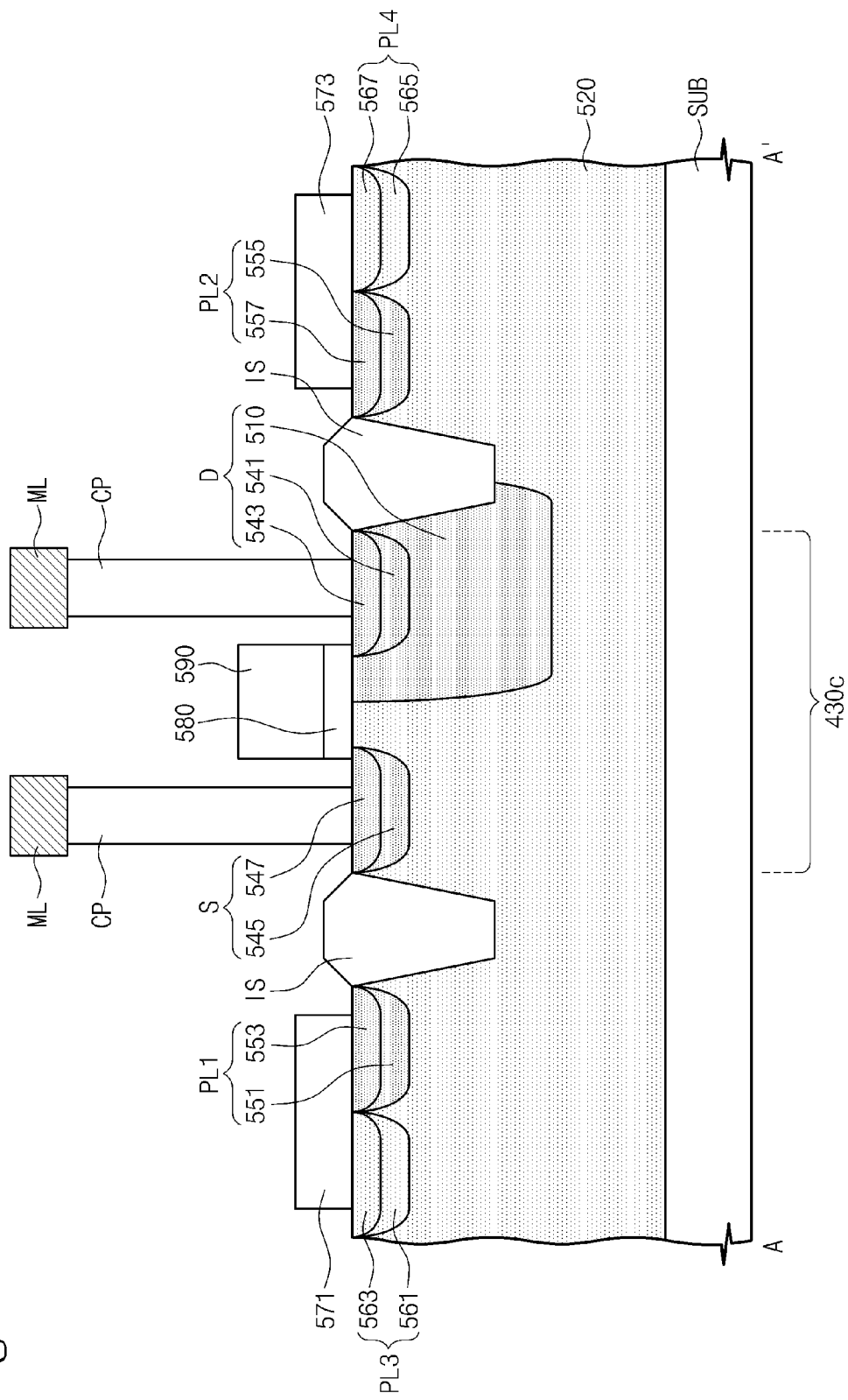
Figure 28:
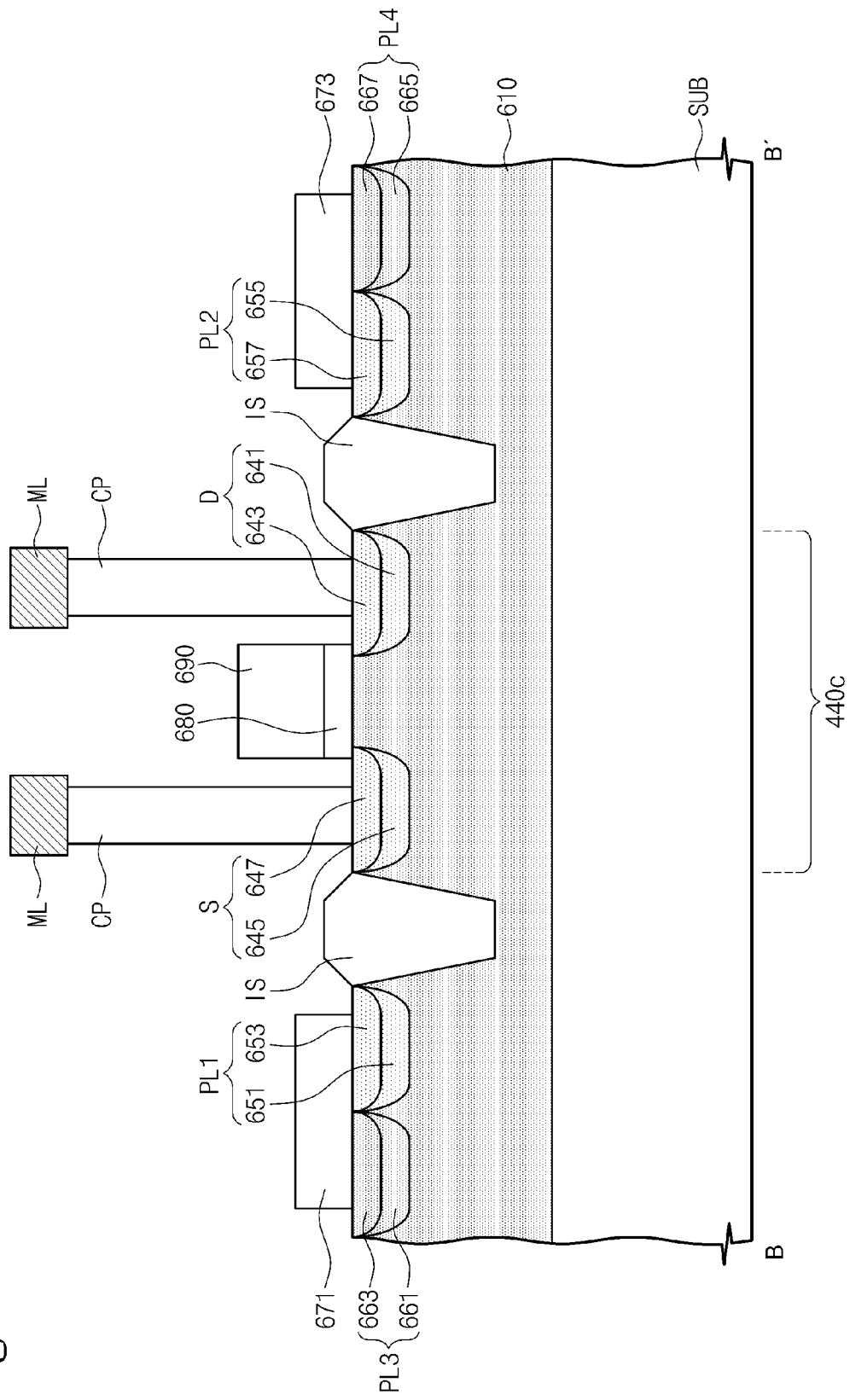

FIG. 26 is a plan view of a transmission gate 120 of FIG. 1 according to example embodiments of the inventive concepts. FIGS. 27 and 28 are cross-sectional views taken along line A-A' and line B-B' of FIG. 16, respectively. Referring to FIGS. 26-28, a transmission gate 420c may include a fourth pickup layer PL4. The fourth pickup layer PL4 may be provided in each of a region of the NMOS transistor 430c and a region of the PMOS transistor 440c. From the source S of the NMOS transistor 430c, the gate structures 580 and 590, the drain D, the device isolation layer IS, the second pickup layer PL2, and the fourth pickup layer PL4 of the NMOS transistor 430c may be sequentially disposed.

The fourth pickup layer PL4 may include a high concentration junction region 567 and a low concentration junction region 565 below the high concentration junction region 567. The fourth pickup layer PL4 may have the same structure but be of a different conductive type than the first pickup layer PL1, the second pickup layer PL2, the first junction regions 541 and 543 of the drain D, and/or the second junction regions 545 and 547 of the source S of the NMOS transistor 430c. The fourth pickup layer PL4 may be formed simultaneously when the first pickup layer PL1, the second pickup layer PL2, the third junction regions 641 and 643 of the drain D, and/or the fourth junction regions 645 and 647 of the source S of the PMOS transistor 440c.

The fourth pickup layer PL4 may be a component for supplying power to the P-well 520 of the NMOS transistor 430c. A ground voltage VSS may be applied to the fourth pickup layer PL4. The second pickup layer PL2 and the fourth pickup layer PL4 may be connected through a butting contact 573, and a ground voltage VSS may be applied to the butting contact 573.

Similarly to the fourth pickup layer PL4 provided in a region of the NMOS transistor 430c, the fourth pickup layer PL4 may be provided in a region of the PMOS transistor 440c. The fourth pickup layer PL4 of the PMOS transistor 440c may have the same structure but be of a different conductive type than the first pickup layer PL1, the second pickup layer PL2, the third contact regions 641 and 643 of the drain D, or the fourth contact regions 645 and 647 of the source S of the PMOS transistor 440c. The fourth pickup layer PL4 of the PMOS transistor 440c may be formed simultaneously when the first pickup layer PL1, the second pickup layer PL2, the first junction regions 541 and 543 of the drain D, or the second junction regions 545 and 547 of the source S of the NMOS transistor 430c.

The fourth pickup layer PL4 may be a component for supplying power to the N-well 610 of the PMOS transistor 440c. A power voltage VDD may be applied to the fourth pickup layer PL4. The second pickup layer PL2 and the fourth pickup layer PL4 may be connected through a butting contact 673, and power voltage VDD may be applied to the butting contact 673. The PMOS transistor 440c may have the same structure as but be of the opposite conductive type to the NMOS transistor 430c. In relation to the transmission gate 420c, the NMOS transistor 430c and the PMOS transistor 440c may be diversely modified. For example, an NMOS transistor with at least one of the first to fourth pickup layers PL1 to PL4 and a PMOS transistor with at least one of the first to fourth pickup layers PL1 to PL4 may be included in a transmission gate 420c.

Figure 29:
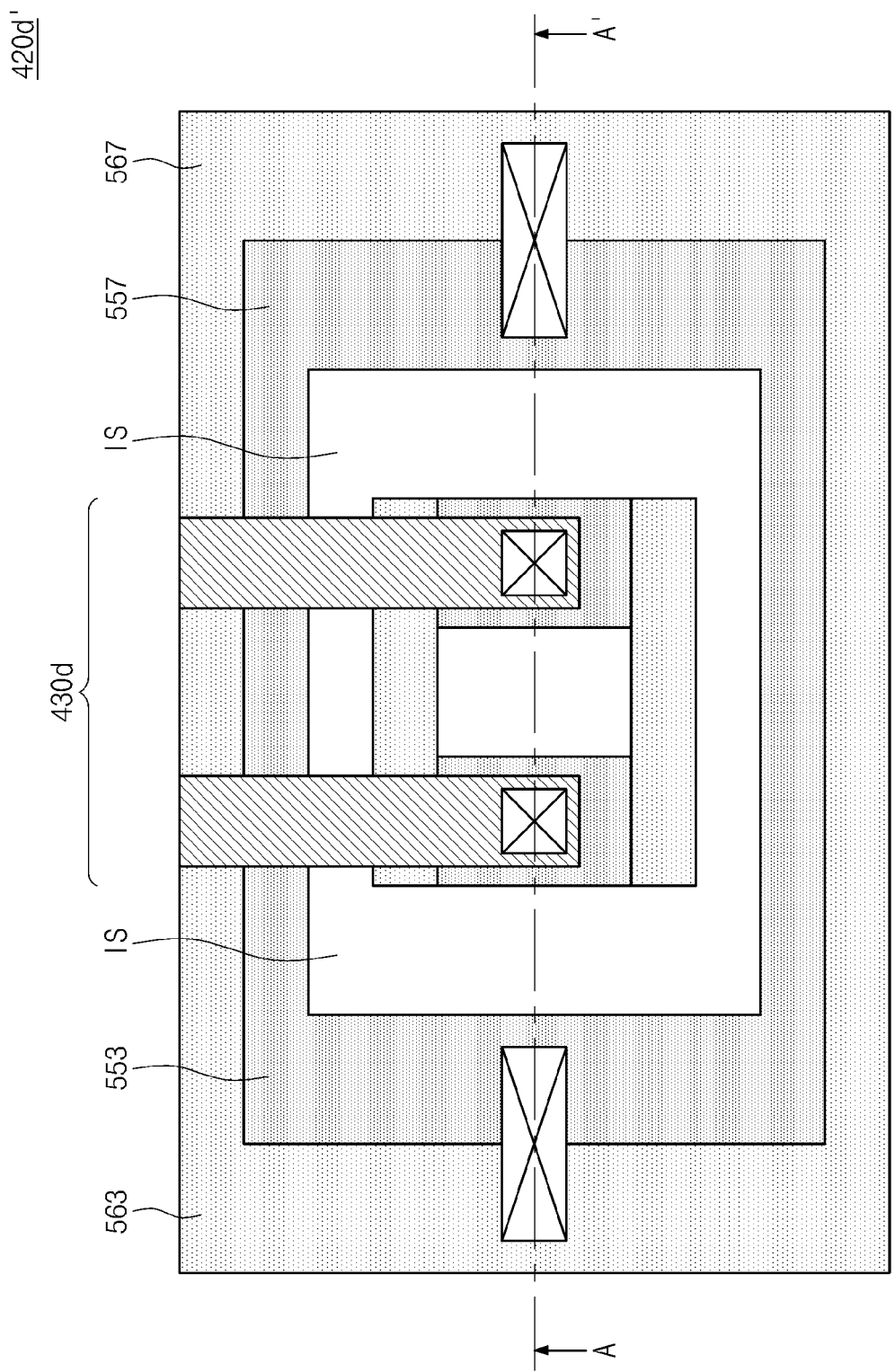
Figure 30:
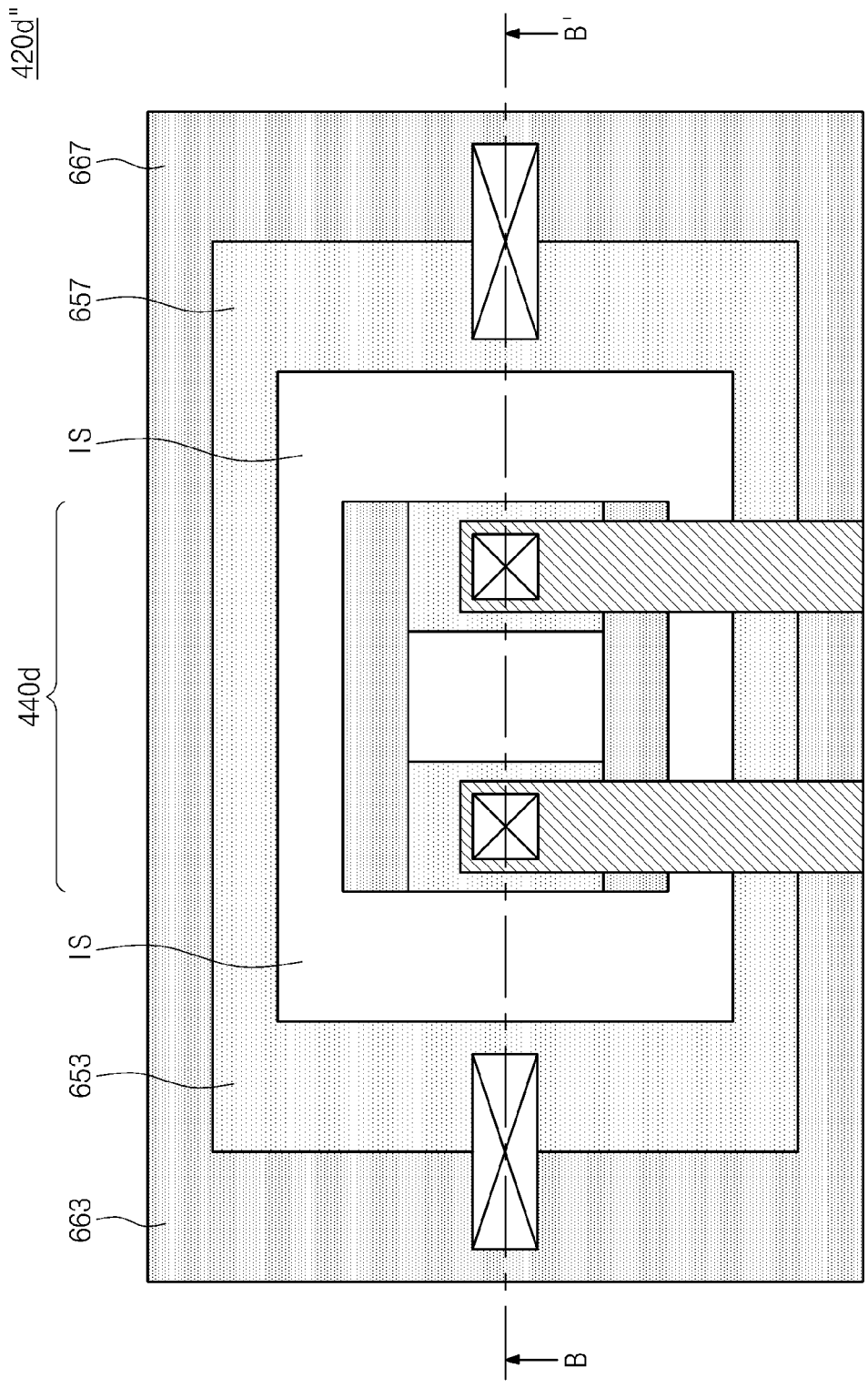

FIGS. 29 and 30 are plan views of a transmission gate 120 of FIG. 1 according to example embodiments of the inventive concepts. FIG. 29 illustrates an NMOS region 420d' of a transmission gate. FIG. 30 illustrates a PMOS region 420d" of a transmission gate. The sectional view taken along line A-A' is identical to FIG. 27 and the sectional view taken along line B-B' is identical to FIG. 28. According to example embodiments of the inventive concepts, the device isolation layer IS may extend to surround the NMOS transistor 430d, thereby forming one ring (e.g., a rectangular ring) in the NMOS region 420d' of the transmission gate.

For example, the device isolation layer IS may have a guard ring structure. In the NMOS region 420d' of the transmission gate, the first pickup layer PL1 and the second pickup layer PL2 may extend to surround the device isolation layer IS, and may be a ring (e.g., a rectangular ring). For example, the first pickup layer PL1 and the second pickup layer PL2 may have a guard ring structure. In the NMOS region 420d' of the transmission gate, the third and fourth pickup layers PL3 and PL4 may extend to surround the first and second pickup layers PL1 and PL2, and may be one ring (e.g., a rectangular ring). For example, the third and fourth pickup layers PL3 and PL4 may be a guard ring.

Similarly to the NMOS region 420d', in the PMOS region 420" of the transmission gate, the device isolation layer IS may have a guard ring structure extending to surround the PMOS transistor 440d. In the PMOS region 420d" of the transmission gate, the first pickup layer PL1 and the second pickup layer PL2 may have a guard ring structure extending to surround the device isolation layer IS. In the PMOS region 420d" of the transmission gate, the third and fourth pickup layers PL3 and PL4 may extend to surround the first and second pickup layers PL1 and PL2, and may be a guard ring.

Figure 31:
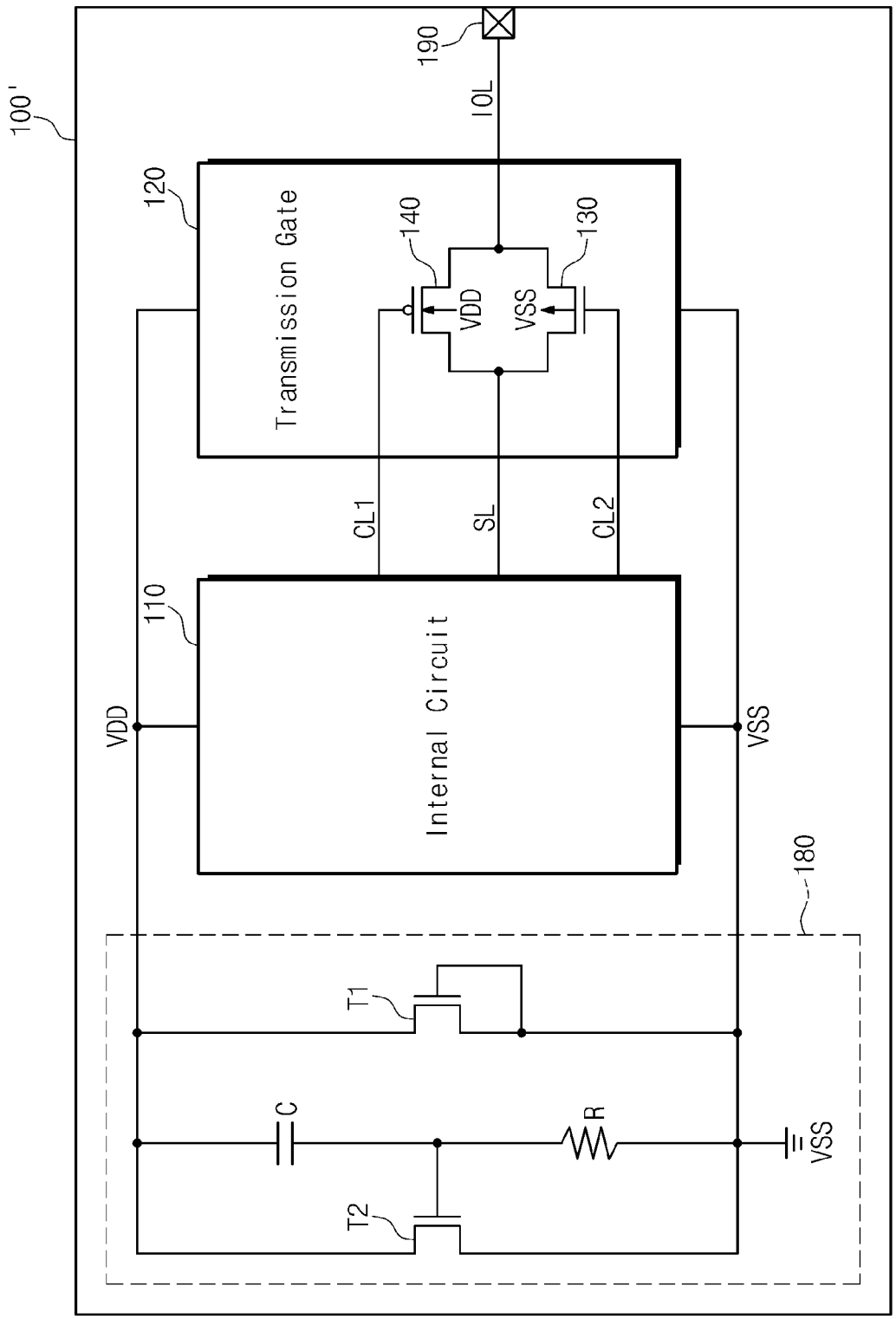

FIG. 31 is a block diagram illustrating example applications of an integrated circuit device 100 of FIG. 1. FIG. 31 illustrates an integrated circuit device 100' that may include the integrated circuit device 100 and a clamp circuit 180. The clamp circuit 180 may be connected between a power voltage VDD terminal and a ground voltage VSS terminal of the integrated circuit device 100. Because the ground voltage VSS and power voltage VDD are respectively supplied to a body of the NMOS transistor 130 and a body of the PMOS transistor 140, the clamp circuit 180 may be connected to the body of the NMOS transistor 130 and the body of the PMOS transistor 140.

The clamp circuit 180 may include a first transistor T1, a second transistor T2, a capacitor C, and a resistor R. A gate and a source of the first transistor T1 may be connected to VSS (e.g., a ground terminal). A drain of the first transistor T1 may be connected to a power terminal VDD. The first transistor T1 may operate as a gate grounded (GG) transistor between the power node and the ground node. The first transistor T1 may be configured to allow ESD delivered through the transmission gate 120 to be discharged between the power node and the ground node. As described with reference to FIGS. 2-15, the drain of the first transistor T1 may include a deep junction region. Strong snapback due to ESD may be prevented or reduced in the first transistor T1.

The source of the second transistor T2 may be connected to the ground node, and the drain may be connected to the power node. The gate of the second transistor T2 may be connected to the power node through the capacitor C, and may be connected to the ground node through the resistor R. The second transistor T2 may be a gate coupled (GC) transistor. The second transistor T2 may be configured to allow ESD delivered through the transmission gate 120 in addition to the capacitor C and the resister R to be discharged between the power node and the ground node. As described with reference to FIGS. 2-15, the drain of the second transistor T2 may further include a deep junction region. Strong snapback due to ESD may be prevented and/or reduced in the second transistor T2.

When ESD current is applied to the integrated circuit device 100', it may be discharged to the ground terminal or the power terminal through a transmission gate 120. For example, current may be discharged through the body and the first to fourth pickup layers PL1 to PL4 of the NMOS transistor 130, and through the body and the first to fourth pickup layers PL1 to PL4 of the PMOS transistor 140. ESD current may be discharged into the power node and the ground node. TA transmission gate 120 may be configured to operate as an ESD protection circuit. The clamp circuit 180 may discharge ESD current delivered from the transmission gate 120 between the power node and the ground node. Once the clamp circuit 180 is provided, an ESD protection function of the integrated circuit device 100' may be improved.

Figure 32:
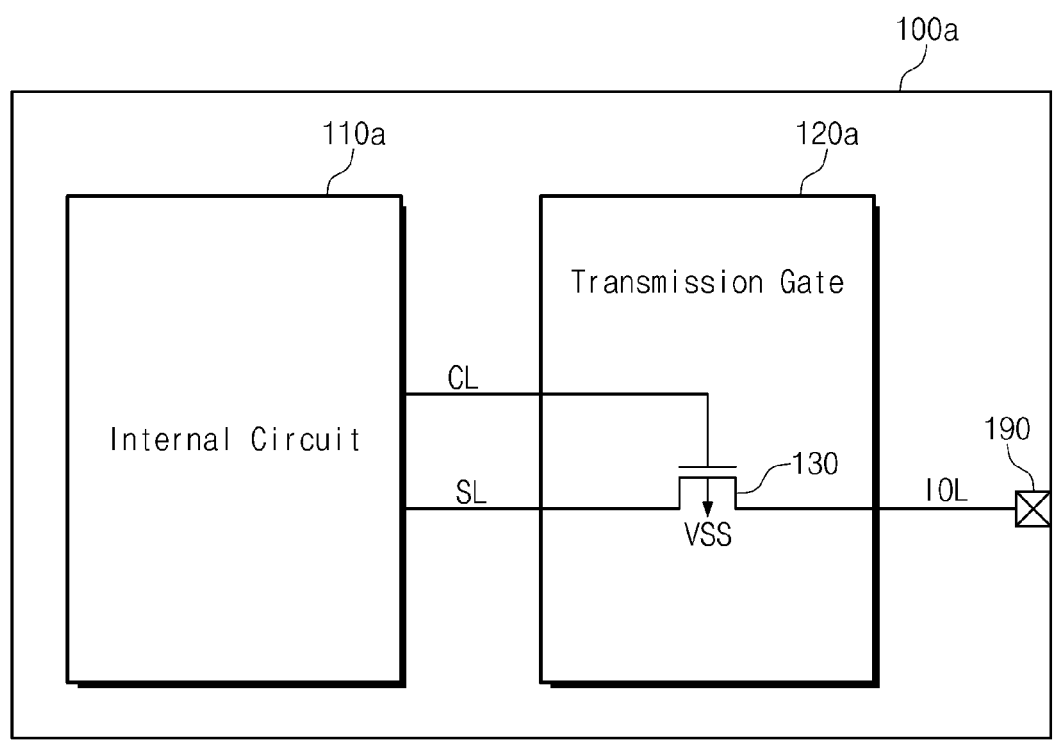

FIG. 32 is a block diagram illustrating examples of the integrated circuit device 100 of FIG. 1. Referring to FIG. 32, the integrated circuit device 100a may include an internal circuit 110a, a transmission gate 120a, and an input/output pad 190. The integrated circuit device 100a may have a similar structure to an internal circuit 110 of FIG. 1. The integrated circuit device 100a may include an internal circuit 110a to control the transmission gate 120a using one control line CL. The transmission gate 120a may be configured to electrically connect and disconnect the signal line SL with the input/output line IOL of the internal circuit 110a in response to a signal received through the control line CL. The transmission gate 120a may include an NMOS transistor 130. The gate of the NMOS transistor 130 may be connected to the control line CL. The source and drain of the NMOS transistor 130 may be connected to the signal line SL and the input/output line IOL.

The NMOS transistor 130 may have the same or similar configuration as described with reference to FIGS. 2-30. The NMOS transistor 130 may operate as a transmission gate and as an ESD protection circuit. Because an additional ESD protection circuit is not required an area of the integrated circuit device 100 may be reduced. Because strong snapback may be prevented and/or reduced during an ESD protection operation reliability of the integrated circuit device 100 may be improved.

Figure 33:
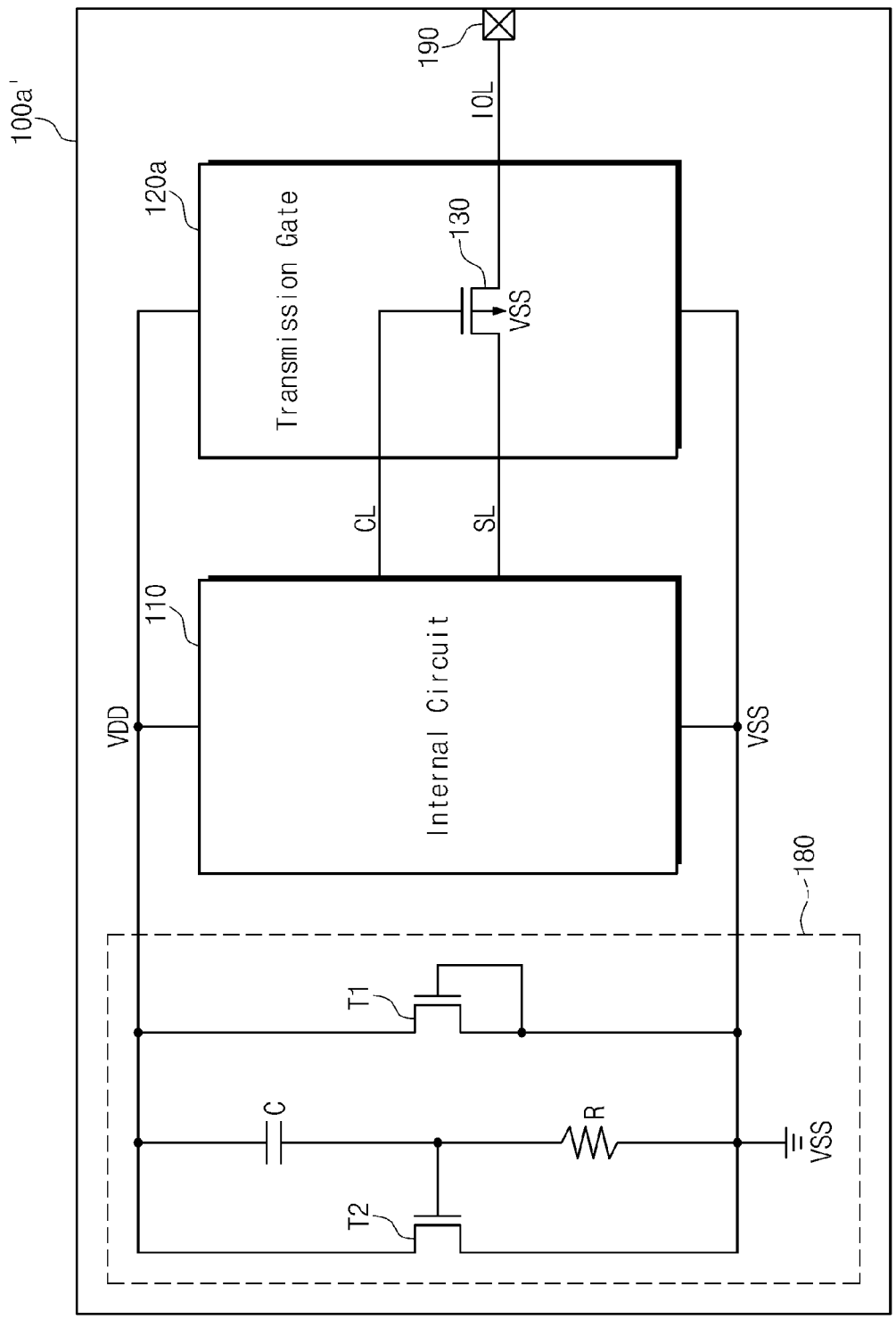

FIG. 33 is a block diagram illustrating example applications of an integrated circuit device 100a of FIG. 32. The integrated circuit device 100a' may include a clamp circuit 180. As described with reference to FIG. 31, the clamp circuit 180 may be configured to discharge ESD between the power node and the ground node. Once the clamp circuit 180 is included an ESD protection function of the integrated circuit device 100a' may be improved.

Figure 34:
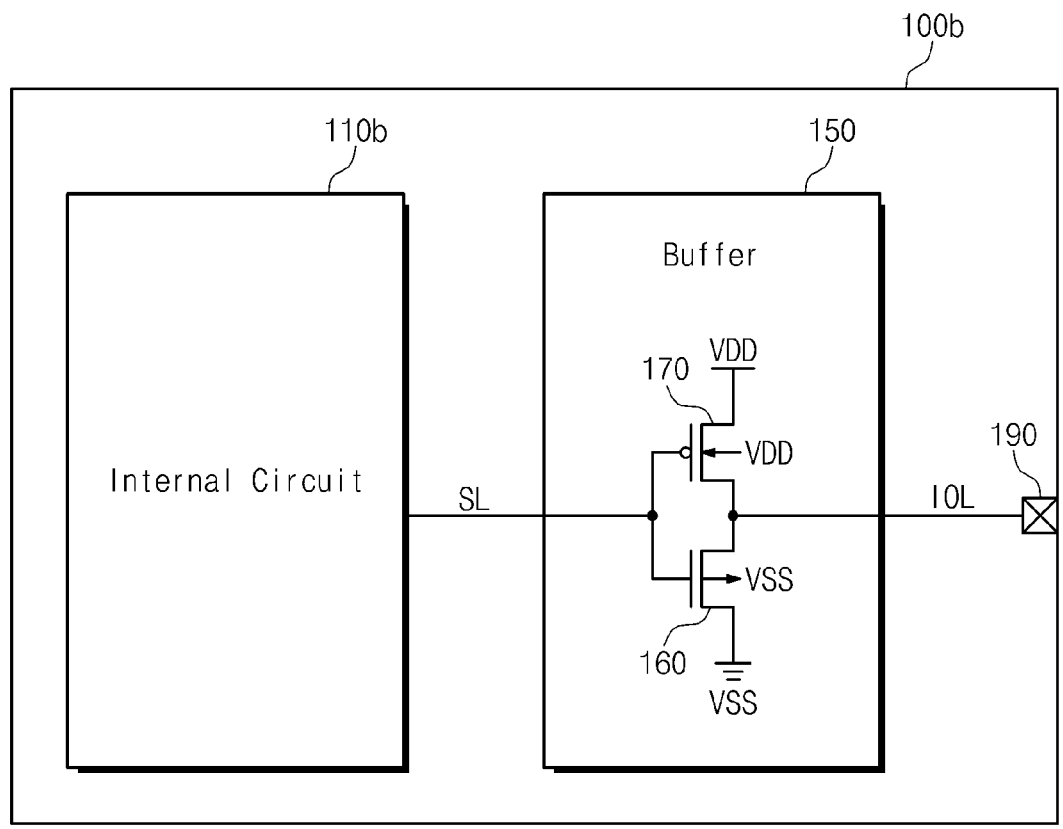

FIG. 34 is a block diagram illustrating examples of an integrated circuit device 100 of FIG. 1. Referring to FIG. 34, the integrated circuit device 100b may include an internal circuit 110b, a buffer 150 and an input/output pad 190. The internal circuit 110b may be connected to the buffer 150 through the signal line SL. The buffer 150 may be configured to temporarily store data transmitted between the internal circuit 110b and the input/output pad 190. The buffer 150 may be, for an example, an inverter. The buffer 150 may invert a signal received through the signal line SL and output it to the input/output line IOL.

The buffer 150 may include an NMOS transistor 160 and a PMOS transistor 170. Gates of the NMOS transistor 160 and the PMOS transistor 170 may be commonly connected to the signal line SL. The NMOS transistor 160 and the PMOS transistor 170 may be connected in series between the power voltage terminal and the ground terminal. A node between the NMOS transistor 160 and the PMOS transistor 170 may be connected to the input/output line IOL.

Figure 35:
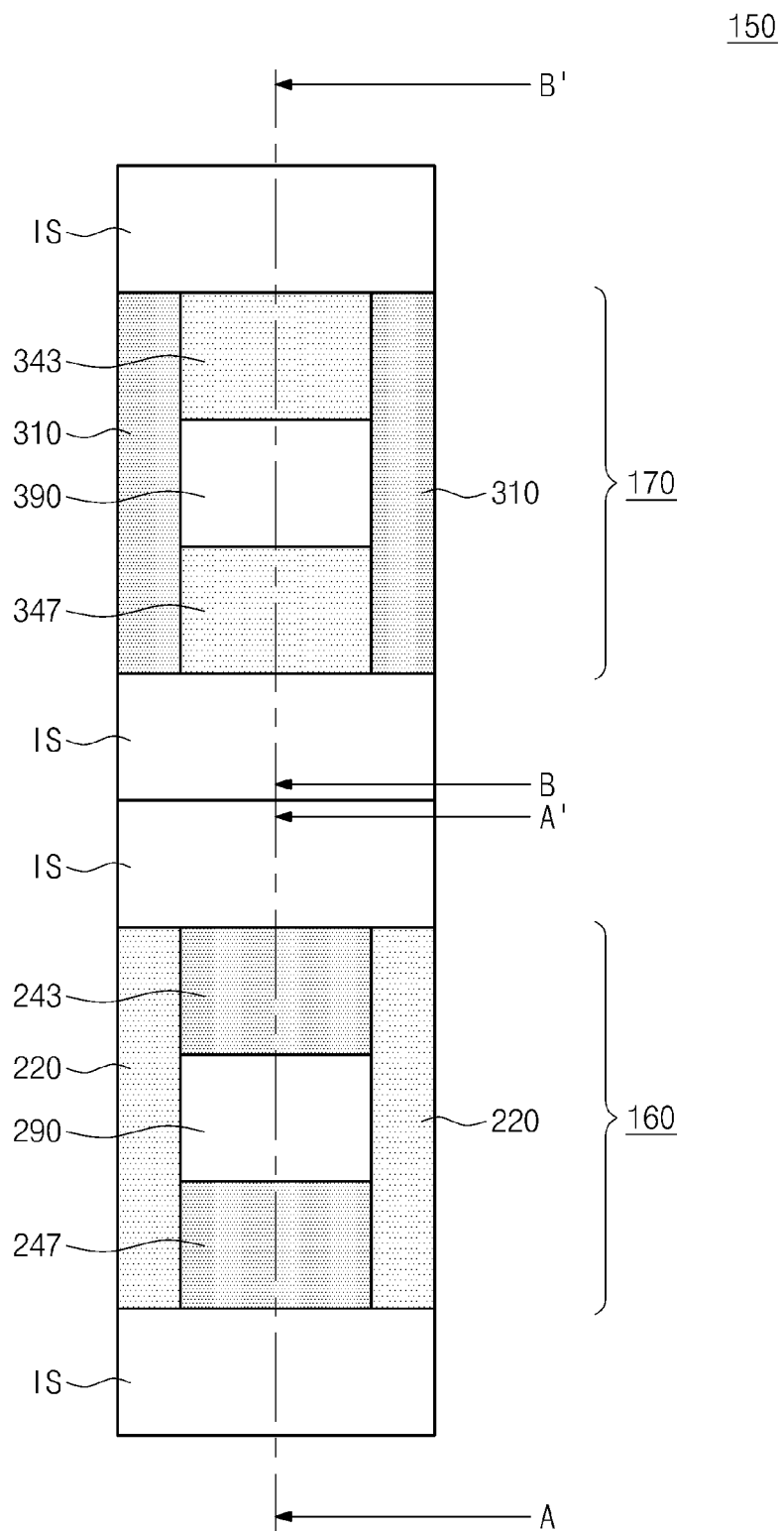

FIG. 35 is a plan view of a buffer 150 of FIG. 34. A sectional view taken along line A-A' of the buffer 150 may be similar to a sectional view taken along line A-A' of FIG. 3 and the sectional view taken along line B-B' may be similar to a sectional view taken along line B-B' of FIG. 4. Contact plugs CP and the metal lines ML may not be included. Referring to FIGS. 3 and 35, the P-well 220, the drain D, the source S, and the gate structures 280 and 290 may be part of the NMOS transistor 160. Referring to FIGS. 4 and 35, the N-well 310, the drain D, and the source S, and the gate structures 380 and 390 may be part of the PMOS transistor 170. As described with reference to FIGS. 1-30, the NMOS transistor 160 may include a deep junction region 210 and may include one or more of the first to fourth pickup layers PL1 to PL4.

The PMOS transistor 170 may include a deep junction region 210' and may include one or more of the first to fourth pickup layers PL1 to PL4. The PMOS transistor 170 may have the same configuration but an opposite conductive type as the NMOS transistor 160. The NMOS transistor 160 and the PMOS transistor 170 may operate as a buffer and as an ESD protection circuit. Because an additional ESD protection circuit is not required an area of the integrated circuit device 100b may be reduced. Because strong snapback may be prevented and/or reduced during an ESD event reliability of the integrated circuit device 100b may be improved.

Figure 36:
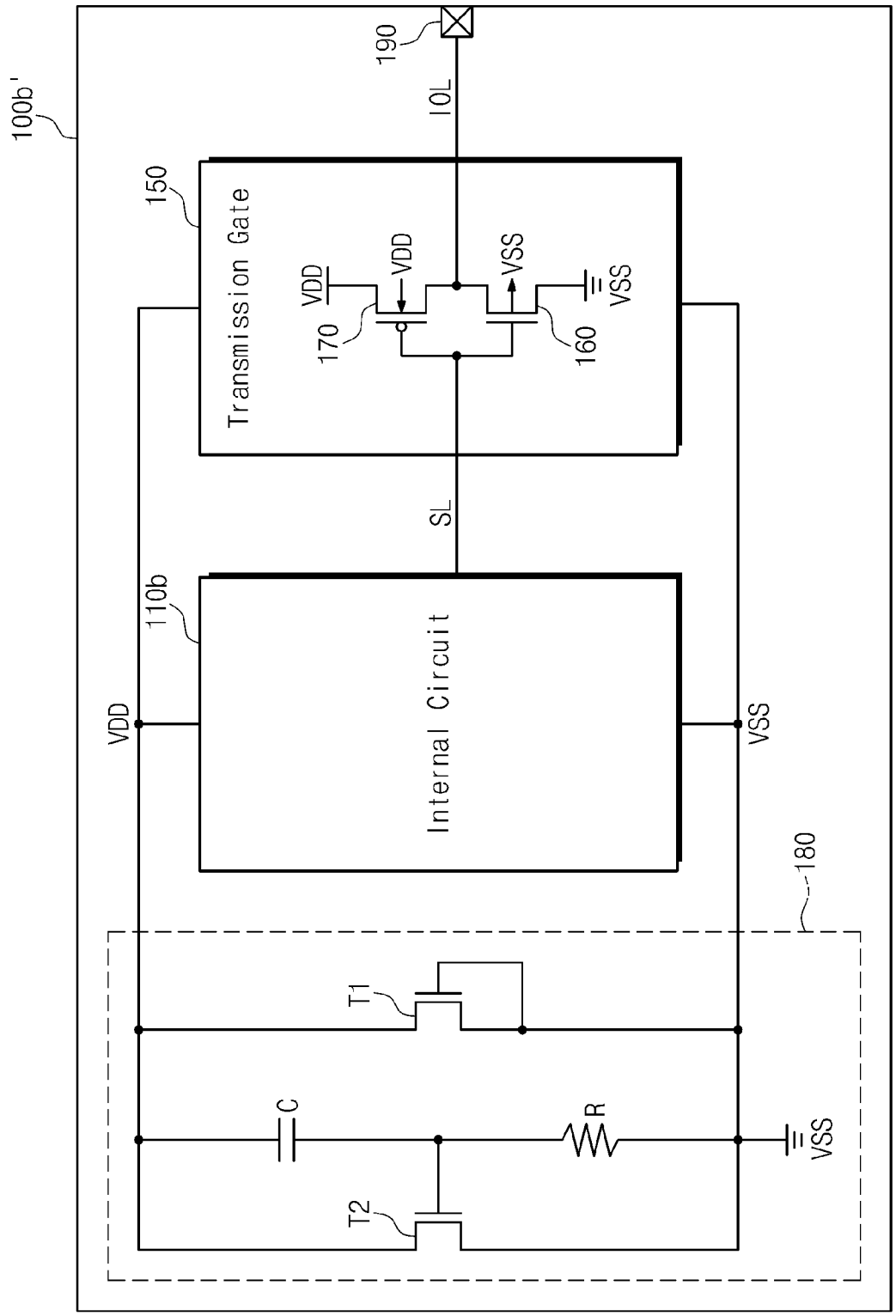

FIG. 36 is a block diagram illustrating example applications of an integrated circuit device 100b of FIG. 34. An integrated circuit device 100b' may include a clamp circuit 180. As described with reference to FIG. 31, the clamp circuit 180 may be configured to discharge ESD between the power node and the ground node. Once a clamp circuit 180 is included an ESD protection function of the integrated circuit device 100b' may be improved.

Figure 37:
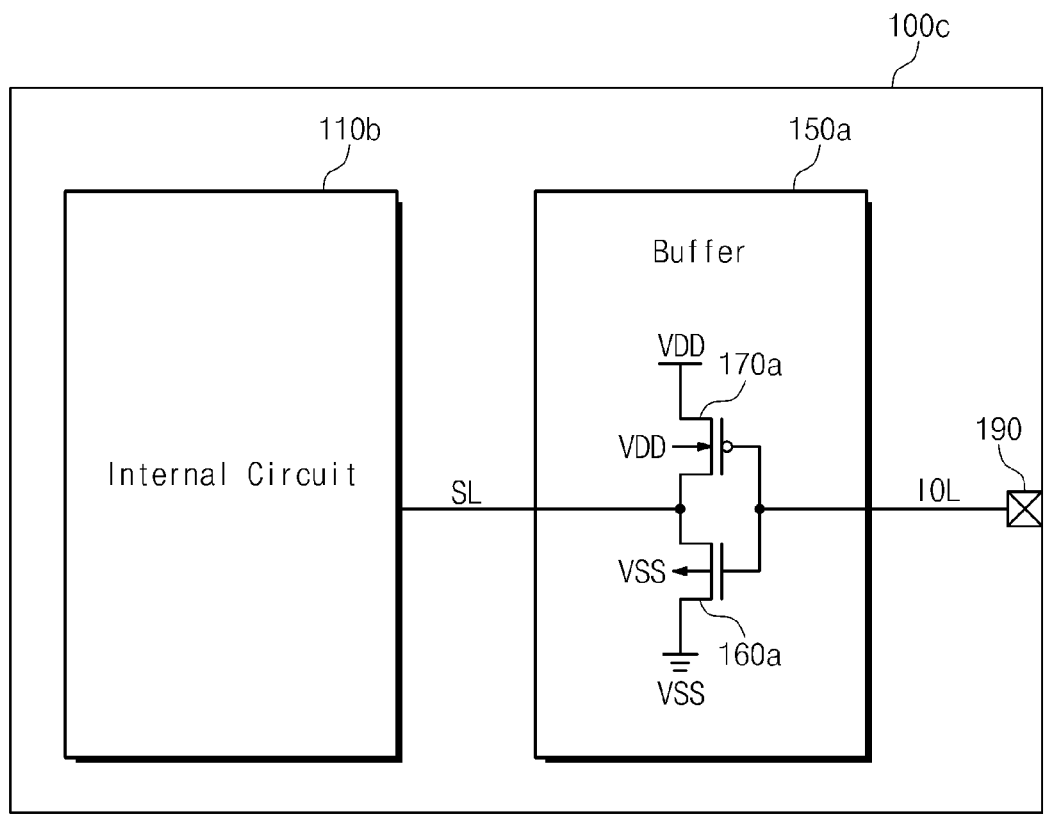

FIG. 37 is a block diagram illustrating examples of an integrated circuit device 100 of FIG. 1. Referring to FIG. 37, the integrated circuit device 100c may include an internal circuit 110b, a buffer 150a, and an input/output pad 190. The buffer 150a may invert a signal received through the input/output line IOL and output it to the signal line SL. The plan view of the buffer 150a may be identical to FIG. 35. Similarly to the description of FIGS. 34 and 35, the NMOS transistor 160a may include a deep junction region 210 and may include one or more of the first to fourth pickup layers PL1 to PL4. The PMOS transistor 170a may include a deep junction region 210' and may include one or more of the first to fourth pickup layers PL1 to PL4. The PMOS transistor 170a may have the same configuration as, but may be of a different conductive type, then the NMOS transistor 160a.

Figure 38:
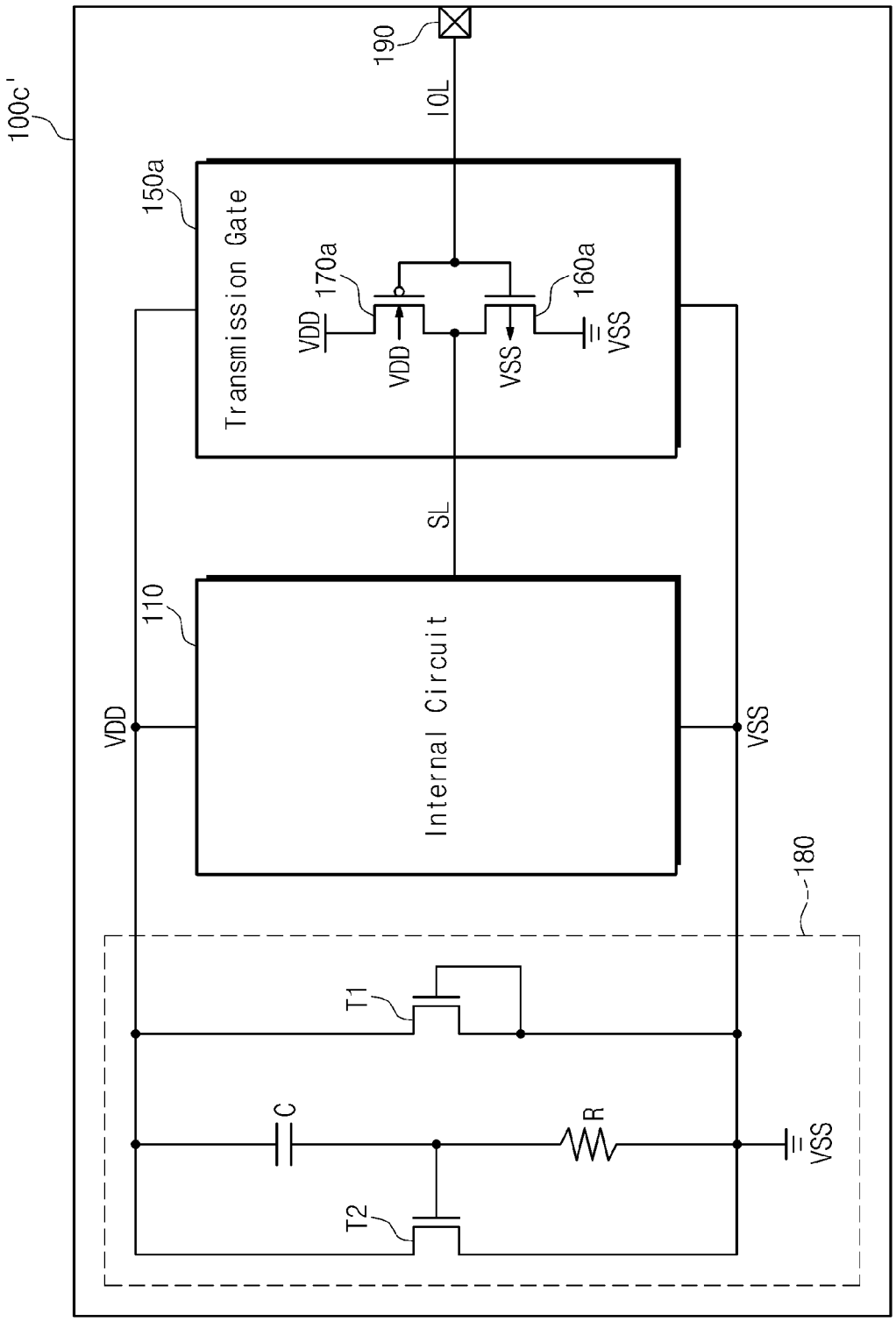

FIG. 38 is a block diagram illustrating examples of an integrated circuit device 100 of FIG. 1. The integrated circuit device 100c' may include a clamp circuit 180. As described with reference to FIG. 31, the clamp circuit 180 may be configured to discharge ESD between the power node and the ground node. Once the clamp circuit 180 is included an ESD protection function of the integrated circuit device 100c' may be improved.

Figure 39:
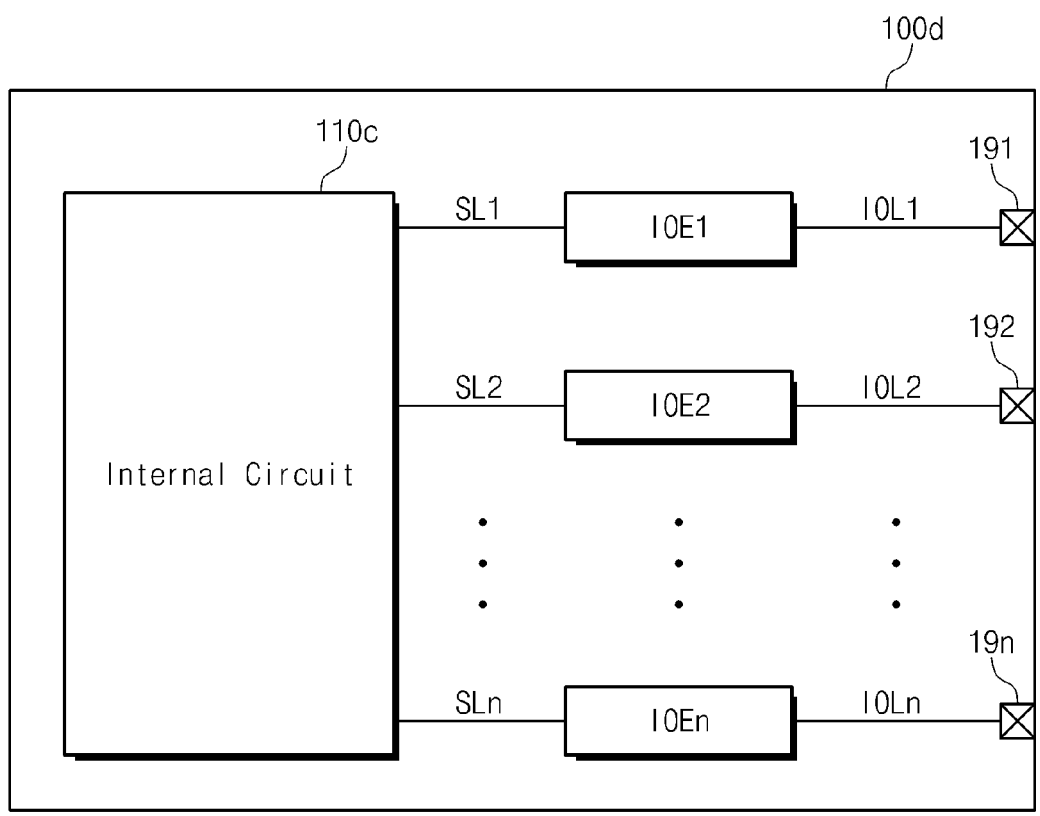

FIG. 39 is a block diagram illustrating examples of an integrated circuit device 100 of FIG. 1. Referring to FIG. 39, the integrated circuit device 100d may include an internal circuit 110c, a plurality of input/output devices IOE1 to IOEn, and a plurality of input/output pads 191 to 19n. Although illustrated to 19n, example embodiments may include more than 9 input/output devices and FIG. 39 is illustrative of example embodiments only. An internal circuit 110c may be connected to each of the plurality of input/output devices IOE1 to IOEn through a plurality of signal lines SL1 to SLn. The input/output pads 191 to 19n may be respectively connected to the plurality of input/output devices IOE1 to IOEn through the plurality of input/output lines IOL1 to IOLn.

Each input/output device may be one of the transmission gates described according to example embodiments. For example, one of the transmission gates 120 and 420 described with reference to FIGS. 1-30, the transmission gate 120a described with reference to FIG. 32, the buffer 150 described with reference to FIGS. 34 and 35, the buffer 150 described with reference to FIG. 36 and the buffer 150a described with reference to FIG. 37. Each input/output device may operate as an input/output device between the internal circuit 110c and the corresponding input/output pad, and as an ESD protection circuit. Because an additional ESD protection circuit is not required, an area of the integrated circuit device 100d may be reduced. Because strong snapback may be prevented and/or reduced during an ESD event reliability of the integrated circuit device 100d may be improved.

If each input/output device is a transmission gate 120, 420, or 120a, a control line controlling the transmission gate may be provided. As described with reference to FIGS. 31, 33, 36, and 38, the clamp circuit 180 may be provided to the integrated circuit device 100d. An ESD protection function of the integrated circuit device 100d may be improved. In order to improve an ESD protection function of the integrated circuit device 100, 100a, 100b, 100c, or 100d, an additional ESD protection circuit in addition to an input/output device may be included. According to an ESD protection capacity of an input/output device and an ESD protection capacity of the ESD protection circuit, the integrated circuit device 100d may determine its ESD protection capacity. According to at least some example embodiments, at least two input/output devices may be connected to one input/output pad and at least two input/output pads may be connected to one input/output device.

Figure 40:
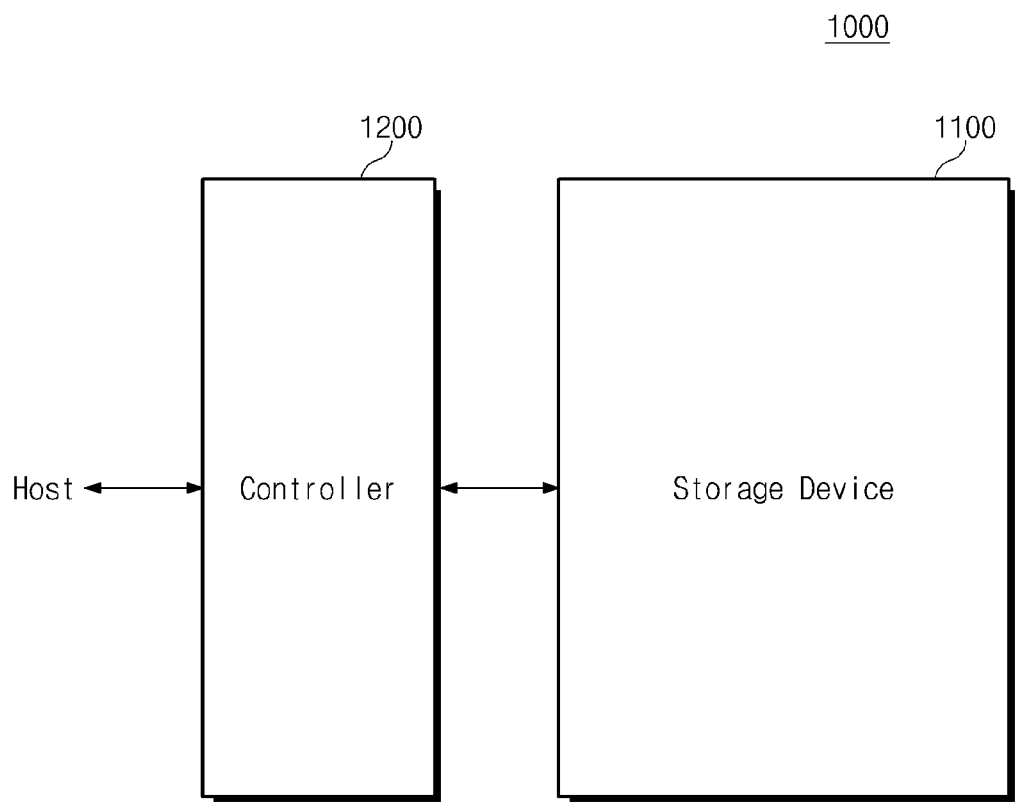

FIG. 40 is a block diagram of storage systems 1000 that may include one or more of the integrated circuit devices according to example embodiments, for example, one or more of integrated devices 100, 100', 100a, 100a', 100b, 100b', 100c, 100c', and/or 100d described with reference to FIG. 39. Referring to FIG. 40, the storage system 1000 may include a storage device 1100 and a controller 1200. The storage device 1100 may be configured to store data. For example, the storage device 1100 may be one of various storage devices including a volatile semiconductor memory (e.g., Static RAM (SRAM), Dynamic RAM (DRAM), and/or Synchronous DRAM (SDRAM)), a nonvolatile semiconductor memory (e.g., Read Only Memory (ROM), Programmable ROM (PROM), Electrically Programmable ROM (EPROM), Electrically Erasable and Programmable ROM (EEPROM), and/or flash memory), a variable resistive memory (e.g., Phase-change RAM (PRAM), Magnetic RAM (MRAM), Resistive RAM (RRAM), and/or Ferroelectric RAM (FRAM)), Hard Disk Drive (HDD), and Optical Disk Drive (ODD).

The controller 1200 may be connected to a host and the storage device 1100. In response to the host, the controller 1200 may be configured to access the storage device 1100. For example, the controller 1200 may be configured to control read, write, and erase operations of the storage device 1100 in response to a request of the host. The controller 1200 may be configured to control a background operation of the storage device 1100. The controller 1200 may be configured to provide an interface between the storage device 1100 and the host. The controller 1200 may be configured to drive firmware for controlling the storage device 1100. The controller 1200 may include typical components (e.g., RAM, a processing unit, a host interface, and/or a memory interface). A RAM may be used as at least one of an operating memory of the processing unit, a cache memory between the storage device 1100 and the host, and a buffer memory between the storage device 1100 and the host. The processing unit may control general operations of the controller 1200.

The host interface may include a protocol for performing data exchange between the host and the controller 1200. The controller 1200 may be configured to communicate with the outside (host) through at least one of various interface protocols, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, fire wire protocol, and/or personal computer memory card international association (PCMCIA) protocol. The memory interface may interface with the storage device 1100.

The memory system 1000 may be configured to additionally include an error correction block. The error correction block may be configured to detect and correct an error of data read from the storage device 1100 using an error correction code (ECC). The error correction block may be provided as a component of the controller 1200. The error correction block may be provided as a component of the storage device 1100.

The controller 1200 and the storage device 1100 may be integrated into a single semiconductor device. The controller 1200 and the storage device 1100 may be integrated into a single semiconductor device so as form a memory card. For example, the controller 500 and the nonvolatile memory device 100 may be integrated into a single semiconductor device to thereby form a memory card (e.g., a PC card (e.g., PCMCIA), a compact flash card (e.g., CF), a smart media card (e.g., SM and SMC), a memory stick, a multimedia card (e.g., MMC, RS-MMC, and MMCmicro), an SD card (e.g., SD, miniSD, microSD, SDHC), and a universal flash storage (e.g., UFS)).

The controller 1200 and the storage device 1100 may be integrated into a single semiconductor device to thereby form a semiconductor drive, for example, a solid state drive (SSD). An SSD may include a storage unit configured to store data in a semiconductor memory. In the case where the memory system 1000 is used as the SSD the operating speed of the host connected to the memory system 1000 may be improved. As another example, the memory system 1000 may be provided as one of various components of an electronic device, for example, a computer, a ultra mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation, a black box, a digital camera, a digital multimedia broadcasting (DMB) player, a digital audio recorder, a digital audio player, a digital picture recorder, a digital picture player, a digital video recorder, a digital video player, a device for transmitting and receiving information under wireless environment, one of various electronic devices constituting a home network, one of various electronic devices constituting a computer network, one of various electronic devices constituting a telematics network, a radio frequency identification (RFID) device, and/or one of various components constituting a computing system.

The storage device 1100 and/or the storage system 1000 may be mounted using various kinds of packages. For instance, the nonvolatile memory device 100 and/or the memory system 1000 may be mounted with Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

The controller 1200 may include one or more integrated circuit devices according to example embodiments, for example, one or more of integrated devices 100, 100', 100a, 100a', 100b, 100b', 100c, 100c', and 100d described with reference to FIGS. 1-39. The storage device 1100 may include one or more integrated circuit devices according to example embodiments, for example, one or more of integrated devices 100, 100', 100a, 100a', 100b, 100b', 100c, 100c', and 100d described with reference to FIGS. 1-35. The storage system 1000 may include one or more integrated circuit devices according to example embodiments, for example, one or more of integrated devices 100, 100', 100a, 100a', 100b, 100b', 100c, 100c', and 100d described with reference to FIGS. 1-39. Once the technical ideas of example embodiments of the inventive concepts is applied to the storage system 1000, the storage system 1000 may occupy a reduced area and may improve reliability.

Figure 41:
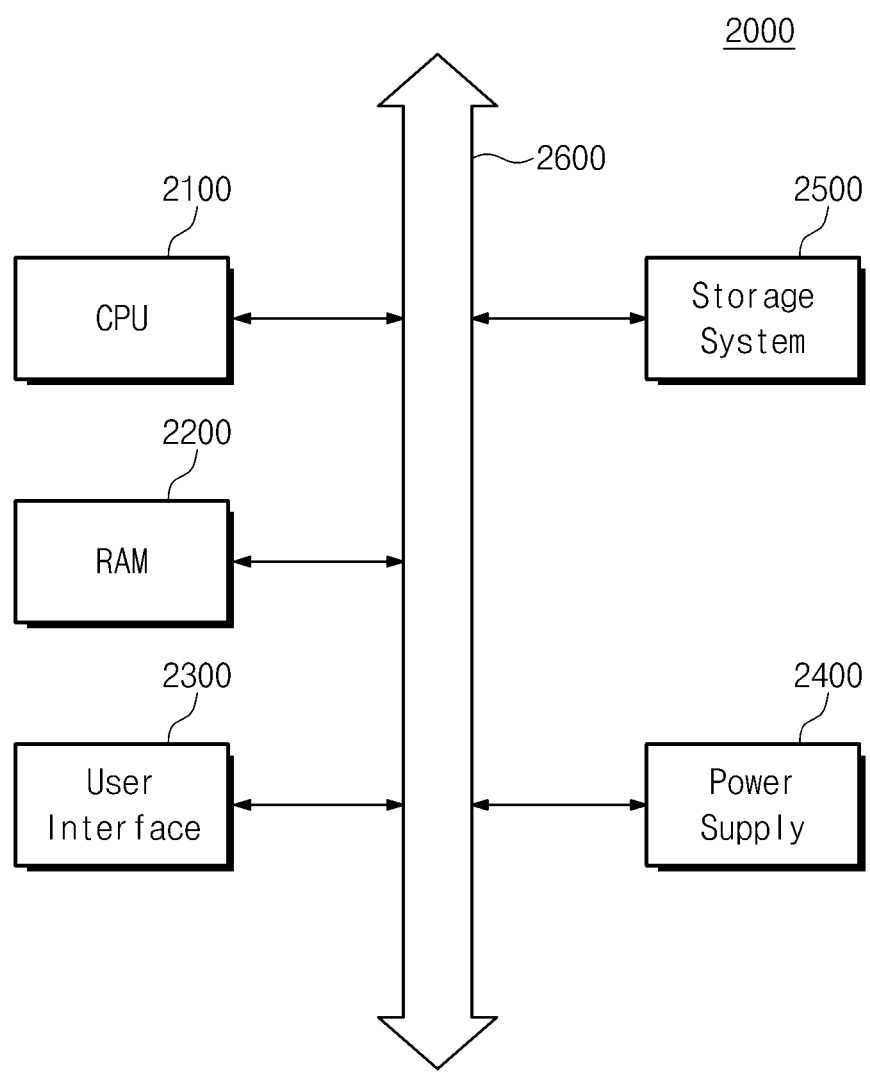

FIG. 41 is a block diagram illustrating computing systems 2000 that may include one or more of integrated circuit devices 100, 100', 100a, 100a', 100b, 100b', 100c, 100c', and 100d described with reference to FIGS. 1-39. Referring to FIG. 41, a computing system 2000 may include a central processing unit (CPU) 2100, RAM 2200, a user interface 2300, a power supply 2400, a storage system 2500 and/or a system bus 2600. The CPU 2100 may be configured to control general operations of the computing system 2000. The RAM 2200 may be used as an operating memory of the CPU 2100. The user interface 2300 may exchange a signal with a user. For example, the user interface 2300 may include a user input interface and a user output interface. The power supply 2400 may be configured to supply power to the computing system 2000. The storage system 2500 may operate as a high capacity storage device of the computing system 2000.

The CPU 2100 may include one or more integrated circuit devices according to example embodiments, for example, one or more of integrated devices 100, 100', 100a, 100a', 100b, 100b', 100c, 100c', and 100d described with reference to FIGS. 1-39. The RAM 2200 may include one or more integrated circuit devices according to example embodiments, for example, one or more of integrated devices 100, 100', 100a, 100a', 100b, 100b', 100c, 100c', and 100d described with reference to FIGS. 1-39. The user interface 2300 may include one or more integrated circuit devices according to example embodiments, for example, one or more of integrated devices 100, 100', 100a, 100a', 100b, 100b', 100c, 100c', and 100d described with reference to FIGS. 1-39. The power supply 2400 may include one or more of the integrated circuit devices according to example embodiments, for example, one or more of integrated devices 100, 100', 100a, 100a', 100b, 100b', 100c, 100c', and 100d described with reference to FIGS. 1-39. The storage system 2500 may include one or more of the integrated circuit devices according to example embodiments, for example, one or more of integrated devices 100, 100', 100a, 100a', 100b, 100b', 100c, 100c', and 100d described with reference to FIGS. 1-39.

As one example, at least two of the CPU 2100, the RAM 2200, the user interface 2300, the power 2400, and the storage system 2500 may include one or more of the integrated circuit devices according to example embodiments, for example, one or more of integrated devices 100, 100', 100a, 100a', 100b, 100b', 100c, 100c', and 100d described with reference to FIGS. 1-39. The computing system 2000 may include one or more of the integrated circuit devices according to example embodiments, for example, one or more of integrated devices 100, 100', 100a, 100a', 100b, 100b', 100c, 100c', and 100d described with reference to FIGS. 1-39. Once the technical idea of example embodiments of the inventive concepts is applied to the storage system 1000, the storage system 1000 may occupy a reduced area and may improve reliability.

According to example embodiments of the inventive concepts, a transistor operating as a transmission gate may operate as an ESD protection circuit. An inverter may operate as an ESD protection circuit. During an ESD event strong snapback may be prevented and/or reduced. An integrated circuit device with improved reliability and reduced area, and an ESD protection circuit thereof may be provided.

While example embodiments have been particularly shown and described, it will be understood by one of ordinary skill in the art that variations in form and detail may be made therein without departing from the spirit and scope of the claims.

What is claimed is:

1. An integrated circuit device, comprising:
    an input/output pad;
    an internal circuit configured to output a control signal; and
    a transistor connected as at least part of a switch between the input/output pad and the internal circuit, the transistor configured to switch in response to the control signal and to discharge electrostatic current as a first electrostatic discharge (ESD) protection circuit.

2. The integrated circuit device of claim 1, wherein a drain of the transistor includes a first junction region in a first deep junction region.

3. The integrated circuit device of claim 2, wherein a doping concentration of the first deep junction region is less than a doping concentration of the first junction region.

4. The integrated circuit device of claim 2, wherein the first deep junction region overlaps a gate structure of the transistor.

5. The integrated circuit device of claim 2, further comprising:
a device isolation layer surrounding the transistor,
wherein the first deep junction region extends farther from a gate of the transistor than the device isolation layer in at least one direction.

6. The integrated circuit device of claim 2, wherein the first junction region includes a first high concentration junction region and a first low concentration junction region, the first low concentration region between at least part of the first high concentration junction region and the first deep junction region, and
a doping concentration of the first low concentration junction region is less than a doping concentration of the first high concentration junction region.

7. The integrated circuit device of claim 2, wherein a structure of a source of the transistor is the same as a structure of the first junction region.

8. The integrated circuit device of claim 2, wherein the drain and a source of the transistor are asymmetric in structure.

9. The integrated circuit device of claim 2, wherein a source of the transistor includes a second junction region in a second deep junction region.

10. The integrated circuit device of claim 9, wherein the second deep junction region overlaps a gate structure of the transistor.

11. The integrated circuit device of claim 2, further comprising:
a first pickup layer spaced apart from a source of the transistor on a same side of the gate structure as the source,
wherein the transistor and the first pickup layer are configured to discharge electrostatic current as at least part of a second ESD protection circuit.

12. The integrated circuit device of claim 11, further comprising:
a device isolation layer between the source and the first pickup layer.

13. The integrated circuit device of claim 11, wherein a structure of the first pickup layer is the same as a structure of the first junction region.

14. The integrated circuit device of claim 11, wherein a conductive type of the first pickup layer is the same as a conductive type of the first junction region.

15. The integrated circuit device of claim 11, wherein the first pickup layer is connected to a ground voltage source.

16. The integrated circuit device of claim 11, further comprising:
a second pickup layer adjacent to the first pickup layer, the first pickup layer between the source and the second pickup layer,
wherein a conductive type of the second pickup layer is different than a conductive type of the first pickup layer.

17. The integrated circuit device of claim 16, wherein the second pickup layer is connected to a ground voltage source.

18. The integrated circuit device of claim 16, wherein the first pickup layer is connected to the second pickup layer through a butting contact.

19. The integrated circuit device of claim 2, further comprising:
a first pickup layer spaced apart from the drain of the transistor on a same side of a gate structure as the drain,
wherein the transistor and the first pickup layer are configured to discharge electrostatic current as at least part of a second ESD protection circuit.

20. The integrated circuit device of claim 19, further comprising:
a device isolation layer between the drain and the first pickup layer.

21. The integrated circuit device of claim 19, wherein a structure of the first pickup layer is the same as a structure of the first junction region.

22. The integrated circuit device of claim 19, wherein a conductive type of the first pickup layer is the same as a conductive type of the first junction region.

23. The integrated circuit device of claim 19, wherein the first pickup layer is connected to a ground voltage source.

24. The integrated circuit device of claim 19, further comprising:
a second pickup layer adjacent to the first pickup layer, the first pickup layer between the second pickup layer and the drain,
wherein a conductive type of the second pickup layer is different than a conductive type of the first junction region.

25. The integrated circuit device of claim 24, wherein the second pickup layer is connected to a ground voltage source.

26. The integrated circuit device of claim 24, wherein the first pickup layer is connected to the second pickup layer through a butting contact.

27. The integrated circuit device of claim 2, wherein the first junction region is an N-type region.

28. The integrated circuit device of claim 1, further comprising:
a PMOS transistor connected as part of the switch between the input/output pad and the internal circuit,
wherein the transistor is an NMOS transistor.

29. The integrated circuit device of claim 28, wherein a structure of the PMOS transistor is the same as a structure of the NMOS transistor.

30. The integrated circuit device of claim 1, further comprising:
a clamp circuit configured to discharge electrostatic current between a power node and a ground node.

31. The integrated circuit device of claim 30, wherein
the clamp circuit includes a first transistor and a second transistor, the first and second transistors connected between the power node and the ground node,
a gate of the first transistor is connected to the ground node, and
a gate of the second transistor is connected to the power node through a capacitor and is connected to the ground node through a resistor.

32. An integrated circuit device, comprising:
an input/output pad;
an internal circuit; and
an inverter connected between the input/output pad and the internal circuit, the inverter including an NMOS transistor and a PMOS transistor, the NMOS transistor and the PMOS transistor connected between a power node and a ground node, the NMOS transistor configured as an ESD protection circuit, wherein the inverter is configured to invert an output of the internal circuit and deliver the inverted output to the input/output pad, or is configured to invert a signal received from the input/output pad and deliver the inverted signal to the internal circuit.

33. The integrated circuit device of claim 32, wherein a drain of the NMOS transistor includes a first junction region in a first deep junction region.

34. The integrated circuit device of claim 33, wherein a structure of a source of the NMOS transistor is the same as a structure of the first junction region.

35. The integrated circuit device of claim 33, wherein a structure of a source of the NMOS transistor is the same as a structure of the drain of the NMOS transistor.

36. The integrated circuit device of claim 35, further comprising:
a clamp circuit configured to discharge electrostatic current between a power node and a ground node.

37. The integrated circuit device of claim 36, wherein
the clamp circuit includes a first transistor and a second transistor, the first and second transistors connected between the power node and the ground node,
a gate of the first transistor is connected to the ground node, and
a gate of the second transistor is connected to the power node through a capacitor and to the ground node through a resistor.

38. The integrated circuit device of claim 33, further comprising:
a first pickup layer spaced apart from the drain of the NMOS transistor,
wherein a conductive type of the first pickup layer is the same as a conductive type of the first junction region.

39. The integrated circuit device of claim 32, wherein a structure of the PMOS transistor is the same as a structure of the NMOS transistor.

40. An electrostatic discharge (ESD) protection circuit of an integrated circuit device, comprising:
a first junction region and a second junction region, the first and second junction regions in a well;
a gate structure on the well between the first junction region and the second junction region; and
a first pickup layer on a same side of the gate structure as the first junction region, a conductive type of the first pickup layer the same as a conductive type of the first junction region.

41. The ESD protection circuit of claim 40, further comprising:
a device isolation layer between the first junction region and the first pickup layer.

42. The ESD protection circuit of claim 41, wherein a structure of the device isolation layer is a guard ring structure, and
the isolation layer surrounds the first junction region, the second junction region and the gate structure.

43. The ESD protection circuit of claim 41, wherein a structure of the first pickup layer is a guard ring structure, and
the first pickup layer surrounds the first junction region, the second junction region, the gate structure and the device isolation layer.

44. The ESD protection circuit of claim 40, further comprising:
a deep junction region in the well,
wherein the first junction region is in the deep junction region.

45. The ESD protection circuit of claim 40, wherein the first pickup layer is connected to a ground voltage source.

46. The ESD protection circuit of claim 40, wherein the ESD protection circuit is configured to selectively induce a channel between the first junction region and the second junction region in response to a control signal applied to the gate structure and is configured to discharge electrostatic current received from at least one of the first junction region and the second junction region.

47. The ESD protection circuit of claim 40, further comprising:
a second pickup layer, a conductive type of the second pickup layer different than a conductive type of the first pickup layer.

48. The ESD protection circuit of claim 47, wherein the second pickup layer is connected to the first pickup layer through a butting contact.

49. The ESD protection circuit of claim 47, wherein the second pickup layer is a guard ring surrounding the first junction region, the second junction region, the gate structure and the first pickup layer.

50. The ESD protection circuit of claim 40, wherein the first and second junction regions are N-type.

51. The ESD protection circuit of claim 40, further comprising:
a clamp circuit configured to discharge electrostatic current between aground node and a power node,
wherein the well is connected to the ground node.

52. The ESD protection circuit of claim 51, wherein
the clamp circuit includes a first transistor and a second transistor, the first and second transistors connected between the power node and the ground node;
a gate of the first transistor is connected to the ground node; and
a gate of the second transistor is connected to the power node through a capacitor and is connected to the ground node through a resistor.

53. An electrostatic discharge (ESD) protection circuit of an integrated circuit device, comprising:
a source and a drain in a well, the drain including a junction region in a deep junction region;
a gate structure between the source and the drain;
a first pickup layer spaced apart from the source, a conductive type of the first pickup layer the same as a conductive type of the source;
a second pickup layer on an opposite side of the source from the first pickup layer, a conductive type of the second pickup layer different than a conductive type of the source; and
a device isolation layer between the source and the first pickup layer.

54. The ESD protection circuit of claim 53, wherein at least one surface of the deep junction region is farther from a surface of the well than a surface of the device isolation layer.

55. The ESD protection circuit of claim 53, wherein the device isolation surrounds the source, the drain and the gate structure.

56. The ESD protection circuit of claim 55, wherein the first pickup layer surrounds the device isolation layer.

57. The ESD protection circuit of claim 56, wherein the second pickup layer is a guard ring surrounding the first pickup layer.

58. The ESD protection circuit of claim 53, further comprising:
a clamp circuit configured to discharge electrostatic current between a ground node and a power node,
wherein the well is connected to the ground node.

59. The ESD protection circuit of claim 53, wherein the source and drain are N-type.

60. A semiconductor device, comprising:
a transistor, the transistor including
a gate on a semiconductor layer; and
a source and a drain in the semiconductor layer, one of the source and the drain including a first graded junction, wherein
the first graded junction includes a first junction region and a second junction region,
a doping concentration of the first junction region is greater than a doping concentration of the second junction region,
the second junction region is on a side of the first junction region opposite a surface of the semiconductor layer, and
the first graded junction extends into a channel region of the transistor.

61. The device of claim 60, wherein the first graded junction includes a third junction region, a doping concentration of the third junction region less than the doping concentration of the second junction region,
sides of the first junction region and the second junction region closest to the gate are surrounded by the third junction region, and
the third junction region extends into the channel region of the transistor.

62. The device of claim 61, further comprising:
a well,
wherein the first through third junction regions are in the well, and
the gate is on the well.

63. The device of claim 62, wherein the first graded junction is part of the drain, and
the source includes a second graded junction.

64. The device of claim 63, wherein the second graded junction includes fourth and fifth junction regions,
a doping concentration of the fourth junction region is greater than a doping concentration of the fifth junction region, and
the fifth junction region is on a side of the fourth junction region opposite a surface of the semiconductor layer.

65. The device of claim 64, wherein the second graded junction includes a sixth junction region,
sides of the fourth junction region and the fifth junction region closest to the gate are surrounded by the sixth junction region, and
the sixth junction region extends into the channel region of the transistor.

66. The device of claim 62, further comprising:
a second graded junction including fourth and fifth junction regions adjacent to one of the source and drain; and
an isolation region between the second graded junction and the one of the source and drain adjacent to the second graded junction,
wherein a doping concentration of the fourth junction region is greater than a doping concentration of the fifth junction region, and
the fifth junction region is on a side of the fourth junction region opposite a surface of the semiconductor layer.

67. The device of claim 66, further comprising:
a third graded junction including sixth and seventh junction regions adjacent to the second graded junction, the third graded junction of a different conductivity type than the second graded junction.

68. The device of claim 67, further comprising:
fourth and fifth graded junctions,
wherein the second and third graded junctions are adjacent to the drain, and
the fourth and fifth graded junctions are adjacent to the source on an opposite side of the source from the drain.

69. The device of claim 68, wherein the source includes a graded junction.

70. The device of claim 62, wherein the transistor is connected to a signal line between an internal circuit and an input/output pad.

* * * * *